US012658848B2

(12) United States Patent
Capolino et al.

(10) Patent No.: US 12,658,848 B2
(45) Date of Patent: Jun. 16, 2026

(54) SYSTEMS AND METHODS FOR A HIGH-SENSITIVE OSCILLATOR

(71) Applicant: THE REGENTS OF THE UNIVERSITY OF CALIFORNIA, Oakland, CA (US)

(72) Inventors: Filippo Capolino, Irvine, CA (US); Alireza Nikzamir, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 16 days.

(21) Appl. No.: 18/961,804

(22) Filed: Nov. 27, 2024

(65) Prior Publication Data

US 2025/0167730 A1      May 22, 2025

Related U.S. Application Data

(63) Continuation of application No. PCT/US2023/024023, filed on May 31, 2023.

(60) Provisional application No. 63/347,783, filed on Jun. 1, 2022.

(51) Int. Cl.
*H03B 5/02* (2006.01)
*H03B 5/12* (2006.01)
*H03B 5/18* (2006.01)

(52) U.S. Cl.
CPC .................. *H03B 5/02* (2013.01); *H03B 5/12* (2013.01); *H03B 5/1847* (2013.01)

(58) Field of Classification Search
CPC ........... H03B 5/02; H03B 5/12; H03B 5/1847
See application file for complete search history.

(56) References Cited

U.S. PATENT DOCUMENTS 11,637,355 B1 *  4/2023  Zhang ........................ H01P 1/32
                                                333/24.1
2022/0057440 A1   2/2022  Capolino et al.

OTHER PUBLICATIONS

Nikzamir, A., et al., "Demonstration of Exceptional Points of Degeneracy in Gyrator-Based Circuit for High-Sensitivity Applications", 2021, retrieved from https://arxiv.org/pdf/2107.00639, 11 pages.
Rouhi, K., et al., "Exceptional Point in Degenerate System Made of Gyrator and Two Unstable Resonators", Physical Review A, 2022, vol. 105, p. 1-13.
WO, PCT/US23/24023 ISR and Written Opinion, Oct. 2, 2023.

* cited by examiner

*Primary Examiner* — Jeffrey M Shin
(74) *Attorney, Agent, or Firm* — ONE LLP

(57) ABSTRACT

Some embodiments relate to systems and methods for electronic circuits configured to operate at or near an exceptional point of degeneracy (EPD). An electronic system includes an electronic circuit configured to operate approximately at an EPD. The electronic circuit includes an active component that, via an instability, brings the system to self-oscillations, wherein a second component of the circuit is perturbed leading to high sensitivity to such perturbation.

15 Claims, 37 Drawing Sheets

RESONANCE FREQUENCIES
PUISEUX SERIES
○   NONLINEAR TD
    CIRCUIT SIMULATOR

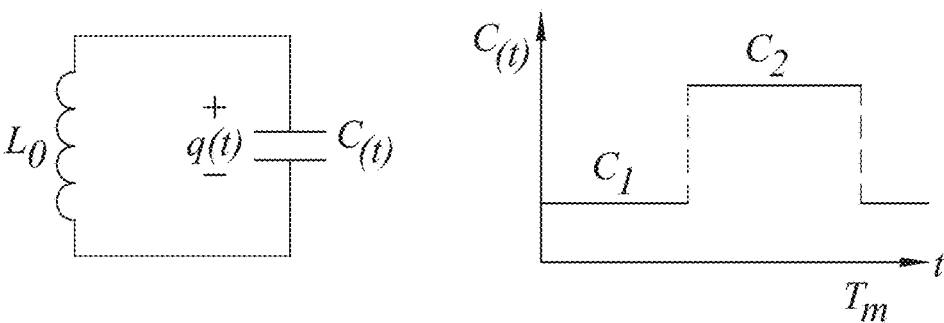
FIG. 6A
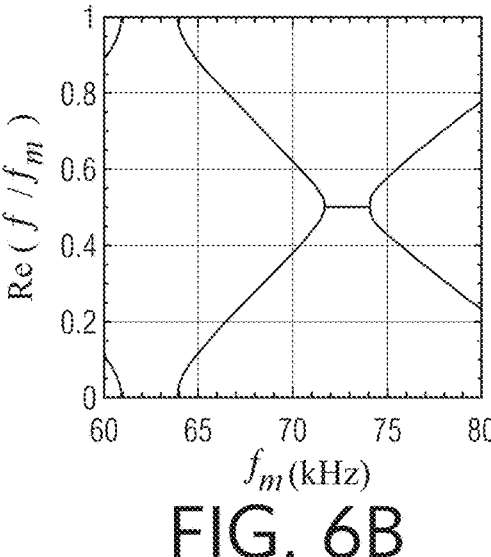
FIG. 6B
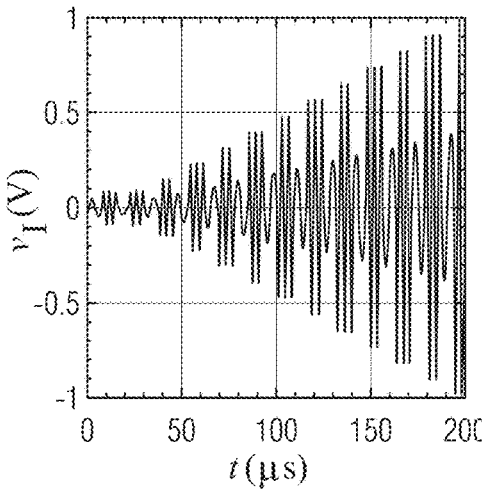
FIG. 6C
FIG. 6D

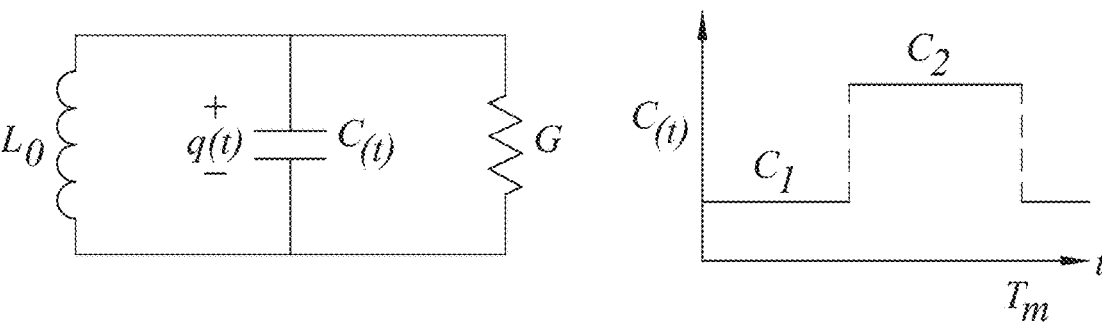
FIG. 7A
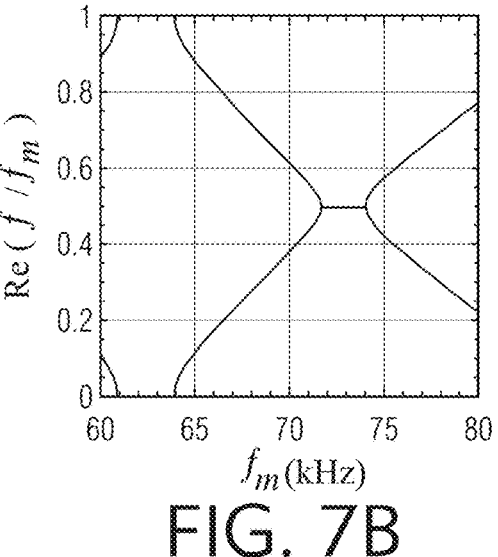
FIG. 7B
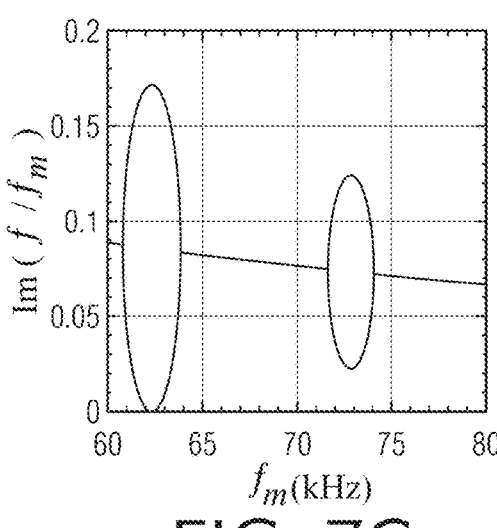
FIG. 7C
FIG. 7D

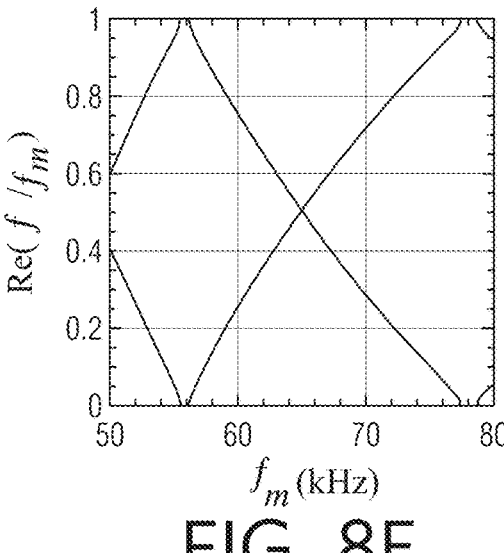
FIG. 8E
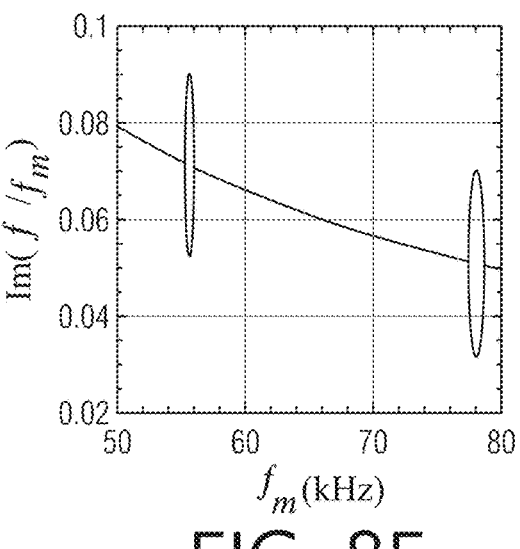
FIG. 8F
FIG. 8G

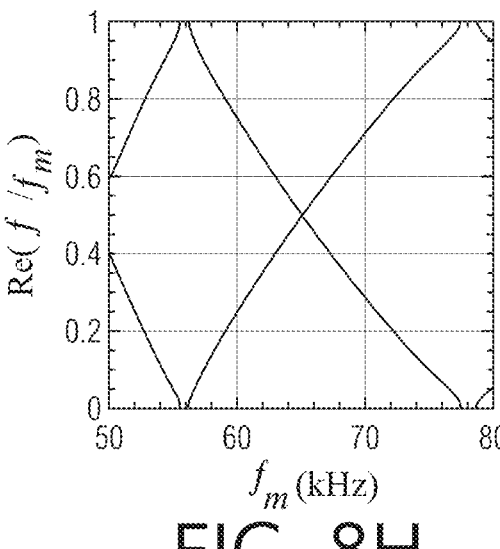
FIG. 8H
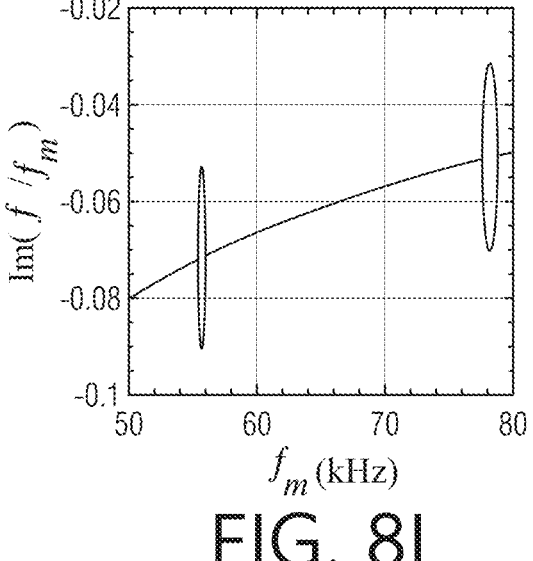
FIG. 8I
FIG. 8J

SYSTEMS AND METHODS FOR A HIGH-SENSITIVE OSCILLATOR

CROSS-REFERENCE TO RELATED APPLICATIONS

This application is a continuation of International Patent Application Serial No. PCT/US23/24023, filed May 31, 2023, which claims the benefit of priority under 35 U.S.C. § 119(e) from U.S. Provisional Application Ser. No. 63/347, 783, filed Jun. 1, 2022, both of which are hereby incorporated by reference in their entireties for all purposes.

TECHNICAL FIELD

The disclosure relates generally to the field of electronic circuits, specifically and not by way of limitation, some embodiments are related to oscillator circuits.

BACKGROUND OF THE INVENTION

Sensors are used widely and extensively in many industrial, automotive, and medical applications. In recent years, numerous approaches have been used to sense variations of physical, biological, or chemical changes, e.g., to sense pressure, temperature, humidity, electron beam velocity, and chemical or biological quantities. Sensitivity may be a feature of some measurement systems. Accordingly, various types of sensors may be needed to measure sensitivity. Thus, low-cost, simple, and highly sensitive sensors may be desirable to measure different quantities. In many types of conventional sensors, the perturbation by a small value $\Delta$ results in shifting the system's eigenfrequency by an amount in the same order of A (linear behavior), like perturbing a simple LC tank. It means that in conventional sensing applications, the perturbation and the measurable changes, like frequency, follow the same trend.

SUMMARY OF THE INVENTION

Provided herein are embodiments of systems for degenerate oscillator highly sensitive to perturbations. Some embodiments relate to systems and methods for electronic circuit configured to operate at an exceptional point of degeneracy (EPD). An electronic system includes an electronic circuit configured to operate at or near an EPD. The electronic circuit including an active component that, via an instability, brings the system to self-oscillations, wherein a second component of the circuit is perturbed leading to high sensitivity to such perturbation.

BRIEF DESCRIPTION OF THE DRAWINGS

The present invention may be better understood by referring to the following figures. The components in the figures are not necessarily to scale. Emphasis is instead being placed upon illustrating the principles of the disclosure. In the figures, reference numerals designate corresponding parts throughout the different views.

FIGS. 6A-6D are diagrams illustrating circuit with time periodic capacitor connected to the inductor in parallel, as an example the capacitor varies between two values C1 and C2 with Tm period, as illustrated as an inset, real, and imaginary parts of resonance frequency evolution varying modulation frequency fm, the time domain signal of the second order EPD which is indicated by the linear growth of the capacitor voltage with initial condition of vc(0–)=50 mV, and fm=63.95 kHz.

FIGS. 7A-7G are diagrams illustrating circuit with time periodic capacitor C (t) connected to the inductor L0 and associated loss/gain G in parallel. The capacitor varies between two values C1 and C2 with Tm period, as illustrated in the subset, real and imaginary parts of resonance frequency evolution varying modulation frequency fm where the LC tank is connected to the lossy conductance G=1 mS, the time domain signal obtained from Keysight ADS circuit simulator, when circuits operates at the second order EPD which is indicated by the decaying signal associated to the positive imaginary part of eigenfrequencies. Real and imaginary parts of resonance frequency evolution varying modulation frequency, fm, where the LC tank is connected to the negative conductance G=−1 mS. capacitor's voltage obtained from Keysight ADS circuit simulator, which illustrates the rising signal. In all time domain simulation, the capacitor has an initial condition of vc(0−)=50 mV.

FIGS. 8A-8J are diagrams illustrating a circuit scheme including LC tank connected to the time-varying loss, real and imaginary parts of eigenfrequency versus modulation frequency fm, where the loss average is zero, time-domain signal capacitance's voltage v1(t), which illustrates the linear growth at EPD, real and imaginary parts of eigenfrequency versus modulation frequency fm, where the loss average is positive (G works as a lossy component in average), and time-domain signal capacitance voltage v1(t) is decaying related to the positive imaginary part of eigenfrequency at EPD, real and imaginary parts of eigenfrequency versus modulation frequency fm, where the loss average is negative (G works as a gain component in average), and time-domain signal capacitance voltage v1(t) is rising related to the negative imaginary part of eigenfrequency at EPD. In all time-domain simulation the capacitor has an initial condition of vc(0−)=50 mV.

Figure 1A:
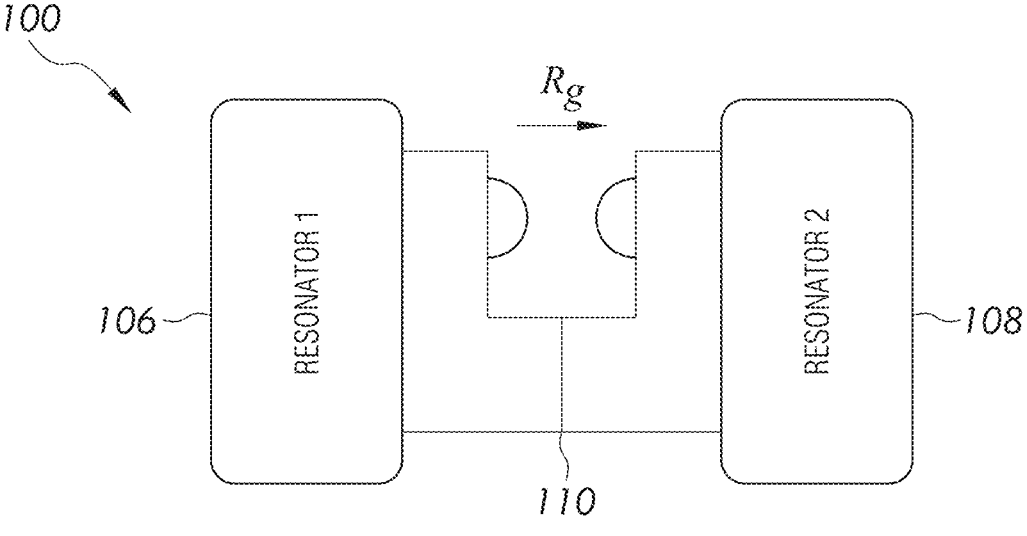
FIGS. 1A-IC are diagrams illustrating three different configurations that support EPD two resonators coupled through gyrator two mutually-coupled-resonator terminated with balanced gain and loss (PT-symmetry circuit) time-varying circuit which just one component in the circuit needed to change over time periodically, the time varying component here could be capacitor or inductor or loss.

The figures and the following description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

DETAILED DESCRIPTION

The detailed description set forth below in connection with the appended drawings is intended as a description of configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are illustrated in block diagram form in order to avoid obscuring such concepts.

Several aspects of electronic circuit configured to operate at an exceptional point of degeneracy (EPD) will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

Some aspects relate to the rise of exceptional points of degeneracy (EPD) in various distinct circuit configurations such as gyrator-based coupled resonators, coupled resonators with PT-symmetry, and in a single resonator with a time-varying component. In some aspects, the circuit's high sensitivity to changes in resistance, capacitance, and inductances may illustrate the high sensitivity of the resonance frequency to perturbations. In some aspects, the circuit's stability and instability conditions for these configurations may ultimately result in instabilities. For example, the effect of losses in the gyrator-based circuit may lead to instability, and the effect of losses may break the symmetry in the PT-symmetry-based circuit, also resulting in instabilities. Instability in the PT-symmetry circuit may also be generated by breaking PT-symmetry when one element (e.g., a capacitor) is perturbed due to sensing. In some aspects, the circuit's instability "inconvenience" may be turned into an advantage, and some aspects may use the effect of nonlinear gain in the PT-symmetry coupled-resonator circuit and how the effect of nonlinear gain in the PT-symmetry coupled-resonator circuit may lead to an oscillator with oscillation frequency very sensitive to perturbation. Some example circuits described herein may have the potential to provide a more efficient generation of high-sensitivity sensors that may detect very small changes in chemical, biological, physical, or other quantities.

In order to improve the detection limit for small perturbation sensors, an operation based on the exceptional point of degeneracy concept (EPD) may be a valuable option. EPD may be a point at which two or more eigenvalues and the corresponding eigenvectors of the system coincide (degenerate). One feature of an exceptional point may be the strong full degeneracy of the relevant eigenmodes. Exceptional points have been observed in various circuits as in coupled resonators, temporally-periodic systems, and spatially periodic structures.

As discussed above, sensors may be used widely and extensively in many industrial, automotive, and medical applications. In recent years, numerous approaches have been used to sense variations of physical, biological, or chemical changes, e.g., to sense pressure, temperature, humidity, electron beam velocity, and chemical or biological quantities, e.g., to name a few. Sensitivity may be a feature of some example measurement systems, various types of sensors may be needed to determine sensitivity. Thus, low-cost, simple, and highly sensitive sensors may be desirable to measure different quantities. In conventional sensors, the perturbation by a small value $\Delta$ results in shifting the system's eigenfrequency by an amount in the same order of $\Delta$ (linear behavior), like perturbing a simple LC tank. The perturbation by a small value $\Delta$ results in shifting the system's eigenfrequency by an amount in the same order of $\Delta$ means that in conventional sensing applications, the perturbation and the measurable changes, like frequency, follow the same trend. To increase the sensitivity, EPDs have offered a new method. In one example, rather than typical detecting systems, where the eigenfrequency changes are of the same order of the perturbation $\Delta$, the change of an eigenfrequency $\Delta\omega$ in a system working at an EPD of order two may follow the behavior $\Delta\omega \propto \Delta^{1/2}$. EPDs may be found in many physical settings under PT-symmetry properties. However, EPDs may also be found in more general forms, which do not require a system to satisfy PT-symmetry. Breaking the symmetry due to the external perturbance eigenvalues split from the degenerated value may be used as a detecting system.

As described herein, EPDs may be implemented using four methods: First, by using the circuit's characteristic equation and illustrating the degeneracy of the eigenmodes. Second, the coalescence of eigenvectors, which may be observed analytically. Third, time-domain results obtained from simulations illustrate the linear growth revealing the second-order EPD. The related frequency response may also be studied, and the frequency response may be illustrated to be associated with the EPD. Fourth, the approximate fractional power expansion series using the Puiseux series illustrates the bifurcation and square root-like behavior of the eigenvalues with respect to perturbations.

To address the effectiveness of the discussed EPD circuits, a systems' sensitivity to perturbations of capacitance may be considered. Inductance, and resistance may be used as sensing elements, depending on the application. An overview of the three circuit configurations is included below, leading to second-order EPDs. Second-order EPD in the gyrator-based circuit with parallel configuration in lossless and lossy cases is also discussed. Also, the stability of the circuit, manifested in the circuit's eigenfrequencies. The second-order EPD in two coupled resonators with balanced gain and loss satisfying PT-symmetry may also be considered. In this circuit, nonlinear gain may be considered by perturbing only one side of the coupled resonator, PT-symmetry may be broken, making the system unstable, causing oscillation. In an example, a perturbation may occur on one side of the coupled resonator circuit, the other side may be tuned accordingly to keep PT-symmetry. This procedure may make the operational regime difficult to implement since the exact value of the changes should be known a priori. Moreover, the sign of the perturbation was consistent with the bifurcation direction, which means that only either positive or negative changes in the circuit's quantities could be sensed, not both. Instead, working as in the oscillator regime may enable sensing of perturbations with both positive and negative signs. Also, when using nonlinear gain and the oscillatory regime, there may be no need to tune a circuit's side to keep symmetry, as illustrated below. Nonlinearity may play a role in this circuit operational regime and may help to find the EPD more easily. While the circuit with EPD and nonlinearity may be sensitive to any perturbation sign, the nonlinearity may keep the circuit at an EPD even with, for example, a 1% miss-match between the gain and loss. Finally, a single LC resonator with a time-varying element is discussed to illustrate how this simple configuration leads to an EPD by just tuning the modulation frequency. To find the EPD, a time-varying capacitor connected to a fixed inductance may be assumed. Then, the loss effect may be considered in the analysis. The eigenfrequency dispersion may be studied by varying modulation frequency, where the LC tank may be connected to loss or gain. Also, EPD may be found in the time-modulated circuit when time-varying gain or loss may be connected to the LC tank.

II. Second-Order EPD in Three Distinct Possible Configurations

Three different methods to obtain a second-order EPD are discussed. First, the degeneracy of the eigenvalues (e.g., eigenfrequencies) may occur in a gyrator-based circuit where two LC tanks may be coupled with a gyrator, as illustrated in FIG. 1A. Second, two mutually coupled LC circuits with balanced gain and loss may satisfy PT-symmetry, illustrated in FIG. 1B.

Figure 1B:
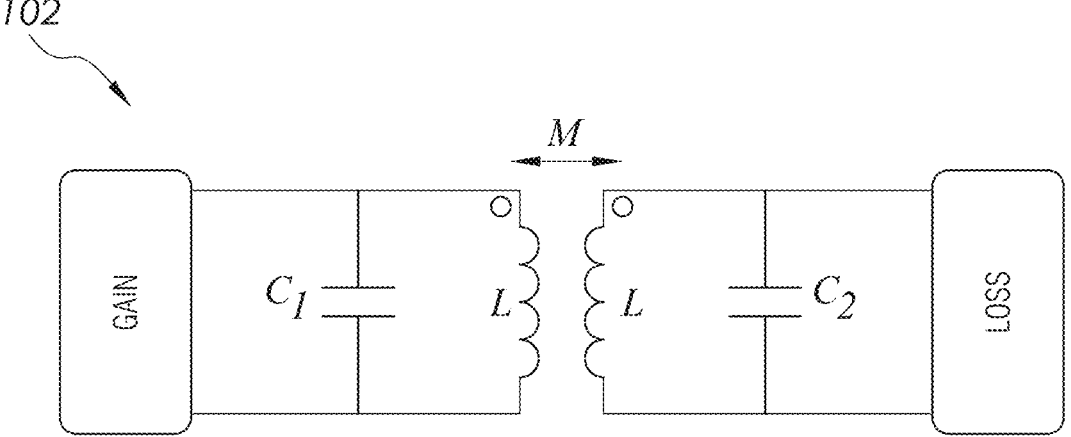
Figure 1C:
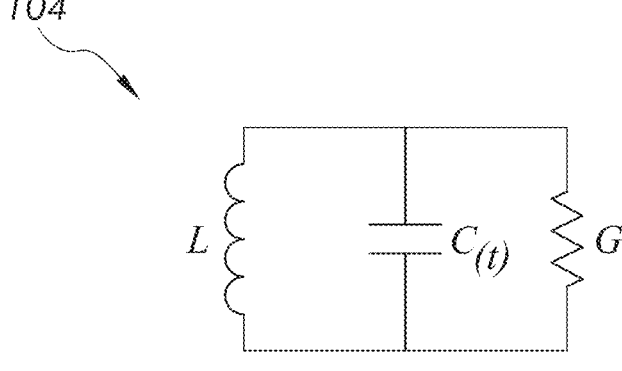

FIGS. 1A-1C are diagrams illustrating three different configurations that support EPD (a) two resonators coupled through gyrator (b) two mutually-coupled-resonator terminated with balanced gain and loss (PT-symmetry circuit) (c) time-varying circuit which just one component in the circuit needed to change over time periodically, the time varying component here could be capacitor or inductor or loss.

In FIGS. 1A-1B, both circuits 100, 102 may support square root sensitive behavior to perturbations of the resistance, capacitance, and inductance. However, some differences may be observed: for example, the conventional PT-symmetry circuit 102 in FIG. 1B may need the tuning on both sides to keep the PT-symmetry and avoid self-oscillations (arising from non-zero Im($\omega$))). In other words, it may not be possible to change one side only and observe two purely real eigenfrequencies. Instead, the gyrator-based circuit illustrates that the perturbation on only one side leads to two purely real eigenfrequencies. Thus, there may be no need to tune the other side after a perturbation in the gyrator-based circuit. However, any gain or loss in the gyrator-based circuit may cause oscillation and instability, as is discussed in more detail below.

An example embodiment may turn the instability of a circuit 102 (e.g., FIG. 1B) to our advantage. Using nonlinear gain, the circuit may oscillate and saturate, and by perturbing the capacitance on one side, a square root-like change in oscillation frequency may be detected. Working in an oscillator regime has certain advantages compared to the conventional PT-symmetry regime of operations. For instance, there may be no need to tune the circuit to reach PT-symmetry again after the perturbed values (of a capacitor, for example) are measured in this circuit. Also, nonlinearity may help to fine-tune the circuit to the EPD in an easier way. Further discussion of these concepts is provided in more detail below.

The third circuit 104 discussed here, is illustrated in FIG. 1C. FIG. 1C is a linear time-varying (LTV) system in which an inductor may be connected to the time-varying capacitor. This configuration may not need any negative components to realize the EPD, like a negative capacitance and inductance in the gyrator-based circuit or an active gain element in the PT-symmetric coupled-resonator circuit. In addition, only one time-varying resonator may be needed in the third scheme (FIG. 1C) rather than two fixed resonators. Similarly, an EPD may be found in the LTV circuit when an inductor and capacitor are connected parallel to the time-varying loss or gain.

III. EPD in Gyrator-based Circuit

An example of the first scheme (circuit 100) is discussed below to obtain EPD by using two coupled LC tanks 106, 108 connected through a gyrator 110. An "ideal" gyrator may a nonreciprocal linear two-port device who's current on one port may be related to the voltage on the other port. The instantaneous relations between voltages and currents on the gyrator are described by:

$$\begin{cases} v_2(t) = R_g i_1(t) \\ v_1(t) = -R_g i_2(t) \end{cases} \tag{1}$$

where the gyration resistance Rg has a unit of Ohm with the direction indicated by an arrow in the circuit.

The eigenvalues (e.g., the eigenfrequencies) may be found and the condition for obtaining an EPD at the desired frequency may be demonstrated. Finally, the sensing potentials may be illustrated by applying a perturbation, and the effects of losses on the stability of eigenfrequencies may be studied. In addition, by using a time-domain circuit simulator, the circuit behavior predicted by the theoretical calculations may be verified and it also may be illustrated that the eigenfrequencies may be predicted by using the Puiseux fractional power series expansion.

1. Lossless Configuration

Figure 2A:
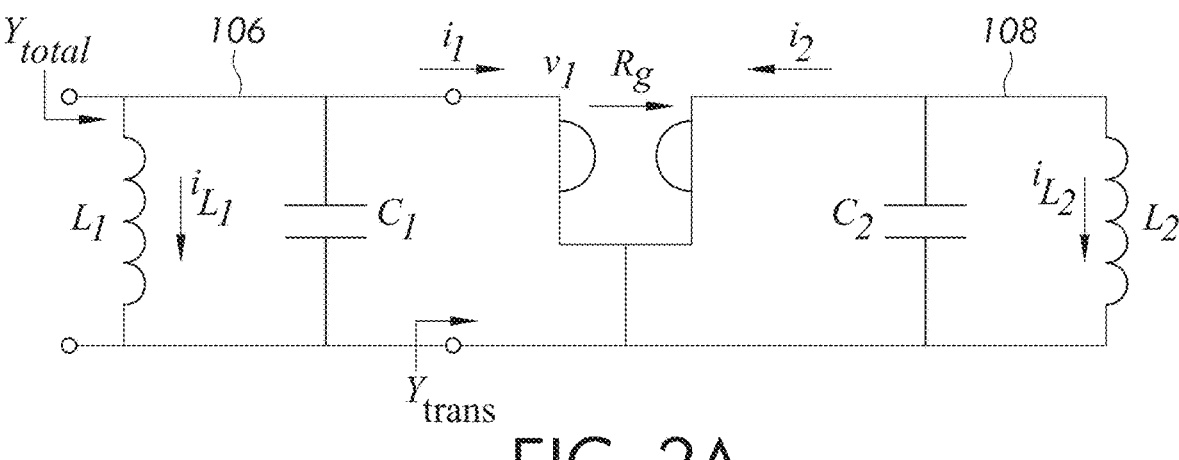
FIGS. 2A-2I are diagrams illustrating the gyrator-based circuit with the ideal gyrator connected to two parallel LC tanks, a suggested operational amplifier-based circuit configuration to obtain negative inductance and capacitance, the sensitivity of the (c), (e), real and (d), (f), imaginary parts of the eigenfrequencies to (c), gyration resistance, (e), positive capacitance C1. Voltage of positive capacitance $v_1(t)$ at EPD time-domain, and frequency-domain, the frequency-domain result is calculated by applying an FFT with 106 samples in the time window of 0 to 3 ms root locus of zeros of Ytotal($\omega$)=0 illustrating the real versus imaginary parts of resonance frequencies by perturbing gyration resistance, at the EPD, two zeros collide at we and the system's total admittance has the form of Ytotal($\omega$)$\propto$($\omega-\omega_e)^2$.

Two parallel LC tanks 106, 108 may be coupled by a gyrator 110, as illustrated in FIG. 2A. By writing the circuit equations and defining the state vector as $\Psi=[Q1,Q2,\dot{Q}1, \dot{Q}2]^T$, leads to:

$$d\Psi/dt = M\Psi, \tag{2}$$

where $$\underline{M} = \begin{bmatrix} 0 & 0 & 1 & 0 \\ 0 & 0 & 0 & 1 \\ -\omega_{01}^2 & 0 & 0 & \dfrac{1}{R_g C_2} \\ 0 & -\omega_{02}^2 & -\dfrac{1}{R_g C_1} & 0 \end{bmatrix}. \tag{3}$$

is the circuit matrix. The eigenfrequencies of this circuit may be calculated by solving the characteristic equation.

$$\omega^4 - \omega^2 \left( \omega_{01}^2 + \omega_{02}^2 + \frac{1}{C_1 C_2 R_g^2} \right) + \omega_{01}^2 \omega_{02}^2 = 0. \tag{4}$$

The characteristic equation is quadratic in $\omega_2$ and all the coefficients are real, so both $\omega$ and $-\omega$ and $\omega$ and $\omega^*$ are solutions. The angular eigenfrequencies are determined as $$\omega_{1,3} = \pm \sqrt{a+b}, \, \omega_{2,4} = \pm \sqrt{a-b}, \tag{5}$$

$$a = \frac{1}{2} \left( \omega_{01}^2 + \omega_{02}^2 + \frac{1}{C_1 C_2 R_g^2} \right), \tag{6}$$

$$b^2 = a^2 - \omega_{01}^2 \omega_{02}^2. \tag{7}$$

According to Eq. (5), a necessary condition for an EPD to occur is b=0, which results in an EPD angular frequency of $\omega_e=\sqrt{a}=a\sqrt{\omega01\omega02}$. So, Eq. (7) may be rewritten as:

$$(\omega_{01} - \omega_{02})^2 = -\frac{1}{C_1 C_2 R_g^2}. \tag{8}$$

FIGS. 2A-2I are diagrams illustrating (a) the gyrator-based circuit with the ideal gyrator connected to two parallel LC tanks, (b) a suggested operational amplifier-based circuit configuration to obtain negative inductance and capacitance, the sensitivity of the (c), (e), real and (d), (f), imaginary parts of the eigenfrequencies to (c), (d) gyration resistance, (e), (f) positive capacitance C1. Voltage of positive capacitance $v_1(t)$ at EPD (g) time-domain, and (h) frequency-domain, the frequency-domain result is calculated by applying an FFT with 106 samples in the time window of 0 to 3 ms (i) root locus of zeros of Ytotal(ω)=0 illustrating the real versus imaginary parts of resonance frequencies by perturbing gyration resistance, at the EPD, two zeros collide at $\omega_e$ and the system's total admittance has the form of Ytotal(ω)∝ $(\omega-\omega_e)^2$.

Figure 2B:
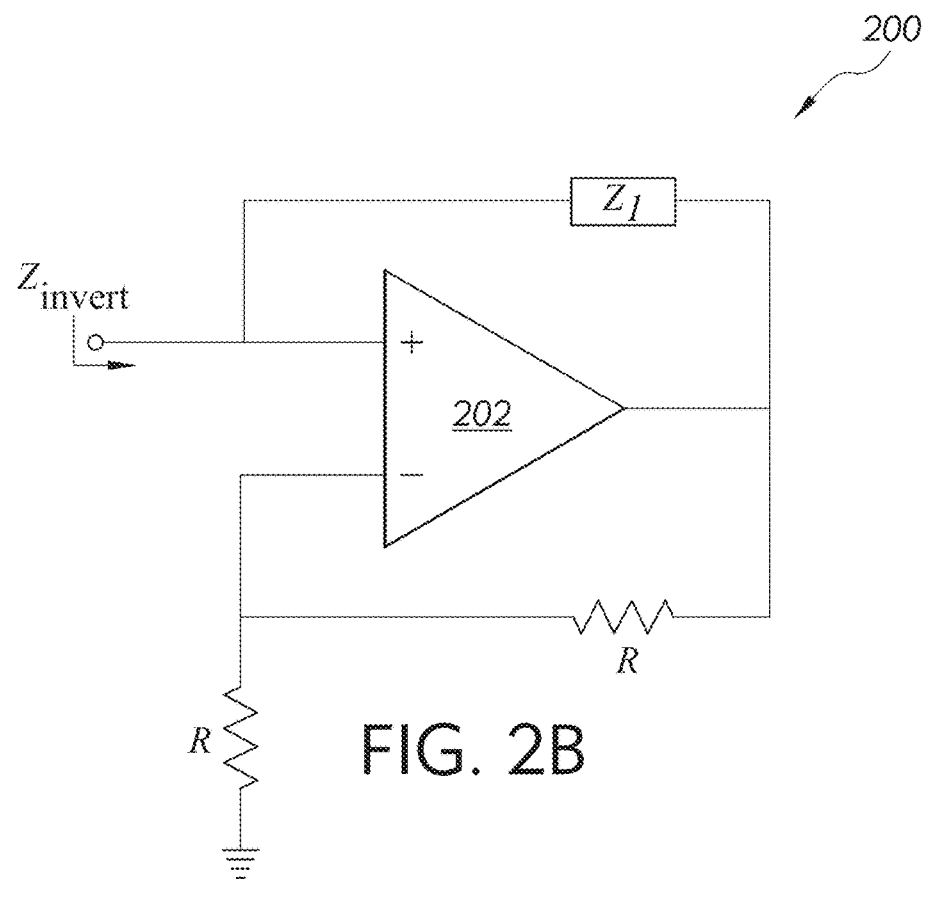

In order to obtain an EPD with real angular frequency, the case with purely real value for $\omega_{01}$ and $\omega_{02}$ may be considered so the value of either $C_1$ or $C_2$ should be negative. As a result, to have a real value for $\omega_{01}$ and $\omega_{02}$, one resonator needs to be composed of both negative C and L. Another scenario with an unstable uncoupled resonator is conceivable, which was studied for a series configuration. As an example, here the following values may be used for the components illustrated in FIG. 2A: $L_1$=100 μH, $L_2$=−100 μH, $C_2$=−100 nF, and $R_g$=50Ω. Then, the positive capacitance $C_1$ may be found by solving the quadratic equation obtained from the EPD condition. Since the equation for the EPD condition is quadratic, the equation for the EPD condition may yield two answers for $C_1$. As described herein, the value that leads to real EPD frequency may be selected, which may be $C_1$=13.51 nF in the illustrated example. Then the corresponding value for EPD angular frequency may be calculated as $\omega_e$=5.22×105 rad/s. In this circuit 200, an Operational Amplifier 202 based invertor could realize the negative components. An example designed circuit 200 to obtain negative impedance is illustrated in FIG. 2B, which converts the impedance $Z_t(\omega)$ to $Z_{invert}(\omega)=Z_t(\omega)$. Thus, negative capacitance and inductance may be provided by employing that configuration.

Figure 2C:
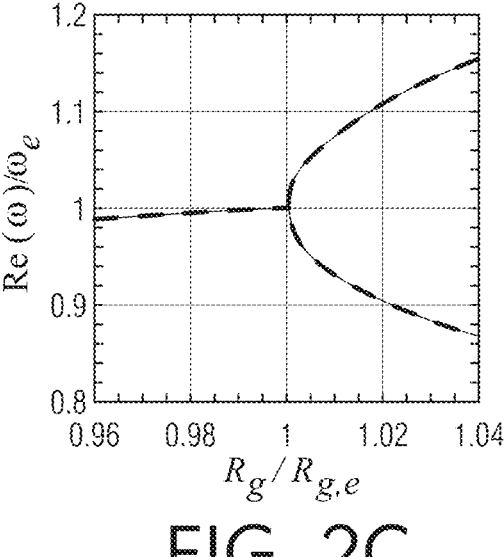
Figure 2D:
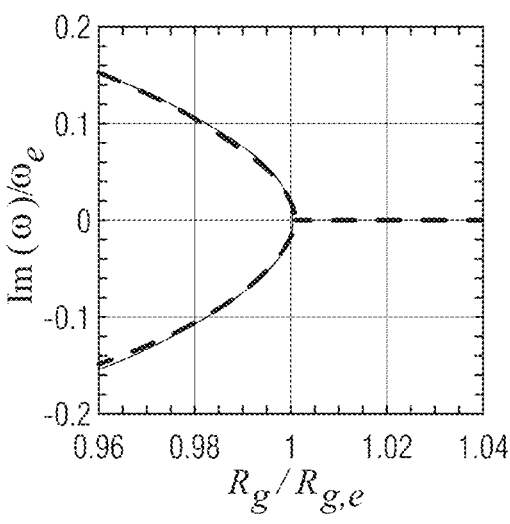
Figure 2E:
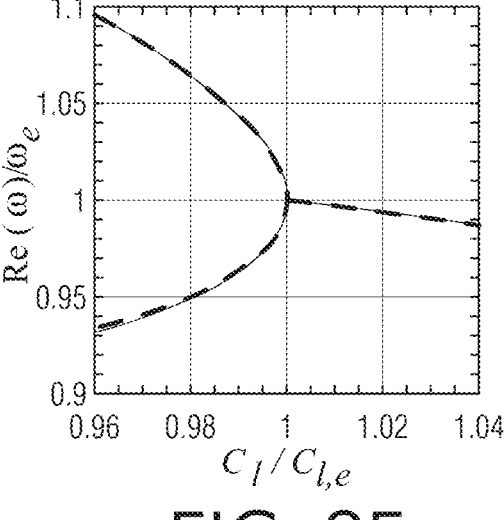
Figure 2F:
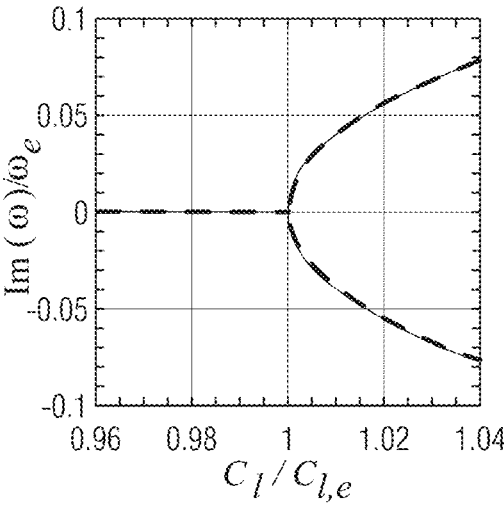

The real and imaginary parts of perturbed eigenfrequencies normalized to the EPD angular frequency by varying $R_g$ are illustrated in FIGS. 2C-2D, and analogous results by perturbing the positive capacitance $C_1$ is illustrated in FIGS. 2E-2F. In addition, the eigenfrequencies are well approximated by using the Puiseux fractional power series expansion (green dashed lines). The following provides the concept and formulas for the Puiseux Fractional Power Series Expansion.

The sensitivity of a system due to the perturbation of a system's component may be detectable by an observable's change, like the system's resonance frequency. The Puiseux fractional power series expansion helps us find the eigenvalues related to the perturbations when working at an EPD. A small perturbation ΔX of a system parameter X may be consider as:

$$\Delta_X = \frac{X - X_e}{X_e}, \tag{A1}$$

where Xe is the parameters' value at the EPD, and X is the parameter's value after applying perturbation. A perturbation ΔX, perturbs the system matrix, which results in the perturbed eigenvalues $\omega_p(\Delta X)$ with p=1, 2, for a second order EPD. The Puiseux fractional power series expansion of $\omega_p(\Delta X)$ may be given by:

$$\omega_p(\Delta_X) \approx \omega_e + \alpha_1(-1)^p \sqrt{\Delta_X} + \alpha_2\Delta_X, \tag{A2}$$

where the first two coefficients are expressed:

$$\alpha_1 = \left( -\frac{\dfrac{\partial H(\Delta_X, \omega)}{\partial \Delta_X}}{\dfrac{1}{2!}\dfrac{\partial^2 H(\Delta_X, \omega)}{\partial \omega^2}} \right)^{\frac{1}{2}}, \tag{A3}$$

$$\alpha_2 = -\frac{\dfrac{\alpha_1^3}{3!}\dfrac{\partial^3 H(\Delta_X, \omega)}{\partial \omega^3} + \alpha_1 \dfrac{\partial^2 H(\Delta_X, \omega)}{\partial \omega \partial \Delta_X}}{\alpha_1 \left( \dfrac{\partial^2 H(\Delta_X, \omega)}{\partial \omega^2} \right)}, \tag{A4}$$

where H(ΔX, ω)=det(M(ΔX)−jωI). The coefficients may be calculated at the EPD, e.g., at ΔX=0 and ω=$\omega_e$.

The approximated results obtained by the Puiseux series illustrate an excellent agreement with the "exact" values calculated directly from the eigenvalue problem. The coefficients of the Puiseux series up to second-order for the mentioned example are calculated as, α1=3.85×105 rad/s, and α2=1.42×105 rad/s when perturbing Rg, and α1=j2.07× 105 rad/s, and α2=−1.72×105 rad/s when perturbing C1. The bifurcation of the real part of the eigenfrequencies, which indicate the stable sensing region, may be observed when Rg>Rg,e, and C1<C1,e.

Figure 2G:
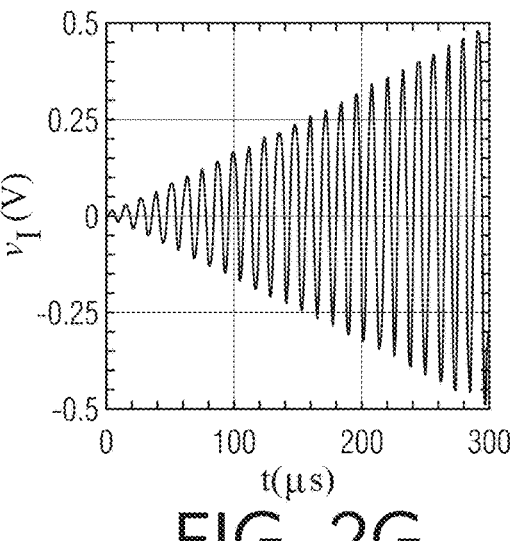
Figure 2H:
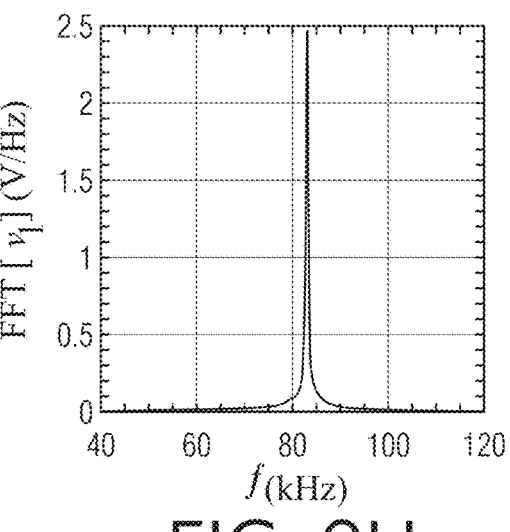

Time-domain simulation result for the voltage v1(t) may be obtained using the Keysight Advanced Design System (ADS) time-domain circuit simulator, and the result is plotted in FIG. 2G. The frequency spectrum corresponding to the simulated time-domain voltage may be found by taking the Fast Fourier Transform (FFT), as illustrated in FIG. 2H. The results may be obtained using the initial voltage of 1 mV on the left capacitor $C_1$. The voltage increases linearly with time may be observed. In circuit theory, this linear growth indicates that two system eigenvalues collided, and a double pole describes the system response. This may be a specific property of a second-order EPD. The oscillation frequency may be $\omega_o$=5.22×105 rad/s, which may be equal to EPD angular frequency ωe.

Indeed, the EPD may be observed in a frequency-domain analysis by calculating the circuit's total input admittance $Y_{total}(\omega)$, as illustrated in FIG. 2A. The two admittances of two LC tanks may be defined as $Y_1$=jω$C_1$+1/(jω$L_1$), $Y_2$=jω$C_2$+1/(jω$L_2$). Then the transferred admittance of the $Y_2$ to the left side may be $Y_{trans}(\omega)$=1/($R_g^2 Y_2$). The total admittance observed from the circuit input port may be calculated by:

$$Y_{total}(\omega) = Y_1(\omega) + Y_{trans}(\omega). \tag{9}$$

Figure 2I:
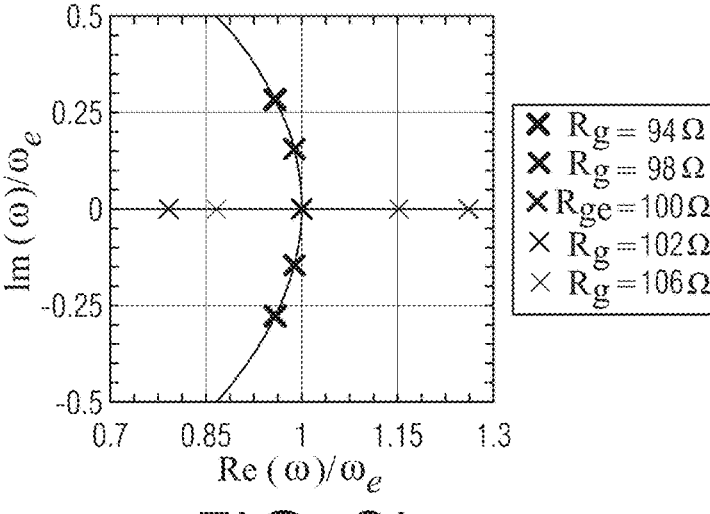

The resonant angular frequencies are achieved by imposing Ytotal(ω)=0, the normalized resonance frequencies to the EPD angular frequency by varying the gyration resistance are illustrated in FIG. 2I. Two zeros of total admittance coincide exactly at EPD.

2. Lossy Configuration and Stability

Figure 3A:
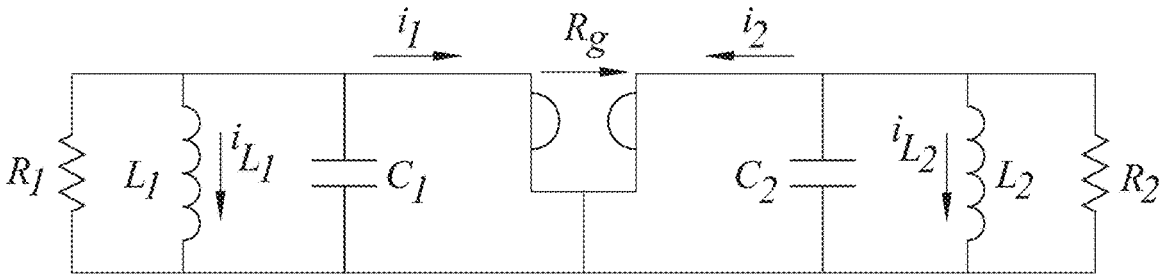
FIGS. 3A-3E are diagrams illustrating a schematic view of the lossy gyrator-based circuit, with a resistor in each resonator, variation of real and imaginary parts of the angular eigenfrequencies to a resistor perturbation on the left resonator, e.g., when $\gamma1$ changes and $\gamma2$=0, and variation of real and imaginary parts of the angular eigenfrequencies to a resistor perturbation on the right resonator, e.g., when $-\gamma2$ changes and $\gamma1$=0.

In this section, the loss effects on the eigenfrequencies of the gyrator-based circuit may be studied. Two parallel resistors $R_1$ and $R_2$ are connected to both resonators, as illustrated in FIG. 3A. By writing down the circuit equations and assuming the same state vector as introduced in the lossless case, the associated Liouvillian formalism reads as $$\frac{d\Psi}{dt} = \underline{M}\Psi, \tag{10}$$

$$\underline{M} = \begin{bmatrix} 0 & 0 & 1 & 0 \\ 0 & 0 & 0 & 1 \\ -\omega_{01}^2 & 0 & -\gamma_1 & \frac{1}{R_g C_2} \\ 0 & -\omega_{02}^2 & -\frac{1}{R_g C_1} & -\gamma_2 \end{bmatrix}, \tag{11}$$

where $\gamma_1=1/(R_1 C_1)$ and $\gamma_2=1/(R_2 C_2)$ represent the losses made by resistors. The eigenfrequencies are found by solving the characteristic equation, $$\omega^4 - j\omega^3(\gamma_1 - \gamma_2) - \omega^2\left(\omega_{01}^2 + \omega_{02}^2 + \gamma_1\gamma_2 + \frac{1}{C_1 C_2 R_g^2}\right) + \tag{12}$$
$$j\omega(\gamma_1\omega_{02}^2 + \gamma_2\omega_{01}^2) + \omega_{01}^2\omega_{02}^2 = 0.$$

FIGS. 3A-3E are diagrams illustrating a (a) schematic view of the lossy gyrator-based circuit, with a resistor in each resonator, variation of (b) real and (c) imaginary parts of the angular eigenfrequencies to a resistor perturbation on the left resonator, e.g., when $\gamma 1$ changes and $\gamma 2=0$, and variation of (d) real and (e) imaginary parts of the angular eigenfrequencies to a resistor perturbation on the right resonator, e.g., when $-\gamma 2$ changes and $\gamma 1=0$.

Here, eigenfrequencies $\omega$ and $-\omega^*$ are both roots of the characteristic equation. In order to have a stable circuit, eigenfrequencies should be purely real, but the characteristic equation in Eq. (12) has some imaginary coefficients. Here, to have purely real eigenfrequencies in the lossy circuit, the odd-power terms of the angular eigenfrequency in the characteristic equation should vanish. Otherwise, a complex eigenfrequency may be needed to satisfy the characteristic equation. There is no condition to make both $\omega$ and $\omega^3$ coefficients equal to zero 33. Hence, eigenfrequencies are always complex, leading to instabilities that cause oscillations in the circuit.

Figure 3B:
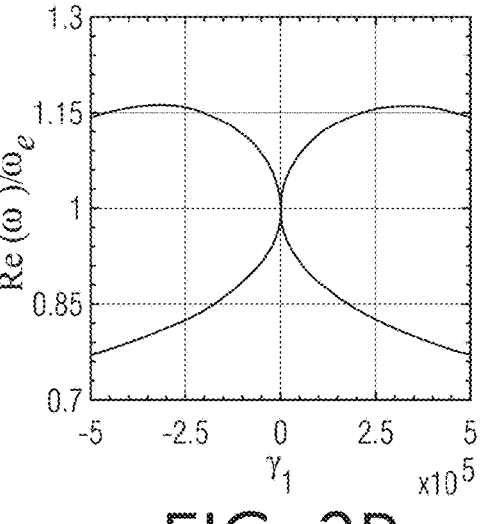
Figure 3C:
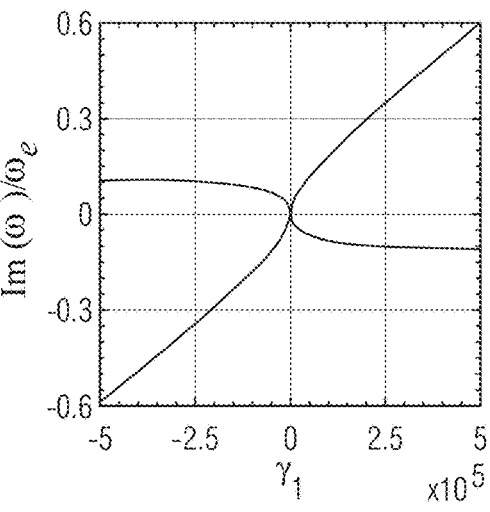
Figure 3D:
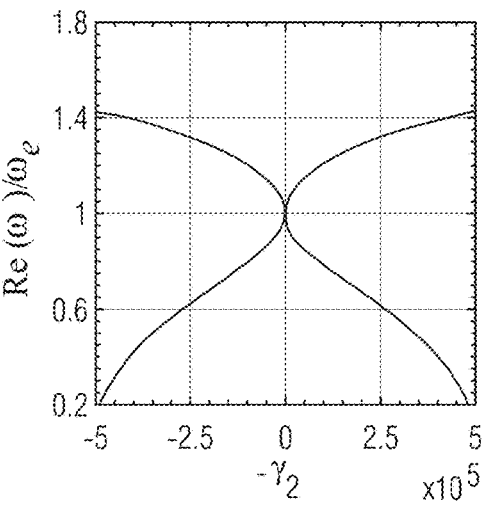
Figure 3E:
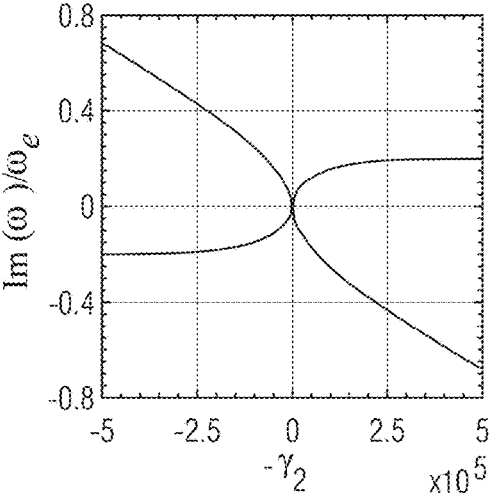

By considering the same value for components as already used in the lossless case, the evolution of eigenfrequencies is illustrated in FIGS. 3B-3C. In these plots, loss on the first resonator is changed, and loss on the second resonator is eliminated. Moreover, in FIGS. 3D-3E, the loss on the second resonator may be perturb while the loss on the first resonator may be removed. When both losses are zero, the system has the same EPD frequency of a lossless configuration, but perturbed eigenfrequencies are complex-valued for any amount of losses. So, the lossy circuit oscillates with the frequency associated with the real part of the unstable eigenfrequency. Also, the eigenfrequency may be extremely sensitive to either positive or negative variations in the parallel resistances (square root behavior due to the perturbation). A working option may be based on preventing the circuit from reaching saturation by switching off the circuit and operating on the circuit's transient response, for an EPD circuit based on a time modulated circuit element, discussed below.

III. EPD in PT-Symmetric Coupled Resonators and Nonlinearity Effects

This section discusses the EPD in two mutually coupled resonators based on PT-symmetry. These are the circuits studied so far by most of the researchers in the last decade. The occurrence of an EPD may be illustrated by using the concept of the eigenvector coalescence parameter. Moreover, the resonance condition when the total admittance of the circuit may be equal to zero (e.g., the double zero condition) may be studied. The negative conductance in the analyzed circuit could be achieved via cross-coupled or Operational Amplifier-based circuits. The negative conductance obtained from these transistor-based circuits has nonlinearity effects due to the saturation. Thus, the nonlinearity in negative conductance would alter the circuit operation, as discussed later on. The nonlinearity may be modeled with a cubic i–v law and illustrate the time-domain analysis and frequencies responses by using time-domain simulations that are the right tool when nonlinearity may be present.

Moreover, the EPD sensitivity characteristic and bring an example of perturbation of the one side capacitance may be stressed. It means that in a normal sensing scheme, the PT-symmetry may be broken. High sensitivity behavior may be modeled with the eigenfrequencies for either positive or negative changes in capacitance and illustrate that the system becomes unstable. In Ref. 12, the authors discussed sensitivity in the two PT-symmetric coupled resonators. They demonstrate the sensitivity of the eigenfrequencies of the circuit due to the capacitance perturbation where they kept the PT-symmetry configuration. Thus, they needed to tune the other (non-sensing) side of the circuit to have a balanced capacitance on both sides to keep the PT-symmetry even after each sensing operation. It means that the exact value of the changes should be known to tune the other side, which may not be possible in practical sensing scenarios. Also, they could only measure the perturbation in the bifurcation direction (e.g., only the negative (or positive) capacitance changes, based on the design). Both positive and negative capacitance sensing ranges should be desirable, and the tuning process should be made easier since there is no a priori knowledge of the sensing capacitance variation, hence it may not be possible to keep the system PT-symmetric while sensing unless possible iterative schemes are researched that guess the unknown capacitance value. Finally, the eigenfrequency's sensitivity and square root behavior to the perturbation may be confirmed by using the Puiseux fractional power series expansion.

1. EPD in Mutual Coupled Resonators with PT-Symmetry

Figure 4A:
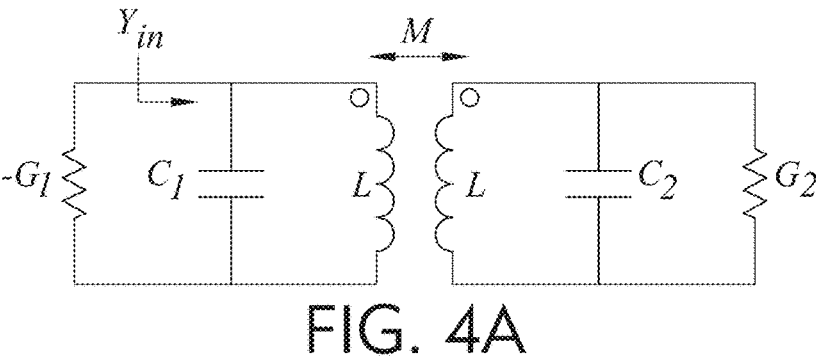
FIGS. 4A-4E are diagrams illustrating two mutually coupled LC tanks terminated with balanced gain on the left and loss on the right side G1=G2=G; real; and imaginary parts of evaluated eigenfrequencies by perturbing G, in the illustrated plots, only eigenvalues with the positive real parts are drawn, the coalescence factor corresponding to calculated eigenvectors which illustrating the degeneracy of two eigenvectors exactly at Ge, root locus of zeros of Yin($\omega$)–G=0 illustrating the real and imaginary parts of resonance frequencies of the circuit when perturbing both load resistance and gain G, at the EPD, the system's total admittance is Yin($\omega$)–Ge$\propto$($\omega-\omega_e)^2$, hence the total admittance illustrates a double zero at $\omega_e$.

Two coupled LC tanks terminated on the left side with a gain given by the negative conductance −G1 and terminated on the right side with loss G2 are illustrated in FIG. 4A. By writing Kirchhoff's current law, the two equations for the circuit may be obtained:

$$\begin{cases} \ddot{Q}_1 = -\dfrac{Q_1}{LC_1(1-k^2)} + \dfrac{kQ_2}{LC_2(1-k^2)} + \dfrac{G_1}{C_1}\dot{Q}_1 \\[2mm] \ddot{Q}_2 = \dfrac{kQ_1}{LC_1(1-k^2)} - \dfrac{Q_2}{LC_2(1-k^2)} - \dfrac{G_2}{C_2}\dot{Q}_2 \end{cases} \tag{13}$$

where Q1 is the capacitor charge on the gain side (left resonator), Q2 is the capacitor charge on the loss side (right resonator), and k=M/L is the transformer coupling coefficient. In addition, Q1, Q1, Q2, and Q2 are the first and the second time derivatives of the capacitors' charge. The state vector may be defined as $\Psi \equiv [Q1,Q2,Q1,Q2]^T$ where superscript T denotes the transpose operation. Therefore, the circuit evolution may be described by $$\frac{d\Psi}{dt} = M\Psi, \tag{14}$$

$$M = \begin{bmatrix} 0 & 0 & 1 & 0 \\ 0 & 0 & 0 & 1 \\ \dfrac{-1}{LC_1(1-k^2)} & \dfrac{k}{LC_2(1-k^2)} & \dfrac{G_1}{C_1} & 0 \\ \dfrac{k}{LC_1(1-k^2)} & \dfrac{-1}{LC_2(1-k^2)} & 0 & -\dfrac{G_2}{C_2} \end{bmatrix}. \tag{15}$$

FIGS. 4A-4E are diagrams illustrating (a) two mutually coupled LC tanks terminated with balanced gain on the left and loss on the right side G1=G2=G; (b) real; and (c) imaginary parts of evaluated eigenfrequencies by perturbing G, in the illustrated plots, only eigenvalues with the positive real parts are drawn, (d) the coalescence factor corresponding to calculated eigenvectors which illustrating the degeneracy of two eigenvectors exactly at Ge, (e) root locus of zeros of Yin(ω)–G=0 illustrating the real and imaginary parts of resonance frequencies of the circuit when perturbing both load resistance and gain G, at the EPD, the system's total admittance is $Yin(\omega)-Ge \propto (\omega-\omega_e)^2$, hence the total admittance illustrates a double zero at $\omega_e$.

Assuming signals in the form of $Q_n \propto e^{j\omega t}$, C1=C2=C0 and G1=G2=G, the eigenfrequencies of the circuit may be determined by solving the characteristic equation, det(M–jωI)=0, leading to $$\begin{cases} \omega_{1,3} = \pm\omega_0\sqrt{\dfrac{1}{1-k^2} - \dfrac{\gamma^2}{2} - \sqrt{b}} \\ \omega_{2,4} = \pm\omega_0\sqrt{\dfrac{1}{1-k^2} - \dfrac{\gamma^2}{2} + \sqrt{b}} \end{cases} \tag{16}$$

where $$b = -\frac{1}{1-k^2} + \left(\frac{\gamma^2}{2} - \frac{1}{1-k^2}\right)^2. \tag{17}$$

In the above equations, $\gamma = G\sqrt{L/C0}$ and $\omega 0 = 1\sqrt{LC0}$. According to Eq. (17), the required condition to obtain an EPD may be b=0, which leads to an EPD angular frequency of $$\omega_e = \frac{\omega_0}{\sqrt[4]{1-k^2}}. \tag{18}$$

Figure 4B:
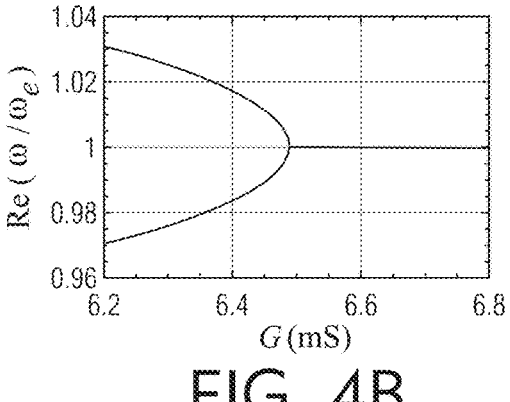
Figure 4C:
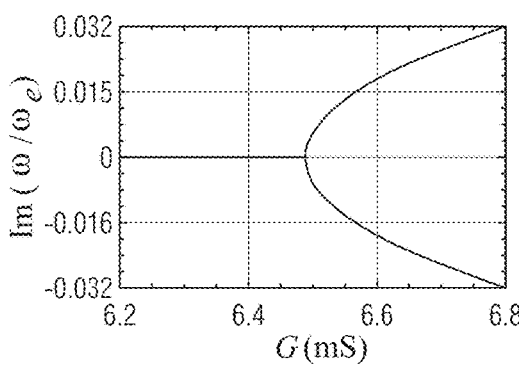

In the presented example, L=1 μH, $C_1=C_2=1$ nF, may be used where inductors may be mutually coupled via k=0.2, and terminated with balanced gain and loss $-G_1=G_2=G$. After solving the eigenvalue problem, the evolution of real and imaginary parts of the eigenfrequencies are illustrated in FIGS. 4B and 4C. The eigenfrequencies of the circuit coalesce at a specific balanced gain/loss value of $\gamma=\gamma_e=0.205$, where ye that leads to an EPD may be derived as $$\gamma_e = \frac{1}{\sqrt{1-k}} - \frac{1}{\sqrt{1+k}}. \tag{19}$$

To validate the results, assume γ=0, which is no gain or loss in the system results in two simple mutual LC tanks. The mentioned circuit has two pairs of eigenfrequencies $\omega_{1,3}=+\omega_0/\sqrt{1+k}$ and $\omega_{2,4}=\omega_0/\sqrt{1-k}$. When the coupling, e.g., k=0, of the eigenfrequencies may be removed, the circuit may be equal to those of the isolated circuits two. For the values, $0<\gamma<\gamma_e$, the system's eigenfrequencies are purely real, and the system has two fundamentals real eigenfrequencies. For the values, $\gamma_e<\gamma$, the two eigenfrequencies are complex conjugate, and system solutions grow or damp depending on the sign of the imaginary part of the angular eigenfrequencies, the system exhibits self (unstable) oscillations at the frequency associated with the real part of eigenfrequency. The eigenvector coalescence factor C may be defined to evaluate how the circuit's operation point is close to an EPD and measure the coalescence of two state eigenvectors. It may be defined as $C=|\sin(\theta)|$, where $\cos(\theta)$ is $$\cos(\theta) = \left(\frac{|\langle\Psi_1, \Psi_2\rangle|}{\|\Psi_1\|\|\Psi_2\|}\right). \tag{20}$$

Figure 4D:
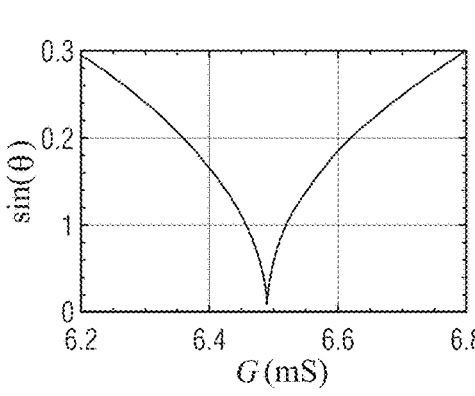

In the determined equation the symbol <A,B> represents the inner product (also called the scalar product) between the two vectors A and B, and ‖ denotes a vector's norm. The coalescence factor for the presented example is illustrated in FIG. 4D. As may be observed in FIG. 4D, two eigenvectors have coalesced at the corresponding value for EPD.

2. Root Locus of Zeros of Admittance

In this section, the resonance condition based on the vanishing of the total admittance is studied. The admittance Yin, illustrated in FIG. 4A, may be found and it may be demonstrated that the admittance Yin may be double zero at the EPD. The resonance condition for this circuit may be expressed as $$Y_{in}(\omega) - G = 0. \tag{21}$$

Figure 4E:
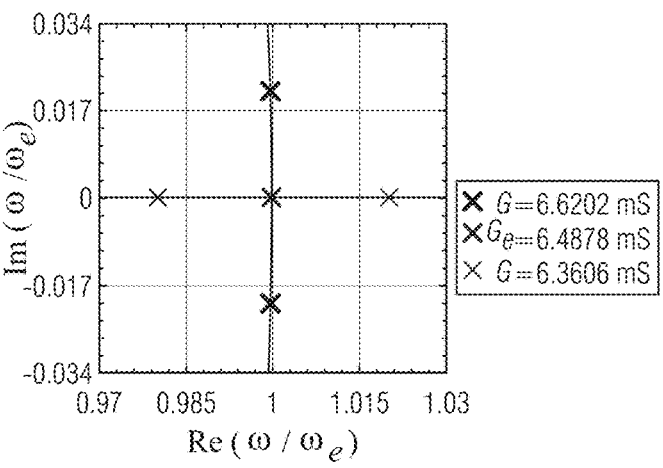

Here, the circuit is PT-symmetric, assuming linear gain and loss with G1=G2=G. The eigenfrequency may be calculated by finding the zeros of the Yin(ω)–G, which results in the same eigenfrequencies obtained from det(M–jωI)=0. From the zeros trajectory, both ω(G) and –ω(G) and ω(G) and ω*(G) are solutions in Eq. (21), and only the eigenfrequencies with positive real value are illustrated in FIG. 4E.

3. Nonlinear Gain and Oscillator Characteristics

FIGS. 5A-5F are diagrams illustrating (a) two mutually coupled LC tanks terminated with nonlinear gain on the left and linear loss resistance on the right side where G1=(1+δ)×G2 (i.e., gain is a bit larger than loss), (b) time domain response, (c) frequency response of the gain side capacitor voltage at EPD point, (d) real, (e) imaginary parts of the eigenfrequencies to load capacitance perturbation ΔC2 where the solid line is exact result by determining the det(M–jωI)=0, dashed line is Puiseux fractional power series expansion terminated until second order and the black dots are obtained from nonlinear-gain time domain simulation, and (f) oscillation frequency versus load capacitance perturbation for three different mismatches between gain and loss δ=0, 0.001, 0.01, obtained from nonlinear-gain time domain simulation.

Figure 5A:
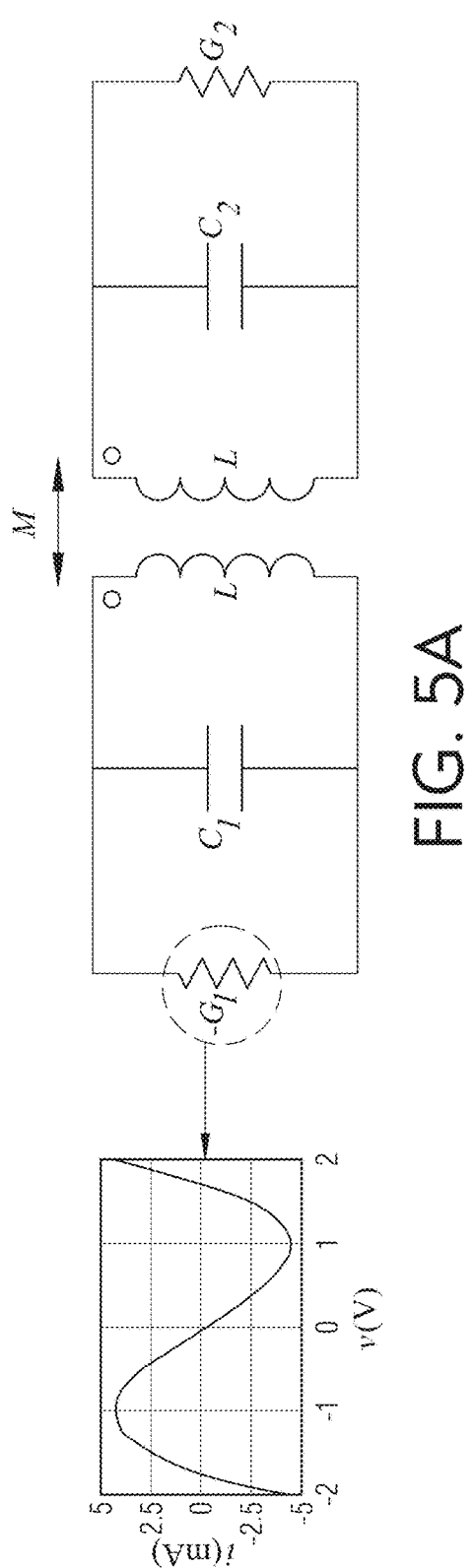
FIGS. 5A-5F are diagrams illustrating two mutually coupled LC tanks terminated with nonlinear gain on the left and linear loss resistance on the right side where G1=(1+$\delta$)×G2 (i.e., gain is a bit larger than loss), time domain response, frequency response of the gain side capacitor voltage at EPD point, real, imaginary parts of the eigenfrequencies to load capacitance perturbation $\Delta$C2 where the solid line is exact result by determining the det(M–j$\omega$I)=0, dashed line is Puiseux fractional power series expansion terminated until second order and the black dots are obtained from nonlinear-gain time domain simulation, and oscillation frequency versus load capacitance perturbation for three different mismatches between gain and loss $\delta$=0, 0.001, 0.01, obtained from nonlinear-gain time domain simulation.
Figure 5C:
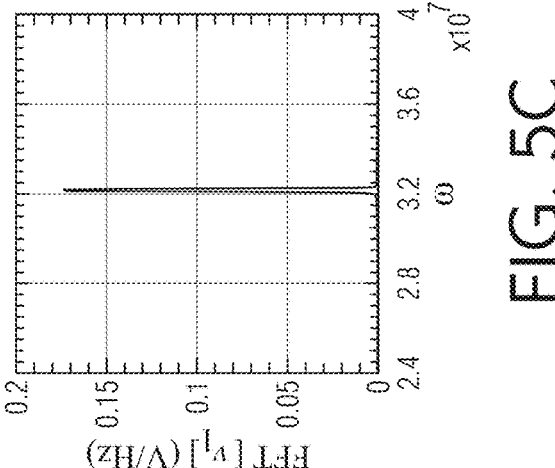
Figure 5B:
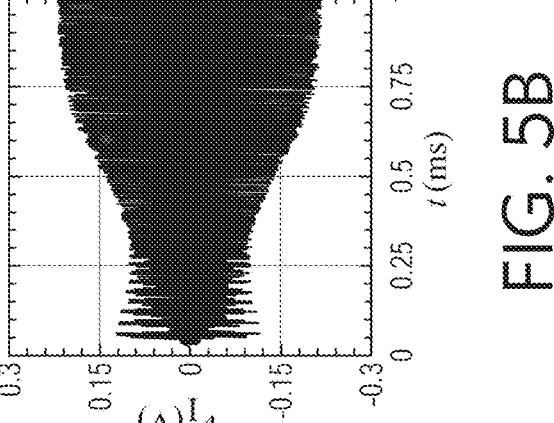
Figure 5D:
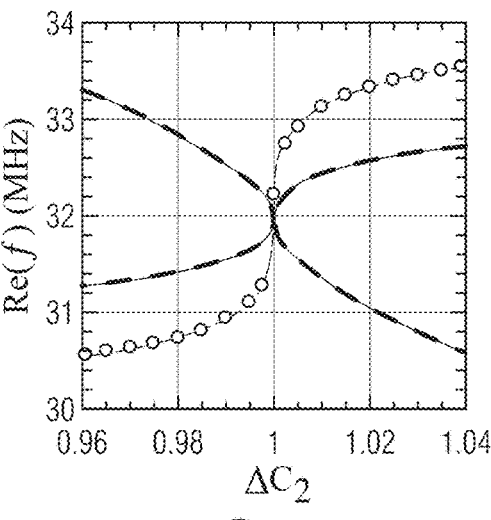
Figure 5E:
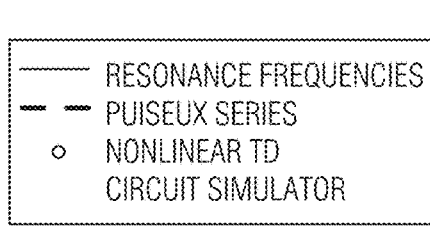
Figure 5E:
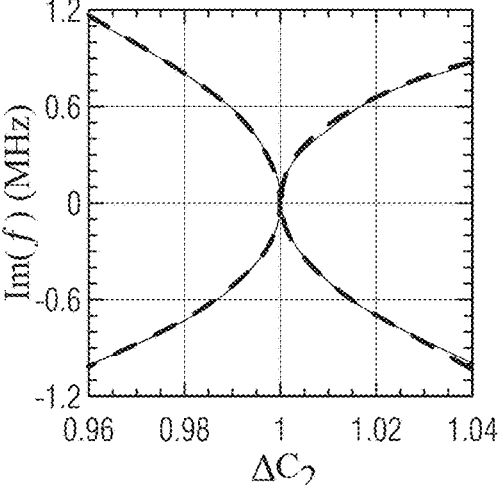
Figure 5F:
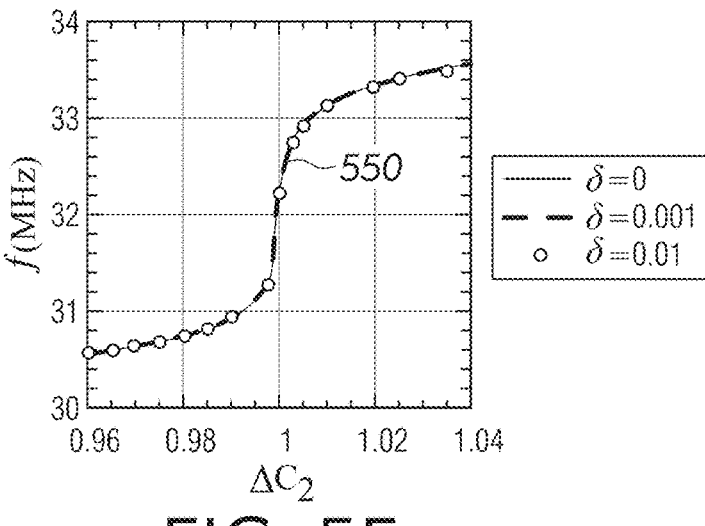

In this section, the oscillator characteristics and nonlinear effects in two wireless coupled resonators are discussed, as in FIGS. SA-5F. FIG. 5A is a diagram illustrating two mutually coupled LC tanks terminated with nonlinear gain on the left and linear loss resistance on the right side where G1=(1+δ)×G2 (i.e., gain is a bit larger than loss). The transient and frequency response of the system is discussed by using a cubic model (nonlinear) negative conductance as the gain element. The system's parameters are the same as in the previous section where Ge=6.49 ms, and EPD frequency may be ωe=3.19×106 rad/s. The relation between voltage and current of the negative conductance is $$i = -G_1 v + \alpha v^3, \tag{22}$$

where −G1 may be the small-signal negative conductance and α=gm/3 is a third-order nonlinearity that is related to saturation. The small-signal nonlinear gain G1 may be assumed to be slightly bigger than the balanced loss, as G1=1.001G2 to make the circuit a bit unstable (slightly breaking PT-symmetry). Time-domain response and frequency response obtained from the Keysight ADS time-domain circuit simulator are illustrated in FIGS. 5B-5C, where the circuit operates in the proximity of the EPD. To determine how this sensitive scheme works, the nonlinear gain element as defined in Eq. (22), may be considered, where the small-signal negative conductance may be increased by 0.1% from its loss balanced value Ge to make the system oscillate. To illustrate the sensitivity, the capacitor C2 may be perturbed on the lossy side by 0.5%. The oscillation frequency in each perturbation, illustrated with the black dots, may be found by taking the FFT of the time-domain voltage signal at the capacitor C1 (on the gain side) after reaching saturation, obtained from the Keysight ADS circuit simulator. The FFT may be calculated by 106 samples in the time window of 1000 periods after saturation for each perturbation. The system illustrates a distinct frequency response at each perturbed capacitor value, and the frequency shift could be easily measured. Moreover, solid lines in FIGS. 5D-5E illustrate the eigenfrequency evolution versus $C_1$ perturbation by assuming linear gain for −G1. The dashed line is Puiseux fractional power series expansion to exhibit the square-root-like sensitivity of the eigenvalues to a perturbation.

The Puiscux series coefficients are calculated as, α1=5.35×106−j4.84×106 rad/s, and α2=7.90×106−j1.62×106 rad/s.

Using nonlinear gain in the circuit and saturation effects makes the EPD point sensing regime robust. An error-correction method is discussed to enhance the robustness of sensing using nonlinearity in Ref. 43. Also, the nonlinearity works as a self-correcting process in two coupled optical ring resonators in Ref. 44. Nonlinearity in our proposed circuit helps maintain the EPD frequency within a small mismatch between gain and loss. The results obtained from the simulation illustrated in FIG. 5F demonstrate that even with a 1% mismatch between gain and loss, the circuit oscillates at the same frequency as the case with balanced loss and gain. Curve 550 illustrates the oscillation frequency for the system with an exact match between the (nonlinear) small-signal gain and loss (e.g., $G_1=G_2$), the dashed line is related to the case with $G_1=1.001G_2$, and the black points denote the case with even larger small-signal gain, $G_1=1.01G_2$. They all illustrate the same results in terms of shifted oscillation frequency versus perturbation.

IV. EPD in a Time-varying Single Resonator

FIGS. 6A-6D are diagrams illustrating (a) circuit with time periodic capacitor connected to the inductor in parallel, as an example the capacitor varies between two values C1 and C2 with Tm period, as illustrated as an inset, (b) real, and (c) imaginary parts of resonance frequency evolution varying modulation frequency fm, (d) the time domain signal of the second order EPD which is indicated by the linear growth of the capacitor voltage with initial condition of vc(0−)=50 mV, and fm=63.95 kHz.

Here, the time-varying single-resonator circuit that is used as a highly sensitive circuit is discussed. Compared to the PT-symmetry system with balanced gain and loss, the EPD's highly sensitive characteristics are also found in the time-varying single resonator without the need of a gain component. For instance, an EPD in a periodic time-varying simple LC circuit may be illustrated. The general formulation that can be applied to any electronic and optic application may be summarized by assuming the state vector $\Psi(t)=[\Psi 1(t), \Psi 2(t)]T$ where T is the transpose operator. The differential equation describing the state vector time evolution is $$\frac{d\Psi}{dt} = M\Psi, \tag{23}$$

where M (t) may be the 2×2 time-variant system matrix. For LTV systems with period Tm, the state vector evolution from the time instant t to t+Tm may be given by $$\Psi(t + T_m) = \Phi(t + T_m, t)\Psi(t), \tag{24}$$

where Φ(t2,t1) is the state transition matrix that transfers the state vector Ψ from t1 to t2. The eigenvalue problem is $$(\Phi - \lambda I)\Psi(t) = 0, \tag{25}$$

where I is a two-by-two identity matrix and λ represents an eigenvalue. The eigenvalues are found by solving the characteristic equation det(Φ−λI)=0. The eigenvalues and eigenvectors of the system are found as $$\begin{cases} \lambda_p = \frac{tr(\Phi)}{2} \pm \sqrt{\left(\frac{tr(\Phi)}{2}\right)^2 - \det(\Phi)} \quad p = 1, 2 \\ \Psi_p(t) = [\phi_{12}\lambda_p - \phi_{11}]^T \end{cases} \tag{26}$$

where φ12 and φ11 are elements of the two-by-two matrix Φ. For the illustrated circuit in FIG. 6A, the eigenvalues are λp=exp(j2πfpTm), p=1, 2, where fp are the two resonance frequencies with all (fp±nfm) harmonics (n is the integer number, and the modulation frequency is fm=1/Tm).

The degeneracy may be demonstrated in a linear-time-varying (LTV) LC tank illustrated in FIG. 6A. The capacitance c(t) with varies between two values $C_1=1.5C_0$ and $C_2=0.5C_0$, where $C_0=20$ nF, with period $T_m$.

Defining the state vector $\Psi(t)=[q(t),i(t)]^T$ with capacitor's charge q(t) and the inductance current i(t), the system matrix may be found as:

$$\underline{M}_p = \begin{bmatrix} 0 & -1 \\ 1/(L_0 C_p) & 0 \end{bmatrix},$$ (27)

$$p = 1, 2.$$

The resonant frequencies versus modulation frequency fm are illustrated in FIG. 6B-6C. The plot may be restricted to frequencies with positive real value, in the range of 0<f/fm<1, which could be identified as the fundamental Brillouin Zone (BZ) in a time-varying system. EPD happens at fm,e=71.72 kHz and fm,e=63.95 kHz, where the subscript e denotes the EPD point. At an EPD, two eigenvectors and eigenvalues collide, corresponding to a non-diagonalizable transition matrix Φ with a degenerate eigenvalue Ae which may be related to the resonance frequency fe. In this configuration, two scenarios may happen to have the EPD (when state transition matrix Φ may be equivalent to a second-order Jordan-Block matrix). FIG. 6D is a diagram illustrating the time domain signal of the second order EPD which is indicated by the linear growth of the capacitor voltage with initial condition of vc(0−)=50 mV, and fm=63.95 kHz.

First, when the degenerate eigenvalue may be λe=−1, which may be related to a resonance frequency fe=fm/2, and due to the time periodicity, resonance frequencies also happen at harmonics (fe=fm/2±nfm). Second, when λe=1, which may be related to fe=0, and to the harmonics fe=±nfm. Note that here a lossless LC tank (besides the energy injection due to time variation) is assumed, and the loss effects later may be considered. For modulation values such that 63.95 kHz<fm<71.72 kHz, the system has two real resonance frequencies, whereas for modulation frequency such that 71.72 kHz<fm<74.13 kHz, the system experiences complex resonance frequencies, which causes instability and oscillation (rising signal associated with the resonance frequency's negative imaginary part). Here, the stable part may be worked on, which has two different real resonance frequencies. At the EPD frequency associated to a modulation frequency fm=63.95 kHz, the capacitor's voltage grows linearly, considering the initial condition of vc(0−)=50 mV, which indicates that two eigenfrequencies have coalesced.

1. Loss Effects on LTV Circuit

FIGS. 7A-7G are diagrams illustrating (a) circuit with time periodic capacitor C (t) connected to the inductor L0 and associated loss/gain G in parallel. The capacitor varies between two values C1 and C2 with Tm period, as illustrated in the subset, (b) real and (c) imaginary parts of resonance frequency evolution varying modulation frequency fm where the LC tank is connected to the lossy conductance G=1 mS, (d) the time domain signal obtained from Keysight ADS circuit simulator, when circuits operates at the second order EPD which is indicated by the decaying signal associated to the positive imaginary part of eigenfrequencies. (e) Real and (f) imaginary parts of resonance frequency evolution varying modulation frequency, fm, where the LC tank is connected to the negative conductance G=−1 mS. (g) capacitor's voltage obtained from Keysight ADS circuit simulator, which illustrates the rising signal. In all time domain simulation, the capacitor has an initial condition of vc(0−)=50 mV.

Loss effects may be considered and studied to validate the occurrence of the EPDs in temporally LC resonator with losses, an LC tank may be assumed, where the constant conductance G may be associated to the losses or gain may be connected in parallel, as illustrated in FIG. 7A. In this circuit, the capacitance C may be changing between two-level capacitance (C₁=1.5C₀ and C₂=0.5C₀) with period Tm, as in the previous lossless case. In an aspect, two scenarios may be considered where the system may be connected to a loss (G>0) or gain (G<0) element. Defining the state vector Ψ(t)=[q(t),i(t)]T with capacitor's charge q(t) and the inductance current i(t), the system matrix may be found as:

$$\underline{M}_p = \begin{bmatrix} -G/C_p & -1 \\ 1/(L_0 C_p) & 0 \end{bmatrix},$$ (28)

$$p = 1, 2.$$

a. Time-Varying Capacitor: Lossy Case (G>0)

The complex dispersion diagram in FIGS. 7B-7C illustrate real and imaginary parts of the eigenfrequencies versus modulation frequency illustrated. The system parameters are the same as those as in the previous section: L₀=33 µH, C₀=20 nF, G=1 mS. FIG. 7D illustrates the capacitor's voltage at the EPD associated with f_m=63.95 kHz due to the initial condition of v_c(0−)=50 mV obtained from Keysight ADS time-domain circuit simulator. In this configuration, the LTV circuit with loss illustrates that the imaginary part of the eigenfrequency at every EPD may be positive. The state vector, which contains the capacitor's voltage and inductor current, may be proportional to the $e^{j\omega t}$ Eigenfrequency with positive imaginary leads to a decaying signal (exponential decay of the system state vector), as illustrated for the case in FIG. 7D.

b. Time-Varying Capacitor: Gain Case (G<0)

Figure 7E:
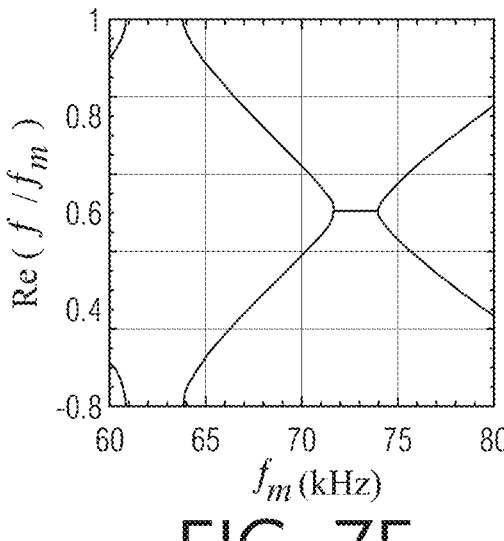
Figure 7F:
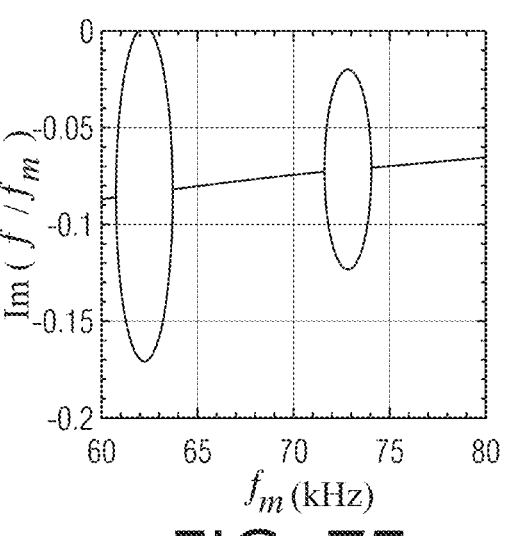
Figure 7G:
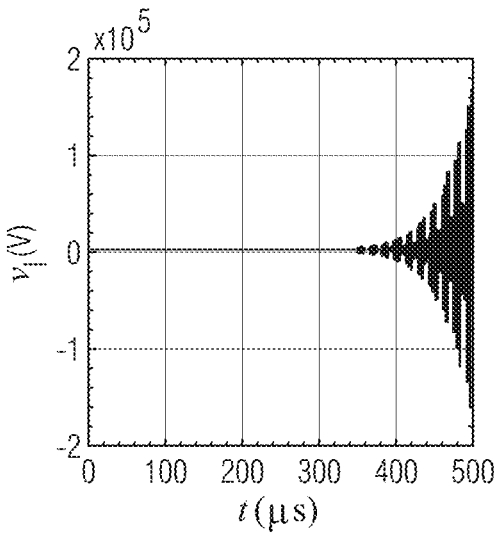

FIGS. 7E-7F illustrate the real and imaginary parts of the system's eigenfrequencies where the system's parameters are selected as L0=33 µH, C0=20 nF, G=1 mS. The negative conductance G here illustrates the gain which results in EPD frequencies with a negative imaginary part. Thus, the state vector may be rising exponentially and making the system unstable. FIG. 7G illustrates the capacitor's voltage at an EPD associated to f_m=63.95 kHz due to the initial condition of v_c(0−)=50 mV obtained from Keysight ADS circuit simulator. The signal illustrates the rising behavior, which makes the system unstable and oscillating.

2. Time-Varying Conductance

FIGS. 8A-8J are diagrams illustrating a (a) circuit scheme including LC tank connected to the time-varying loss, (b) real and (c) imaginary parts of eigenfrequency versus modulation frequency fm, where the loss average is zero, (d) time-domain signal capacitance's voltage v1(t), which illustrates the linear growth at EPD, (e) real and (f) imaginary parts of eigenfrequency versus modulation frequency fm, where the loss average is positive (G works as a lossy component in average), and (g) time-domain signal capacitance voltage v1(t) is decaying related to the positive imaginary part of eigenfrequency at EPD, (h) real and (i) imaginary parts of eigenfrequency versus modulation frequency fm, where the loss average is negative (G works as a gain component in average), and (j) time-domain signal capacitance voltage v1(t) is rising related to the negative imaginary part of eigenfrequency at EPD. In all time-domain simulation the capacitor has an initial condition of vc(0−)=50 mV.

Figure 8A:
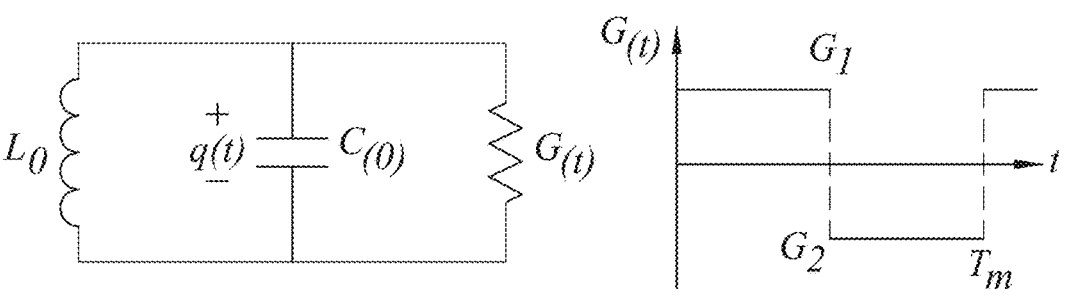

In this section, the time-varying loss/gain element with the time periodicity of Tm in the LTV circuit in FIG. 8A may be considered. The occurrence of EPDs may be illustrated. The parallel conductance may be set to G1 for half period, and to G2 for the other half. Generally, G1 and G2 could be positive and negative values acting as loss or gain in this scheme. By defining the state vector $\Psi(t)=[q(t),i(t)]T$ with capacitor's charge $q(t)$ and the inductance current $i(t)$, the system matrix may be found as:

$$\underline{M}_p = \begin{bmatrix} -G_p/C_0 & -1 \\ 1/(L_0 C_0) & 0 \end{bmatrix}, \tag{29}$$

$$p = 1, 2.$$

Three scenarios where the time average of the conductance may be considered.

$$Avg(G) = G_1 \frac{Tm}{2} + G_2 \frac{Tm}{2}, \tag{30}$$

is positive (lossy), negative (gain), and zero, the average $Avg(G)>0$ means that loss may be dominant, whereas $Avg(G)<0$ means that gain may be dominant, and when $Avg(G)=0$ the system has balanced gain and loss. In this section, the LC tank may be set as $L_0=33$ μH and $C_0=20$ nF.

a. Time-Varying Conductance: Zero Average $Avg(G)=0$

Figure 8B:
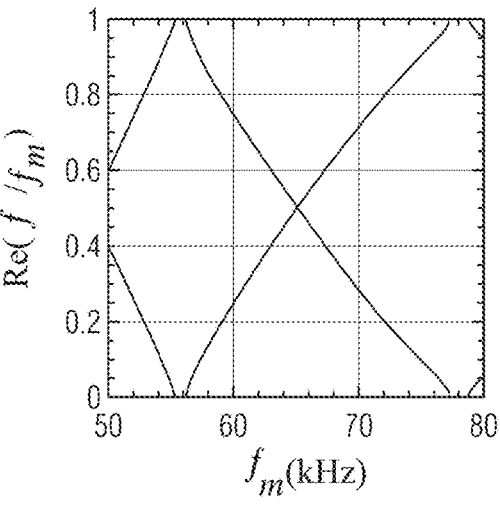
Figure 8C:
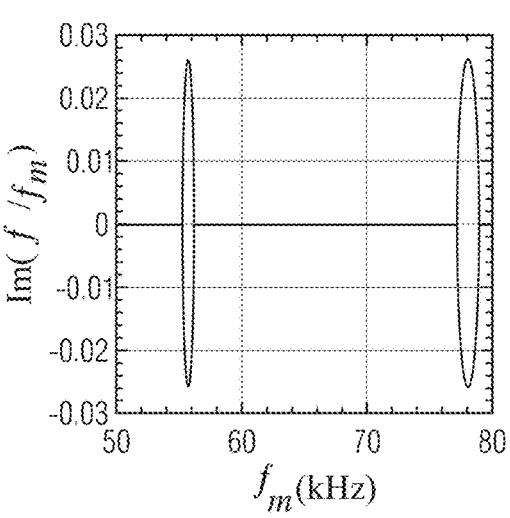

FIGS. 8B-8C illustrate the complex dispersion diagram, eigenfrequencies versus frequency modulation, with a zero time-average conductance. The conductance for half a period $T_m/2$ may be $G_1=4$ mS while for the other $T_m/2$ may be $G_2=-4$ mS. The EPDs eigenfrequencies are real-valued here, and the dispersion diagram looks the same as the dispersion diagram of the lossless system. To validate the dispersion diagram, the determinant of the transition matrix may be calculated as:

$$\det(\underline{\Phi}) = e^{-\left(G_1 \frac{Tm}{2} + G_2 \frac{Tm}{2}\right)/(2C_0)}. \tag{31}$$

Figure 8D:
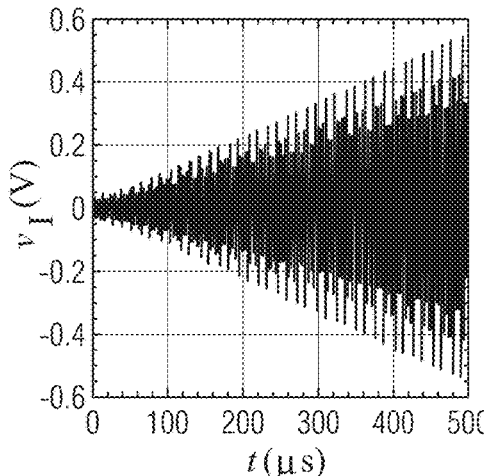

Thus, for zero time-average conductance $\det(\Phi)=1$, which leads to $\lambda e=\pm 1$, which result in real-valued EPD frequency fe. FIG. 8D illustrates the time-domain signal obtained from Keysight ADS that indicates the second-order EPD behavior at an EPD associated to $fm=56.2$ kHz, which exhibits a linear growth of the capacitor's voltage.

b. Time-Varying Conductance: Positive Average $Avg(G)>0$

The real and imaginary parts of the eigenfrequencies for positive time average conductance $(Avg(G)>0)$ are illustrated in FIG. 8E-8F. The system's parameters are, $G_1=4$ mS and $G_2=-2$ mS, hence the loss may be dominant in the system. The EPDs are complex frequencies with a positive imaginary part, which may be associated with a damping signal in the circuit, as exhibited in FIG. 8G, where modulation frequency may be $f_m=56.2$ kHz.

c. Time-Varying Conductance: Negative Average $Avg(G)<0$

FIGS. 8H-8I illustrate the real and imaginary parts of the eigenfrequencies for negative time average conductance $(Avg(G)<0)$. The conductances are $G_1=2$ mS and $G_2=-4$ mS, hence the gain may be dominant in the system. The EPDs frequencies have a negative imaginary part corresponding to an exponential rise of the signal making the system unstable, as illustrated in FIG. 8J, where modulation frequency may be $f_m=56.2$ kHz.

Three different circuit configurations supporting an EPD of order two are considered: gyrator-based, PT-symmetry based, and linear time-varying systems. All the configurations exhibit ultra-sensitive responses to perturbations, though their operational regimes differ. Each design has some advantages compared to the others. For example, in a gyrator-based circuit, the system has purely real perturbed eigenfrequencies when perturbing one component (e.g., a capacitor), while negative capacitance and inductance are needed to realize such a circuit, which require active components. Small losses or gains in this circuit cause instability. Though some examples may seem to be complication at first sight and may require working in the transient regime before reaching saturation, instability offers the possibility to work in the unstable oscillatory regime. An EPD may also be present in two coupled resonators with balanced gain and loss, e.g., satisfying PT symmetry. The presence of gain requires active circuits. A component may be varied in a normal sensing scheme (e.g., a capacitor), and the perturbed resonant frequency may be detected. However, the sensing scheme proposed in the PT-symmetry regime required tuning the capacitance on the non-sensing part of the circuit to keep the circuit under PT-symmetry while the sensing component may be varied. This was done to keep the two shifted frequencies real-valued and avoid instabilities. (However, in a sensing scheme, the value of the varied component is usually the one to be measured, hence the value of the varied component is not known a priori). This complication is not needed in the circuit using the gyrator, and the complication is also not needed in the circuit based on the single LTV resonator.

Compared to the conventional PT-symmetric circuit where people observed shifted resonance frequencies, here instead, an oscillatory regime that may be worked in to generate the instability and the nonlinear behavior of the circuit is illustrated. In other words, the instability due to broken PT-symmetry (due to a perturbation) may be turned to a system's advantage. The oscillation frequency after reaching saturation is very sensitive to perturbations. Still, the oscillation frequency may illustrate the square-root-like dependency with respect to perturbations and the possibility to measure both signs of an element perturbation (this is not possible with the other schemes in the linear regime discussed in this paper). This nonlinear oscillator scheme may also be robust in terms of bringing the system near the EPD, independent of the amount of (nonlinear) small gain used.

Finally, EPDs are found in linear time-varying single resonator circuits where a time-varying capacitor may be connected to an inductor. There is no need for gain and lossy elements, though the time modulation requires active components. The effect of additional loss and gain has been discussed for this circuit. It may be illustrated that time-varying gain or loss connected to a stationary LC tank is another method that leads to EPDs. The simple tuning procedure is one important advantage of the LTV circuit compared to gyrator-based and PT-symmetric circuits. In PT-symmetric and gyrator-based circuits, a tuning process is needed to exhibit an EPD, e.g., variable capacitors, gain, or resistors are deemed necessary. But in the LTV circuit, the EPD may be found by simply changing the modulation frequency, which may be done easily in electronics.

In another embodiment, a scheme for generating oscillations based on exceptional points of degeneracy (EPD) is proposed in two finite-length coupled transmission lines terminated on balanced gain and loss. EPD may be a point in the parameter space of the system at which two or more eigenmodes coalesce in both their eigenvalues (e.g., here, resonance frequencies) and eigenvectors. In an example embodiment, it may be illustrated that a finite-length single transmission line terminated with gain and loss possesses no degeneracy point, whereas second order EPDs may be enabled in two finite-length coupled transmission lines (CTLs) terminated with balanced gain and loss. In an example embodiment, it may be demonstrated that the conditions for EPDs to exist in CTLs for three different termination configurations with balanced gain and loss and it may be illustrated that the eigenfrequency bifurcation at the EPD following the fractional power expansion series may be related to the Puiseux series. The oscillator behavior may be studied with a nonlinear gain element. The extreme sensitivity of the self-oscillation frequencies to perturbations and how it compares with the sensitivity of the linear case may also be studied. In an example embodiment, a possible use may be a very sensitive sensor of small variations in the system.

Oscillators may be used to generate radio frequency, microwave and optical signals. Oscillators may use a gain device through a positive feedback mechanism and a frequency selective circuit to generate a single frequency output. Conventional oscillators such as Van der Pol and voltage-controlled oscillators may be among the most utilized oscillators at radio frequencies (RF) due to their simplicity of design and ease of fabrication. The conventional oscillators may be based on an LC-tank circuit and may use a negative conductance for positive feedback obtained by simple circuit structures such as a cross-coupled pair. A negative conductance may also be obtained from other circuit topologies such as Pierce, Colpitts, and Gunn diode waveguide oscillators. Oscillators based on LC-tank circuits have some drawbacks. For example, load conditions may largely affect the oscillators based on LC-tank circuits performance, which may necessitate buffer stages to mitigate the issue and terminate the signal to a generally low output impedance (e.g., 50 ohms). Normally, the buffers may be power hungry. Additionally, the buffers may lower the power efficiency of the system, which may be undesirable for low-power applications.

Figure 9:
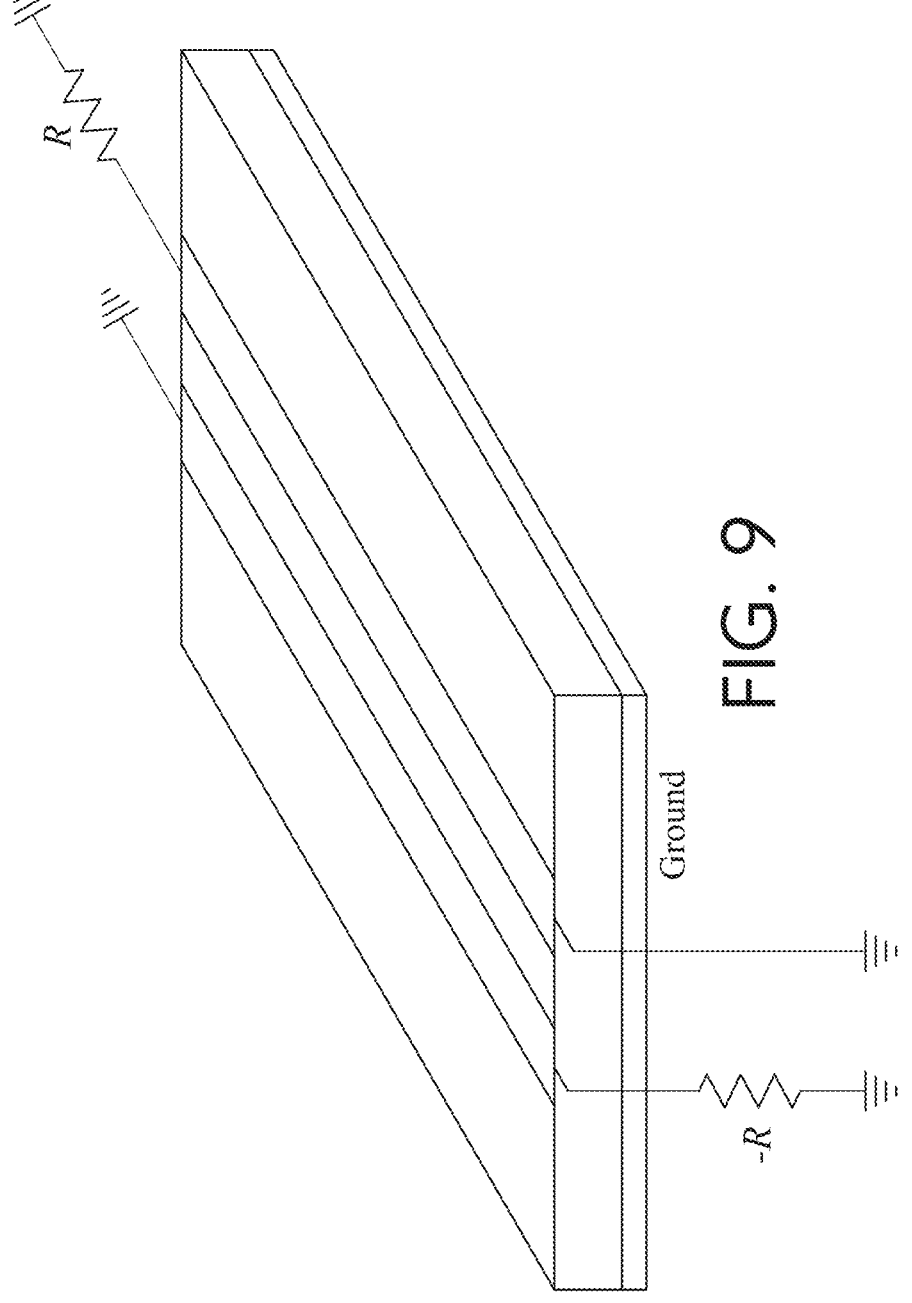
FIG. 9 is a diagram illustrating two parallel coupled microstrip lines on a grounded dielectric substrate with terminations on a ground plane.

FIG. 9 is a diagram illustrating two parallel coupled microstrip lines on a grounded dielectric substrate with terminations on a ground plane. Oscillators may be used in many Radio Frequency (RF) and microwave systems. Accordingly, finding a better performing oscillator structure may be useful. Design principles which involve distributed, coupled, and multi-mode oscillator structures have been studied in literature. This paper focuses on an oscillator concept based on an exceptional point of degeneracy (EPD) in two coupled transmission lines (CTLs) FIG. 9 terminated on balanced gain and loss. As we will illustrate, it has the particular feature that the resonance frequency is highly sensitive to a system's perturbation. The concept described here featuring an EPD can be potentially implemented in highly efficient oscillating arrays of antennas and highly sensitive sensor applications.

In an example, an EPD may be a point in the parameter space of a system at which the system's eigenvectors, besides the eigenvalues, coalesce. The phenomenon of degeneracy of both eigenvalues and eigenvectors may be a stronger degeneracy condition compared to the traditional degeneracy that often refers to only the degeneracy of two resonance frequencies but does not necessarily imply the coalescence of the eigenvectors. EPDs have been commonly associated with the presence of gain and/or loss and often related to parity-time (PT)-symmetric systems where EPDs occur in the parameter space of the system described by the evolution of their eigenmodes either in time or space. The concept of EPDs has been applied to systems made of coupled resonator, and in systems of coupled modes in waveguides.

EPDs have been often found in systems with space or time periodicity (in the absence of gain and loss) supporting Floquet-Bloch waves such as photonic crystals and space periodic waveguides and time-periodic resonators.

Examples include a system made of two distributed resonators, e.g., made of two coupled waveguides terminated on balanced gain and loss elements, therefore, the EPD may be found in the eigenfrequency domain, and not in the wavenumber domain. In the following, at first, we discuss the oscillation condition for a "single pole" finite-length transmission lines (TL) oscillator terminated on a gain and loss balance condition. Then, we investigate two CTLs terminated with balanced gain and loss, and we illustrate the existence of EPDs in such structures under different gain and loss configurations. Moreover, we characterize the performance of CTLs oscillators operating at an EPD and illustrate the transient behavior and their frequency response. We discuss the location of the "poles" or "zeros" of the system and how they are sensitive to perturbations. Finally, we illustrate the large resonance frequency shift due to system's perturbations and discuss how such shift is predicted by the Puiseux fractional power expansion related to the Puiseux series. Such large frequency shift is also observed from time-domain simulation results obtained by Keysight ADS circuit simulator using non-linear gain representing active semiconductor components based on CMOS transistors or operational amplifiers. The proposed circuit and method can be used in ultrahigh-sensitive sensing applications. The concepts explained here can be generalized to higher operating frequencies.

Single Tl Oscillator

Figure 10A:
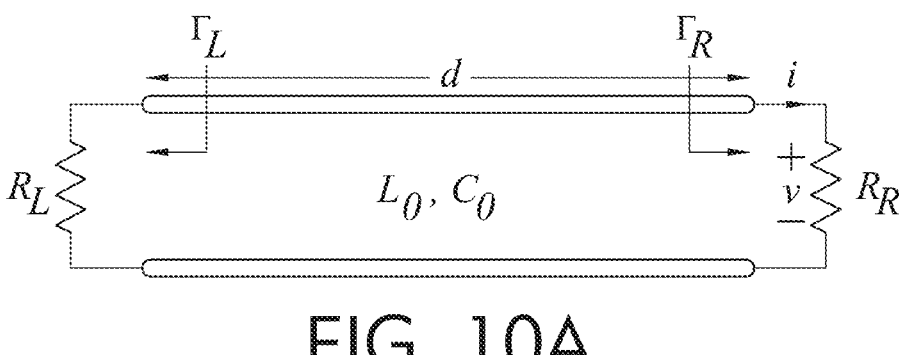
FIGS. 10A-10C are diagrams illustrating: Single finite-length TL terminated with RL and RR at its left and right ports, respectively, Real and imaginary part of the resonance frequency for different harmonics, calculated using EQ. (33), below, the complex resonance frequencies are calculated with the parameters of the structure set as L0=480 nH, C0=57.9 pF, d=40.1 mm, RR=50Ω and varying RL.
Figure 10B:
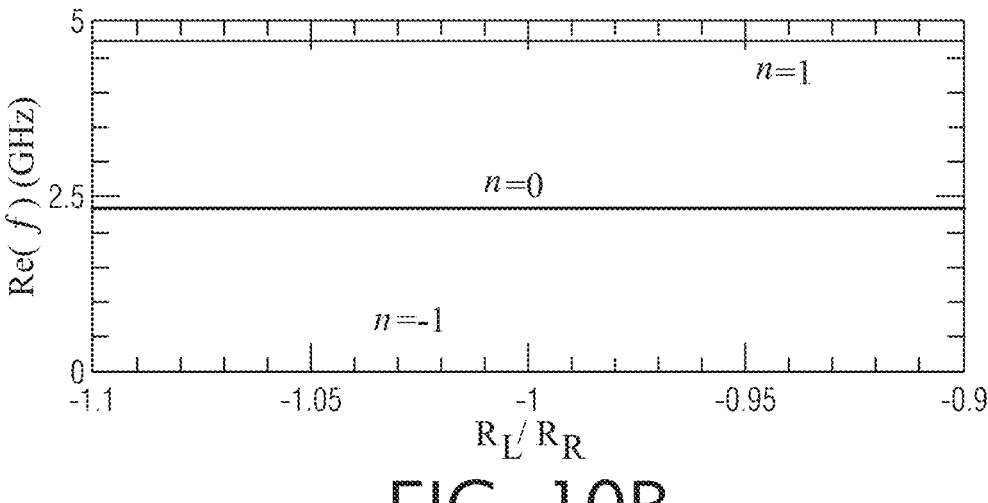
Figure 10C:
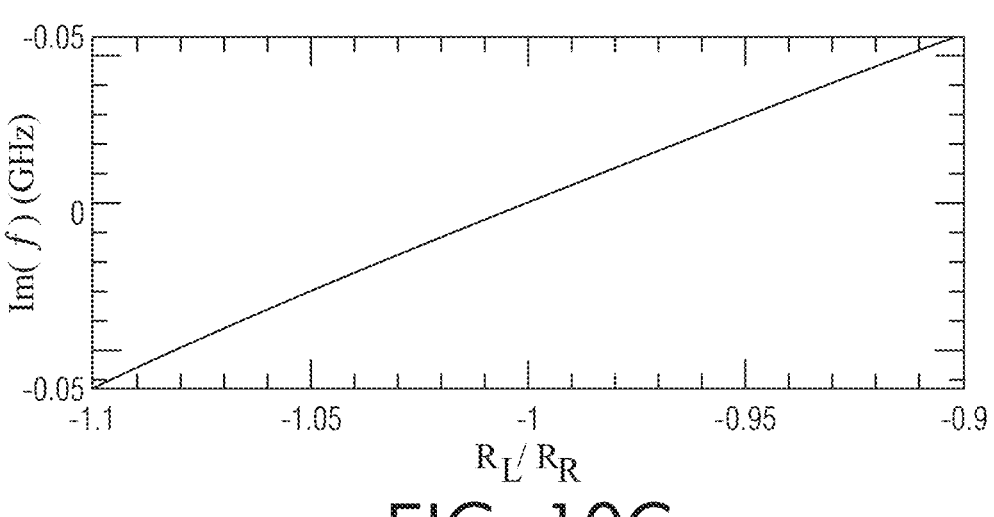

FIGS. 10A-10B are diagrams illustrating: (a) Single finite-length TL terminated with RL and RR at its left and right ports, respectively, (b) Real and imaginary part of the resonance frequency for different harmonics, calculated using EQ. (33), below, the complex resonance frequencies are calculated with the parameters of the structure set as L0=480 nH, C0=57.9 pF, d=40.1 mm, RR=50Ω and varying RL.

In an example embodiment, we consider a single finite-length TL terminated with a gain element (e.g., negative resistance) at one end and with a resistive load at the other end as illustrated in FIG. 10A where $Z_0 = \sqrt{L0/C0}$ may be the characteristic impedance of the TL and d may be the TL's length. The resonance condition is:

$$1 - \Gamma_L \Gamma_R e^{-j2\beta d} = 0, \tag{32}$$

where $\beta = \omega \sqrt{L0C0}$ is the propagation constant, $\dot{\Gamma}_R = (R_L - Z_0) = (R_L + Z_0)$ and $-R = (RR\square Z0) = (R_R + Z_0)$ are the reflection coefficients at the left and right ports, respectively ($R_L$ may be assumed negative), and we implicitly adopt the exp(jωt) time convention. The complex-valued resonance frequency of such a structure is derived from EQ. (32) as:

$$f_n = \frac{1}{4\pi d \sqrt{L_0 C_0}} (\angle\Gamma_L + \angle\Gamma_R + 2n\pi - j \ln|\Gamma_L\Gamma_R|). \tag{33}$$

In general, for arbitrary values of RE and RR, the resonance frequency of such a structure may be complex with a positive imaginary part when $|\Gamma_L\Gamma_R| < 1$, corresponding to decaying voltage and current, it has a negative imaginary part for $|\Gamma_L\ddot{\Gamma}_R| > 1$ corresponding to growing voltage and current in a lossless transmission line. In other words, for a nonzero imaginary part of the resonance frequency, an initial energy in the system will fully dissipate or will grow indefinitely. However, assuming $|\Gamma_L\Gamma_R|=1$, the resonance frequency is purely real and such a condition corresponds to $R_L+R_R=0$. Under this condition, we have a single TL where its left and right ports are terminated with balanced gain and loss loads, e.g., the two loads have the same magnitude with opposite signs (in other words, the resonator satisfies PT-symmetry). Therefore, since $|\Gamma_L\Gamma_R|=1$, the structure has purely real resonance frequencies regardless of balanced gain and loss values. One may note that there exists no coalescence of the modes in such a single TL with balanced gain and loss, thus, we do not observe any exceptional point. FIG. 10B illustrates the three lowest resonance frequencies of the single TL terminated with gain $R_1$ and loss $R_R$ for different values of $R_L=R_R$. The parameters are set as $L_0$=480 nH, $C_0$=579 pF, d=40.15 mm, and $R_R$=49.88. This plot illustrates that the single TL has a purely real oscillation frequency when gain and loss are balanced. In summary, this system supports independent resonance modes and cannot achieve exceptional degeneracy of modes required for the occurrence of exceptional points.

Coupled TLs Oscillator

Figure 11:
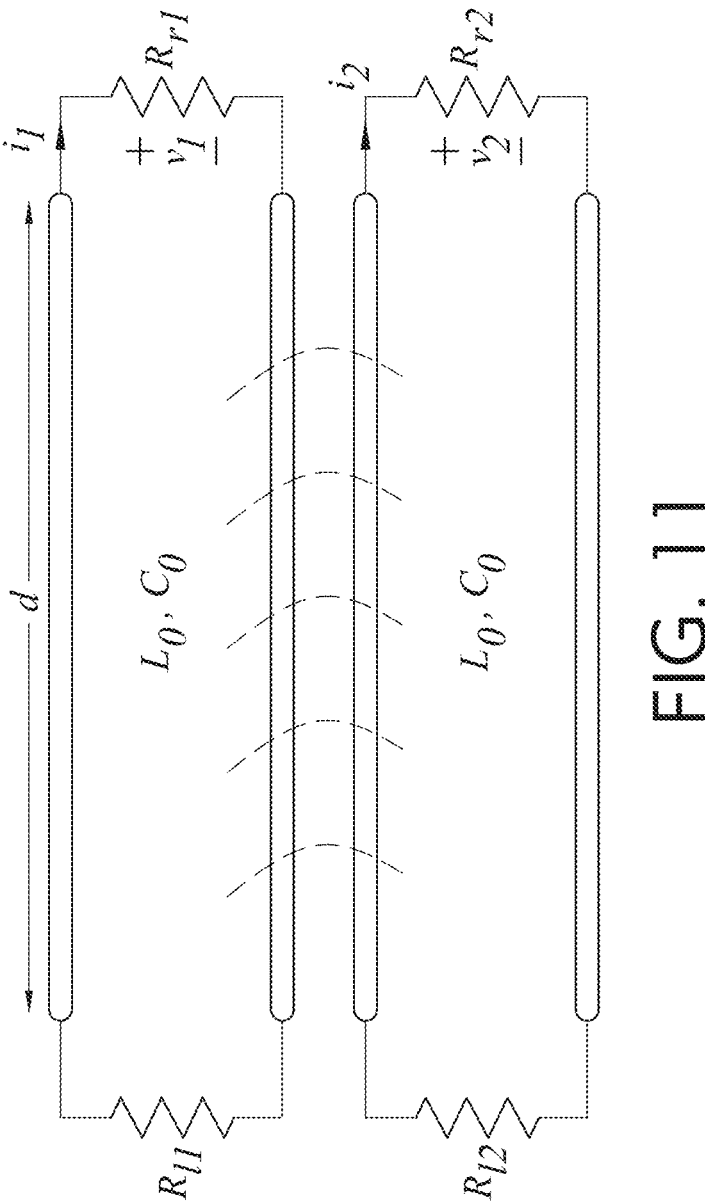
FIG. 11 is a diagram illustrating two finite-length coupled transmission lines (CTLs) with terminations, wherein the CTLs may be both electrically and magnetically coupled, and an example circuit may be a model of the one in FIGS. 10A-10B.

FIG. 11 is a diagram illustrating two finite-length coupled transmission lines (CTLs) with terminations, wherein the CTLs may be both electrically and magnetically coupled, and an example circuit may be a model of the one in FIGS. 10A-10B.

In an example embodiment, two coupled, lossless, and identical TLs with finite length are illustrated in FIG. 11, terminated with resistive loads $R_{l1}$ and $R_{l2}$ at their left ports, and resistive loads $R_{r1}$ and $R_{r2}$ at their right ports. The distributed (per-unit-length) inductance and capacitance of the lines when they are isolated are $L_0$ and $C_0$, hence, the per unit length inductance and capacitance matrices of the coupled lines reads as:

$$\underline{L} = \begin{bmatrix} L_0 & L_m \\ L_m & L_0 \end{bmatrix}, \tag{34}$$

$$\underline{C} = \begin{bmatrix} C_0 + C_m & -C_m \\ -C_m & C_0 + C_m \end{bmatrix},$$

when the coupling between the lines is modeled by introducing a mutual per unit length inductance and capacitance $L_m$ and $C_m$. Such a structure supports four different propagating modes with propagation constants.

In an example embodiment, free oscillation in such a structure occurs when there is a non-trivial solution of (38), therefore, oscillation frequencies may be calculated as the roots of the vanishing determinant of A as:

$$\pm k_e \text{ and } \pm k_o \tag{35}$$

where (see Appendix $A$ for derivation)

$$k_e = \omega/u_e,$$

$$k_o = \omega/u_o,$$

and $$u_e = 1/\sqrt{(L_0 + L_m)C_0}$$

and $$u_o = 1/\sqrt{(L_0 - L_m)(C_0 + 2C_m)} \text{ are}$$

the phase velocities of the even and odd modes.

Using the even and odd mode wavenumbers of the modes in the infinitely long CTL given in (35), we write the state vector $$\Psi = \begin{bmatrix} \tilde{V_1}, & \tilde{V_2}, & I_1, & I_2 \end{bmatrix}^T$$

that describes the voltages and currents at any point z as the summation of four modes $$\Psi(z) = \Psi_e^+ e^{-jk_e z} + \Psi_e^- e^{jk_e z} + \Psi_o^+ e^{-jk_o z} + \Psi_o^- e^{jk_o z}, \tag{36}$$

where the corresponding eigenvectors are $$\Psi_e^+ = V_e^+ [1 \quad 1 \quad Y_e \quad Y_e]^T, \tag{37}$$

$$\Psi_e^- = V_e^- [1 \quad 1 \quad -Y_e \quad -Y_e]^T,$$

$$\Psi_o^+ = V_o^+ [1 \quad -1 \quad Y_o \quad -Y_o]^T,$$

$$\Psi_o^- = V_o^- [1 \quad -1 \quad -Y_o \quad Y_o]^T.$$

Here, $Y_e=u_eC_0$ and $Y_o=u_o(C_0+2C_m)$ represent the characteristic admittances of the even and odd modes, respectively. Using the state vector in EQ. (36), in order to derive the resonance frequencies for the two finite-length CTLs illustrated in FIG. 3 we enforce the boundary conditions at the four ports of the structure. We obtain a homogeneous system of four linear equations as:

$$\underline{A}(\omega)V = 0, \tag{38}$$

where $$V = [V_e^+, \quad V_e^-, \quad V_o^+, \quad V_o^-]^T \text{ represents the voltage amplitude vector,}$$

and $$\tag{39}$$

$$\underline{A}(\omega) = \begin{bmatrix} 1 + Y_eR_{l1} & 1 - Y_eR_{l1} & 1 + Y_oR_{l1} & 1 - Y_oR_{l1} \\ 1 + Y_eR_{l2} & 1 - Y_eR_{l2} & -1 - Y_oR_{l2} & -1 + Y_oR_{l2} \\ (1 - Y_eR_{r1})e^{-j\omega d/ue} & (1 + Y_eR_{r1})e^{-j\omega d/ue} & (1 - Y_oR_{r1})e^{-j\omega d/uo} & (1 + Y_oR_{r1})e^{-j\omega d/uo} \\ (1 - Y_eR_{r2})e^{-j\omega d/ue} & (1 + Y_eR_{r2})e^{-j\omega d/ue} & -(1 - Y_oR_{r2})e^{-j\omega d/uo} & -(1 - Y_oR_{r2})e^{-j\omega d/uo} \end{bmatrix}.$$

$$\det(\underline{A}(\omega)) = 0. \tag{40}$$

27

At each resonance frequency $\omega_i$, with i=1, 2, derived from Eq. (40) (we only illustrate frequencies with positive real part here), we find the vector kernel $V_i$ i=1, 2 of the matrix $\underline{A}(\omega_i)$ using the Gaussian elimination method. In other words, vectors $V_1$ and $V_2$ are the voltage amplitude vectors at the resonance frequencies $\omega_1$ and $\omega_2$, respectively. Various choices could be made to measure the coalescence of the voltage amplitude vectors at the resonance frequencies, and here the Hermitian angle between the voltage amplitude vectors $V_1$ and $V_2$ is adopted and defined as:

$$\cos \theta = \frac{|\langle V_1, V_2 \rangle|}{\|V_1\|\|V_2\|}.$$

The $\cos \theta$ is defined via the inner product $$\langle v_1, v_2 \rangle = v_1^\dagger v_2,$$

where the dagger symbol † denotes the complex conjugate transpose operation, | | represents the absolute value and $\|V\|=\sqrt{\langle V, V \rangle}$ represents the norm of a complex vector. According to this definition, when sin $\theta$=0 the voltage amplitude vectors $V_1$ and $V_2$ coalesce, corresponding also to the coalescence of the two resonance frequencies $\omega_1$ and $\omega_2$.

FIGS. 12A-12F are diagrams illustrating three distinct cases of two coupled TLs termination and complex dispersion diagram of the resonance frequencies. (a) Case I, illustrating the two coupled TLs where upper TL is terminated with gain −R and load R, and lower TL is shorted at both ports. (b) Plots of real and imaginary part of resonance frequencies varying R for Case I depicted in (a). (c) Case II, two coupled TLs where upper TL is terminated with gain −R at the left port and it is shorted at the right port, and lower TL is shorted at the left port, and it is terminated with load R at its right port. (d) Plots of real and imaginary part of the resonance frequencies varying gain/load value R for Case II illustrated in (c). (e) Case III, two coupled TLs where upper TL is terminated with gain −R at the left port and it is shorted at the right port, lower TL is terminated with load R at the left port and it is shorted at its right port. (f) Plots of real and imaginary part of the resonance frequencies varying gain/load value R for Case III illustrated in (e).

In an example embodiment, we are interested in CTLs terminated on symmetrically balanced gain and loss, hence, in the following we consider three different values of R, −R, and 0 as loads in such a structure. Note that, different arrangement of these three load values at four distinct ports of the structure results in twelve sets of boundary conditions. However, since the structure is symmetric with respect to its ports, these twelve arrangements of loads shrink to only three distinct ones, illustrated in FIGS. 12A, 12C, and 12E. In the following, we analyze each particular structure separately and find the resonance frequency in two CTLs with balanced gain and loss varying the gain/loss value R in the absence of voltage generators. Moreover, we illustrate the existence of EPD resonances, where resonance frequencies coalesce as well as the corresponding voltage vectors $V_i$ and $V_2$.

In the following examples, the CTL is made of two TLs with parameters $L_0$=480 nH, C0=579 pF, d=40.15 mm, they are same as those we used for the single TL, but we now consider the coupling inductance $L_m$=367.4 nH and capacitance $C_m$=102.7 pF between the two TLs. As illustrated later on, a gain-resistance value of R=49.88 will lead to an EPD of order two. It will be understood that other parameters may be used.

A. Case I: $R_{l1}$=−R, $R_{l2}$=0, $R_{r1}$=R, $R_{r2}$=0

Figure 12A:
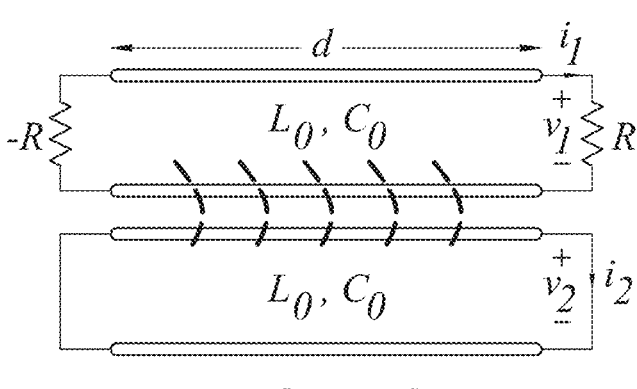
FIGS. 12A-12F are diagrams illustrating three distinct cases of two coupled TLs termination and complex dispersion diagram of the resonance frequencies. Case I, illustrating the two coupled TLs where upper TL is terminated with gain −R and load R, and lower TL is shorted at both ports. Plots of real and imaginary part of resonance frequencies varying R for Case I depicted in (a). Case II, two coupled TLs where upper TL is terminated with gain −R at the left port and it is shorted at the right port, and lower TL is shorted at the left port, and it is terminated with load R at its right port. Plots of real and imaginary part of the resonance frequencies varying gain/load value R for Case II illustrated in (c). Case III, two coupled TLs where upper TL is terminated with gain −R at the left port and it is shorted at the right port, lower TL is terminated with load R at the left port and it is shorted at its right port. Plots of real and imaginary part of the resonance frequencies varying gain/load value R for Case III illustrated in (e).

In this scenario, illustrated in FIG. 12A, we assume that the upper CTL is loaded with −R at the left port and a positive R at the right port, while the lower CTL is short circuited at both ports. The boundary conditions which describe this scenario are given in Appendix B and the system's eigenfrequencies are calculated from solving:

$$\det(\underline{A}(\omega)) = \cos(\omega d / u_e) \cos(\omega d / u_o) + H_1 \sin(\omega d / u_e) \sin(\omega d / u_o) - 1 = 0, \tag{41}$$

where $$H_1 = \frac{4 - R^2 (Y_e^2 + Y_o^2)}{2R^2 Y_e Y_o}. \tag{42}$$

Figure 12B:
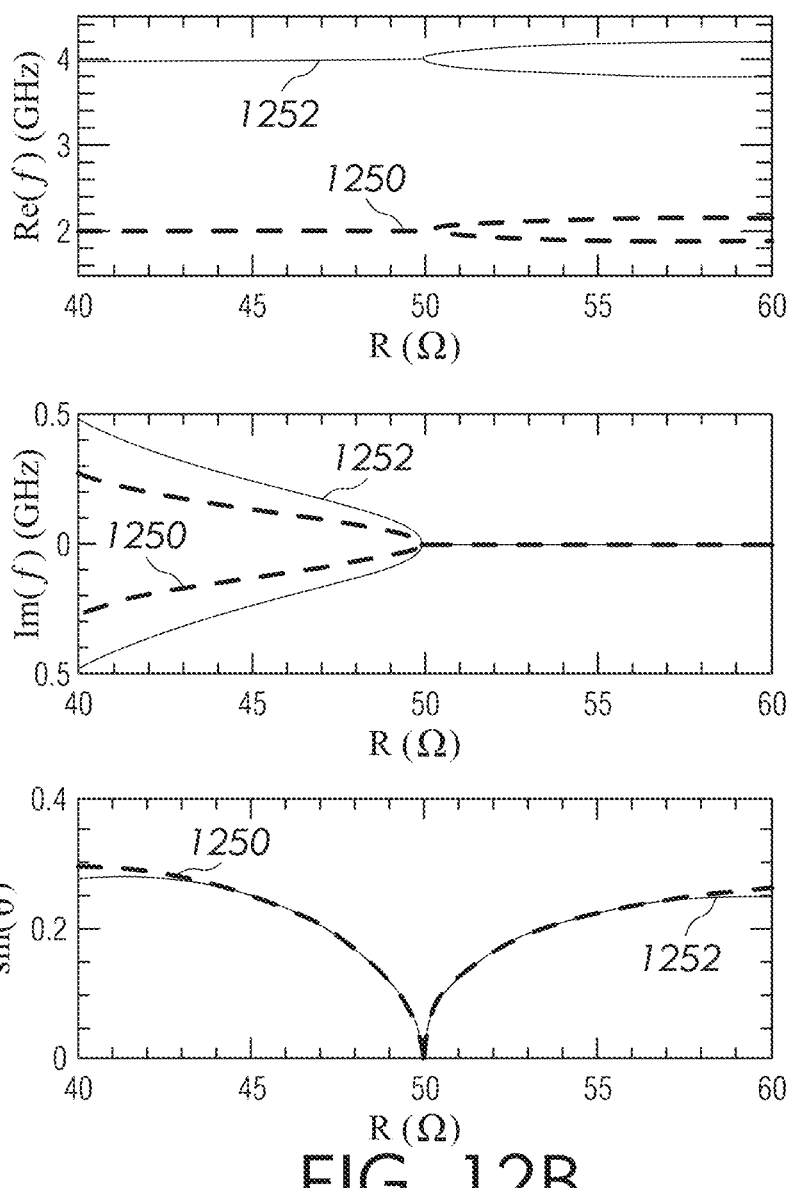

The real and imaginary parts of the resonance frequencies (eigenfrequencies) are depicted in FIG. 12B for different values of balanced gain and loss R. Curve 1250 represents the two fundamental resonances, and Curve 1252 illustrates the next two higher resonances.

It can be seen from these plots that the real and imaginary parts of the two resonance frequencies coalesce for a specific balanced gain/loss value R. In this scenario, the coalescence of the resonance frequencies for both the lower (1250) and the higher (1252) resonances occur at the same balanced gain/loss value. Furthermore, the voltage amplitude vector V is calculated for each of the two resonance frequencies (e.g., each eigenmode) using EQ. (38) and the bottom plot exhibits the coalescence angle between two vectors when varying R. The angle between the two voltage vectors vanishes where the resonance frequencies are identical which also indicates the coalescence of the polarization states, hence of the two modes and the occurrence of an EPD.

B. Case II: $R_{l1}$=−R, $R_{l2}$=0, $R_{r1}$=0, $R_{r2}$=R

Figure 12C:
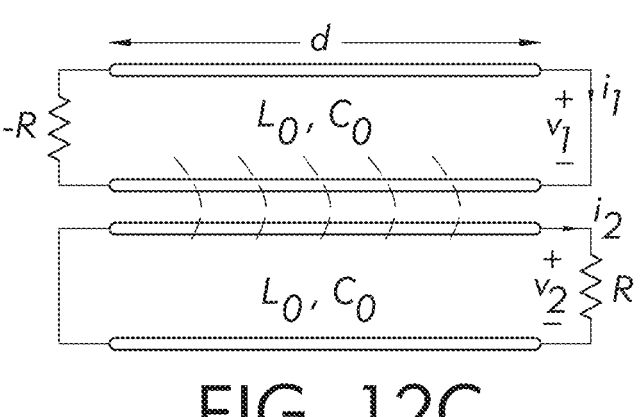
Figure 12D:
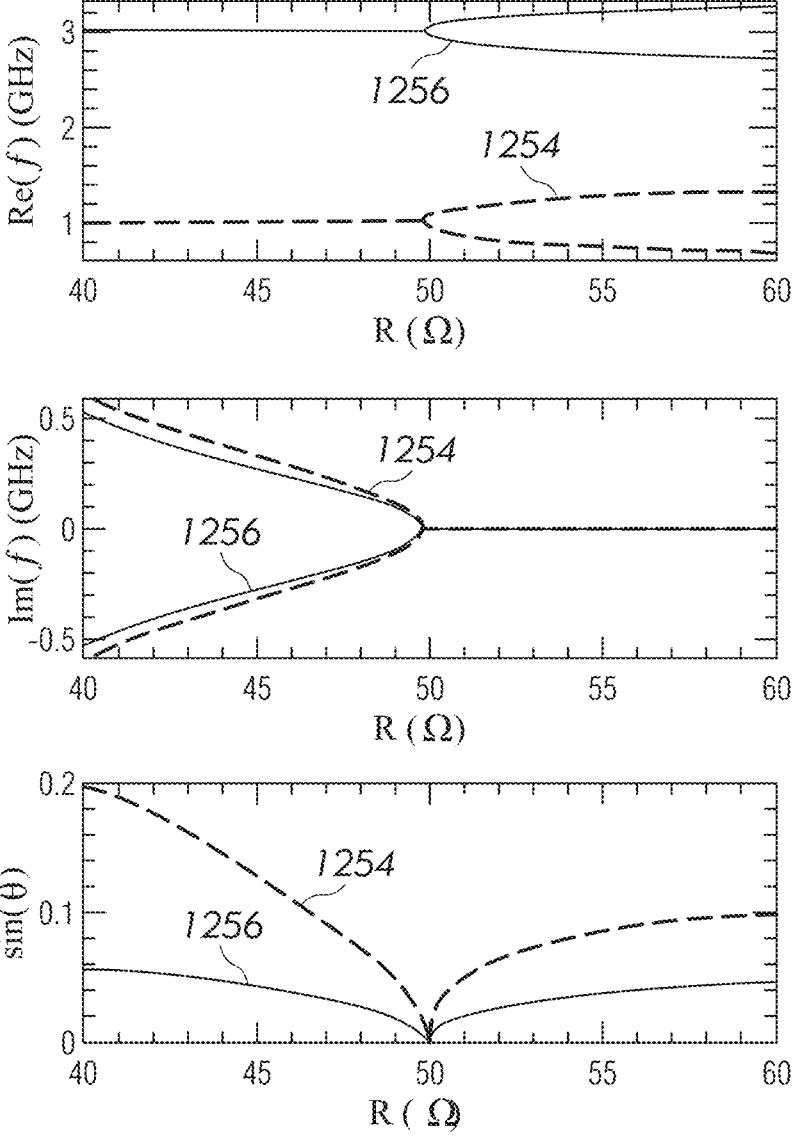

In the second scenario illustrated in FIG. 12C, the upper CTL is connected to −R at the left port and shorted at the other port, and the lower CTL is shorted at the left port and terminated with load R at the right one. Thus, enforcing the boundary conditions, the determinant in EQ. (40) is derived from:

$$\det(\underline{A}(\omega)) = \cos(\omega d / u_e) \cos(\omega d / u_o) + H_1 \sin(\omega d / u_e) \sin(\omega d / u_o) + 1 = 0, \tag{43}$$

and the coefficient $H_1$ is given EQ. (42). Similar to Case I, real and imaginary parts of the resonance frequencies (eigenfrequencies) of the structure are calculated and plotted in FIG. 12D when varying R. Curves 1254 and curves 1256 represent the lowest and the next higher pairs of resonance frequencies, respectively. Assuming the same CTLs lengths as in the previous Case I, the fundamental resonance frequencies happen around twice the resonance frequencies of Case I.

Moreover, the coalescence of the two resonances for both lowest and next higher pairs of frequencies, occurs at the same balanced gain/loss value, this is observed also by the vanishing angle between the two coalescing voltage vectors when varying R, conforming the occurrence of the EPDs.

C. Case III: $R_{l1}=-R$, $R_{l2}=R$, $R_{r1}=0$, $R_{r2}=0$

Figure 12E:
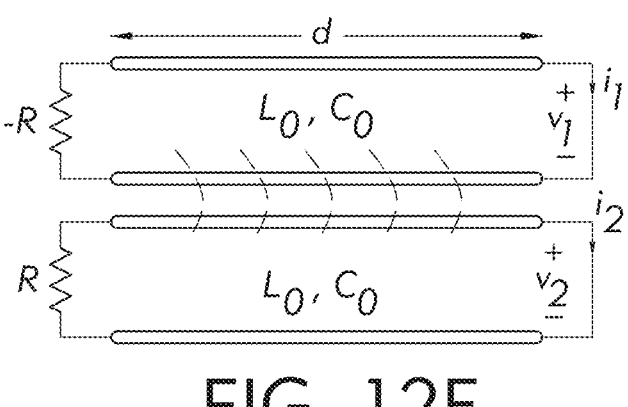
Figure 12F:
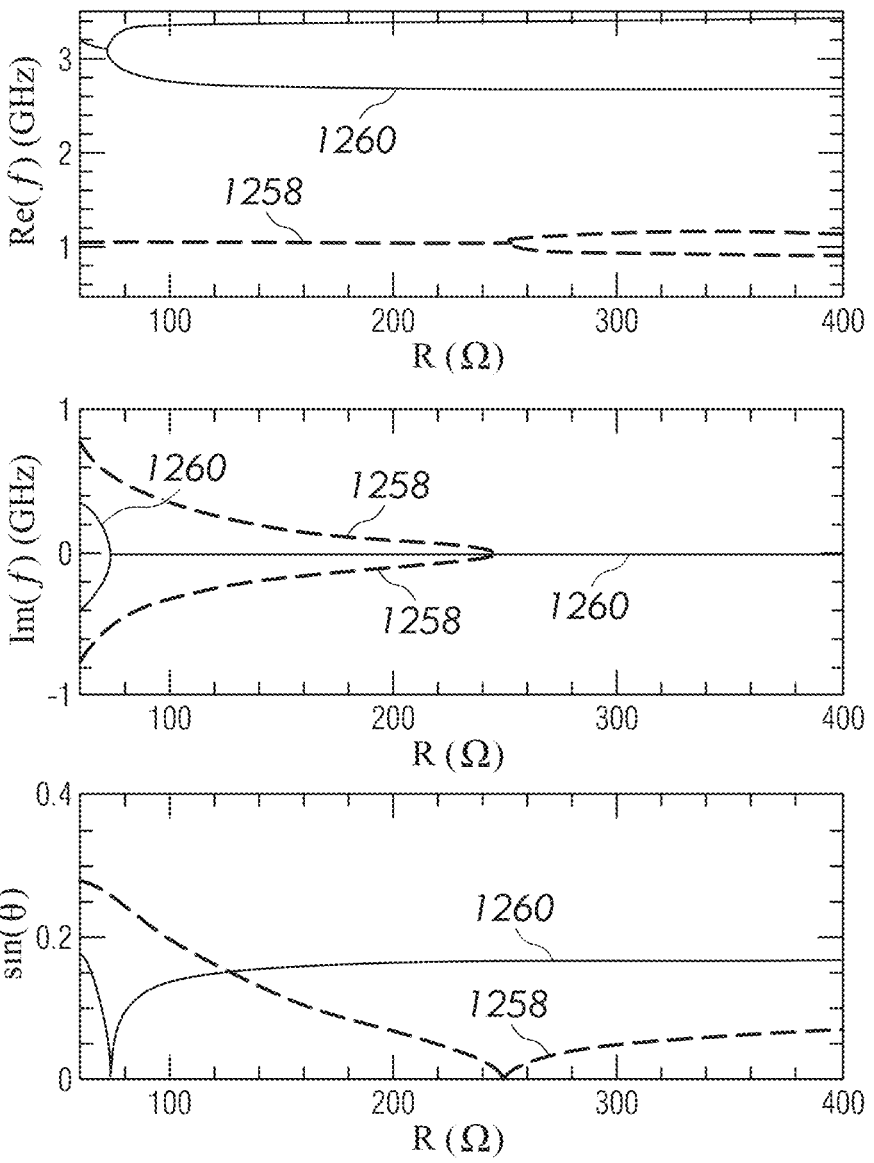

In the third scenario illustrated in FIG. 12E, the upper CTL is terminated with $-R$ at the left port and its right port is shorted. Moreover, the lower CTL is terminated with R at its left port and it is shorted at the right port. With this combination of terminations, the system's eigenfrequencies are found by satisfying:

$$\det(\underline{A}(\omega)) = \cos(\omega d/u_e)\cos(\omega d/u_o) + \frac{1}{R^2 Y_e Y_o}\sin(\omega d/u_e)\sin(\omega d/u_o) = 0. \tag{44}$$

The roots of the determinant represent the resonance frequencies of the system. The real and imaginary parts of the resonance frequencies (eigenfrequencies) are plotted in FIG. 12F for different values of the gain/loss value R. The real and imaginary parts of the pair of fundamental (lowest) and next higher resonance frequencies coalescence for different gain/loss values. Curves 1260 illustrate the pair of higher resonance frequencies, coalescence for a smaller value of gain/loss balance compared to the coalescence of the pair of fundamental frequencies (curves 1258). Moreover, in this case the vanishing of the angle between the voltage vectors when varying R, demonstrates the coalescence of the pairs of voltage vectors, demonstrating the occurrence of the EPDs.

CTLS Oscillator Characteristics

In an example embodiment, some features of an oscillator based on the CTLs of Case II, namely, the transient time-domain behavior, frequency spectrum, and sensitivity to perturbations. The oscillator is studied using a cubic model (nonlinear) of the active component providing gain. The CTL parameters used here are the same as those used in the previous section. A value R=49.88 leads to an EPD of order two at a frequency of 1 GHz.

A. Transient Behavior and Frequency Spectrum

Figure 13A:
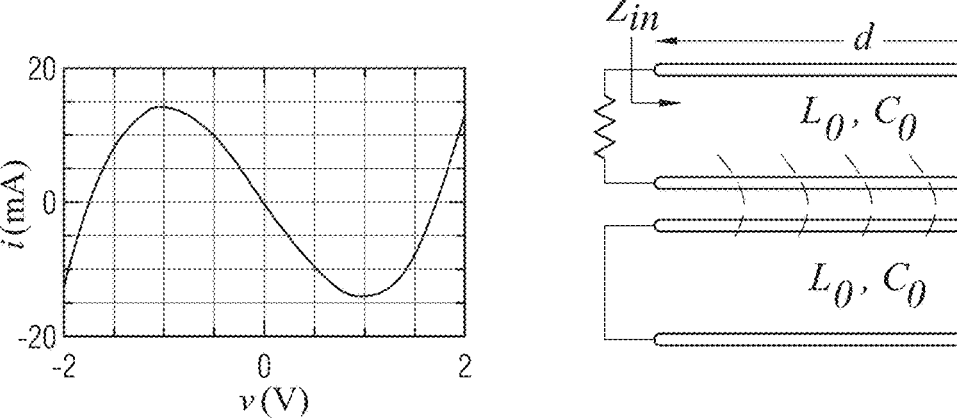
FIGS. 13A-13B are diagrams illustrating the cubic model used to model a realistic gain element where its i–v curve is illustrated in the inset. Parameters of the cubic model are set as gain gm=20.1 mS, α=6.7 mS and saturation voltage. Vb=1V. Time-domain simulation result of the PT-symmetric oscillator illustrated in and the frequency spectrum of the load voltage as the inset.
Figure 13B:
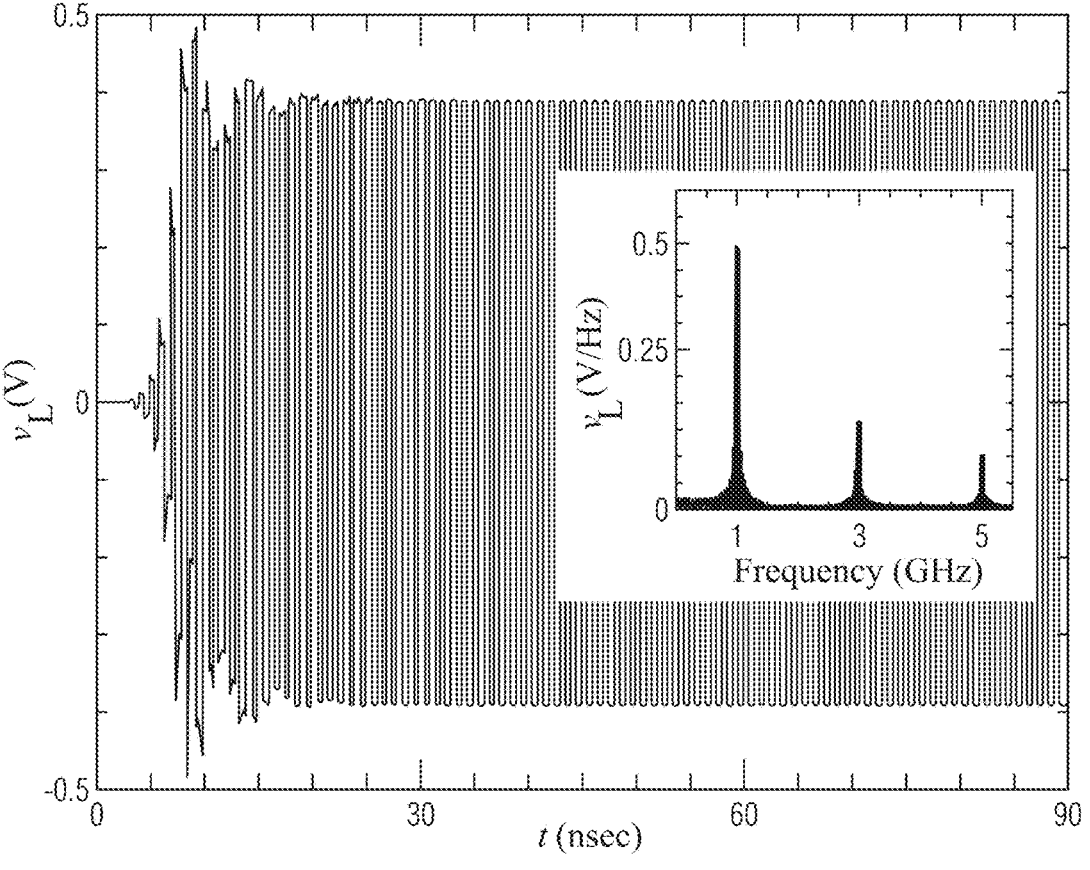

FIGS. 13A-13B are diagrams illustrating (a) The cubic model used to model a realistic gain element where its i–v curve is illustrated in the inset. Parameters of the cubic model are set as gain gm=20.1 mS, $\alpha$=6.7 mS and saturation voltage. Vb=1V. (b) Time-domain simulation result of the PT-symmetric oscillator illustrated in (a) and the frequency spectrum of the load voltage as the inset.

The time-domain (TD) response of the proposed CTLs oscillator as well as its frequency spectrum are depicted in FIGS. 13A-13B where the structure is terminated with balanced gain and loss satisfying the resonance condition in EQ. (43). The TD simulation result is obtained using the TD method implemented in the circuit simulator of Keysight ADS. The gain element is realized using a cubic model with an i–v curve described as:

$$i = -g_m v + \alpha v^3, \tag{45}$$

illustrated in FIG. 13A, where $-g_m$ is the negative slope of the i–v curve in the active resistance region and $\alpha$ is the third-order nonlinearity constant that models the saturation characteristic of the device. To realize a constant DC voltage-biased active device, we choose the turning point Vb of the i–v characteristics to be constant (when varying gm) and equal to $V_b$=1V under different biasing levels. The value of the saturation characteristic determines the steady-state oscillation amplitude and in particular, we set $\alpha = g_m/(3V_b^2)$.

Moreover, for simplicity we assume that the parasitic capacitance associated with the negative resistance device is negligible.

In an example embodiment, in the illustrated TD results, the resistor is chosen to be R=49.88, the $g_m$ has been increased by 0.1% from its EPD gain-loss balanced value (in other words, the PT-symmetry is slightly perturbed), hence $g_m$=1.001=R, in order to make the system unstable, hence, to start and reach a stable oscillation. We use a voltage pulse at the right port of the first transmission line as the initial condition to start oscillations (alternatively, the simulation may have assumed the presence of noise to start oscillations). The frequency spectrum of the voltage at the load location is illustrated as an inset in FIG. 13B, and it illustrates the fundamental frequency and harmonics of the oscillating voltage. The harmonics of the fundamental frequency are generated by the nonlinear nature of the gain element. An important observation is that the oscillation frequency mainly coincides with the fundamental EPD frequency of 1 GHz.

B. Double Pole Behavior and High Sensitivity to Perturbations

Figure 14B:
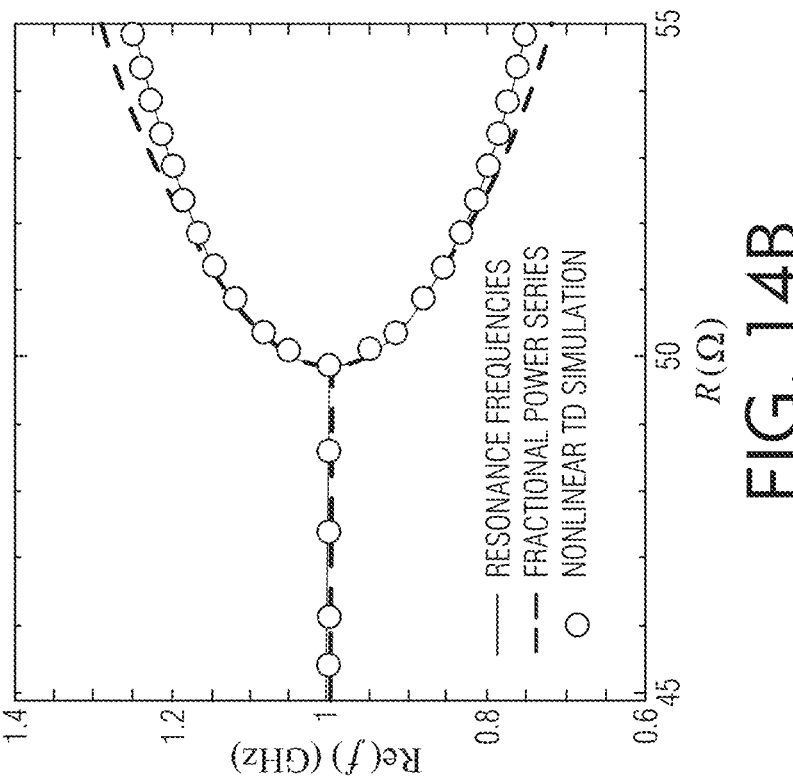
FIGS. 14A-14B are diagrams illustrating Root locus of two frequency zeros of Zin(2πf)−R illustrating the fundamental pairs of resonance frequencies of the CTLs in Case II, varying both the linear negative and positive values of R. Resonance frequencies obtained from solving EQ. (40) (line 1450), and from the first-order fractional power expansion series expansion (dashed line 1452), when varying both the linear gain and resistance R: Results accounting for the nonlinear cubic model of the gain elements (14) using the time-domain circuit simulator by ADS Keysight are illustrated by dots, where gm=1.001=R has been increased by 0.1% from its loss balanced value.
Figure 14A:
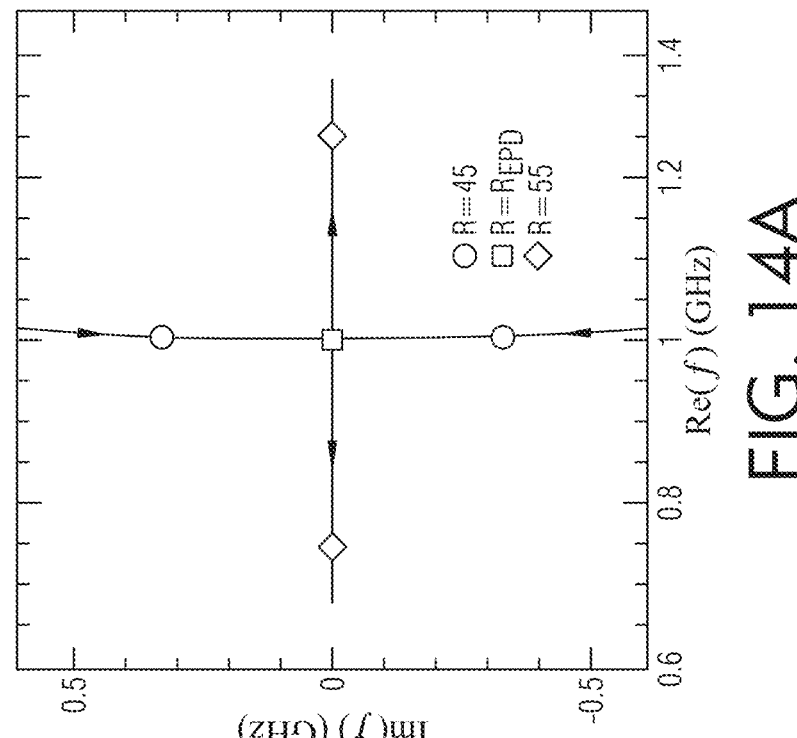

FIGS. 14A-14B are diagrams illustrating (a) Root locus of two frequency zeros of $Zin(2\pi f)$–R illustrating the fundamental pairs of resonance frequencies of the CTLs in Case II, varying both the linear negative and positive values of R. (b) Resonance frequencies obtained from solving EQ. (40) (line 1450), and from the first-order fractional power expansion series expansion (dashed line 1452), when varying both the linear gain and resistance R: Results accounting for the nonlinear cubic model of the gain elements (14) using the time-domain circuit simulator by ADS Keysight are illustrated by dots, where gm=1.001=R has been increased by 0.1% from its loss balanced value.

The resonance frequencies of the system can be also obtained by using the impedance resonance method, and we illustrate here the relation with EPD and the occurrence of double solutions (double zeros). With reference to the Case II structure in FIG. 14A, the resonance condition imposed by the vanishing of the total series impedance implies that $$Z_{in}(\omega) - R = \frac{\det[\underline{A}(\omega)]}{P(\omega)} = 0, \tag{46}$$

where $P(\omega)$ is $$P(\omega) = \tag{47}$$
$$R(Y_0^2 + Y_e^2)\sin\left(\frac{\omega d}{u_e}\right)\sin\left(\frac{\omega d}{u_0}\right) - 2RY_e Y_o\left(1 + \cos\left(\frac{\omega d}{u_e}\right)\cos\left(\frac{\omega d}{u_0}\right)\right) -$$
$$2j\left(Y_e\cos\left(\frac{\omega d}{u_e}\right)\sin\left(\frac{\omega d}{u_0}\right) + Y_o\cos\left(\frac{\omega d}{u_0}\right)\sin\left(\frac{\omega d}{u_e}\right)\right),$$

and $-R$ is the gain element, assumed linear in this subsection. Here, $Z_{in}(\omega)$ is the input impedance of the CTLs seen from the upper left port when a load resistor R is connected to the bottom right port, illustrated in FIG. 13A. The input impedance is obtained using the transfer matrix $\underline{T}=\exp(-j\omega\underline{M}d)$ of a CTL of length d, where is the waveguide system matrix $\underline{M}$ is defined in Appendix A, and assuming the upper CTL is shorted at the right port and the lower CTL is shorted at the left port, as discussed in Appendix B. The series total impedance $Z_{in}(\omega)$–R has the same $\omega$-zeros as det $[\underline{A}(\omega)]$. Note that $\omega(R)$ and $-\omega^*(R)$ are both solutions of EQ. (46). In FIG. 14A, we plot the zeros with Re(ω)>0 of $Z_{in}(\omega)-R$ for varying R, in the complex frequency plane (there are other zeros, but we plot only those relative to the fundamental pair of frequencies). The trajectory of the resonance frequencies ω for the two modes with Re(ω)>0 are plotted with increasing resistance R from 40 to 60. The double zero at $\omega_{EPD}$ occurs at REPD=49.88, where the two curves meet. Therefore, in the proximity of the EPD frequency when R=$R_{EPD}$=49.88, one has $Z_{in}(\omega)-R/(\omega-\omega_{EPD})^2$. For resistances such that R>$R_{EPD}$, the two resonance frequencies are purely real, despite the presence of balanced losses and gain. Instead, for R<REPD, the two resonance frequencies are complex conjugate.

Oscillation Frequency Highly Sensitive to Perturbations

In systems operating at EPDs some quantities (like eigenvalues and eigenvectors) are extremely sensitive to perturbation of system parameters. In particular, a small perturbation ΔX of a system parameter X results in a tremendous change in the state of the system. By applying a perturbation ΔX as $$\Delta_X = \frac{X - X_{EPD}}{X_{EPD}}, \tag{48}$$

where X is the perturbed component's value, and XEPD is the unperturbed value that provides the EPD condition, the matrix A(ΔX) is perturbed. In this CTLs structure with balanced gain and loss, the two degenerate resonance frequencies (they are the eigenvalues) change due to a small perturbation ΔX, resulting in two distinct resonance frequencies, following the behavior predicted by the fractional power expansion series. The two perturbed angular eigenfrequencies $\omega_i$ (ΔX), with i=1, 2, are estimated by using the fractional power expansion series around a second-order EPD given by:

$$\omega_i(\Delta_X) \simeq \omega_{EPD} + (-1)^i \alpha_1 \sqrt{\Delta_X} + \alpha_2 \Delta_X. \tag{49}$$

Following the steps in Appendix C and we calculate the coefficients as $$\alpha_1 = \sqrt{-\frac{\dfrac{\partial H(\Delta_X, \omega)}{\partial \Delta_X}}{\dfrac{1}{2!}\dfrac{\partial^2 H(\Delta_X, \omega)}{\partial \omega^2}}}, \tag{50}$$

$$\alpha_2 = -\frac{\alpha_1^3 \dfrac{1}{3!}\dfrac{\partial^3 H(\Delta_X, \omega)}{\partial \omega^3} + \alpha_1 \dfrac{\partial^2 H(\Delta_X, \omega)}{\partial \omega \partial \Delta_X}}{\alpha_1 \dfrac{\partial^2 H(\Delta_X, \omega)}{\partial \omega^2}}, \tag{51}$$

where H(ΔX, ω)=det [$\underline{A}$(ΔX, A)] and its derivatives are evaluated at the EPD, e.g., at ΔX=0 and ω=$\omega_{EPD}$. This fractional power expansion provides a good approximation of the perturbed eigenfrequencies as demonstrated in the following.

We consider the CTLs in Case II illustrated in FIG. 12C, with an EPD resonance when R=REPD, and we assume the same parameter values given in Sec. III B We apply a small perturbation in both gain and resistance as R=$R_{EPD}$(1+ΔR). The calculated coefficient $\alpha_1$=5.56×10⁹ rad/s is purely real and FIG. 14B illustrates the separation between the two resonance frequencies varying the perturbation ΔR.

The result in FIG. 14B demonstrates that for a small perturbation −0.1<ΔR<0.1 of both the positive and negative resistive terminations, the resonance frequency f is significantly changed. The square root behavior illustrates the exceptional sensitivity of the proposed system operating at an EPD, which can be used to conceive a new class of very sensitive sensors. For positive values ΔR, the structure illustrates two real resonance frequencies. FIG. 14B exhibits also the structure's sensitivity due to the fractional power expansion series limited to its first order, displayed by a dashed line. Moreover, the dots illustrate results using the nonlinear cubic model for gain: the frequencies are calculated from the Fourier transform of the time-domain circuit simulator implemented in Keysight ADS after reaching saturation, using the nonlinear cubic model for the gain in EQ. (45) where gm=1.001=R, e.g., has been increased by 0:1% from its loss balanced value. We use a voltage pulse at the right port of the first transmission line as the initial condition to start oscillations. For both resistance-gain perturbations with R>REPD, the circuit oscillates at two distinct resonance frequencies (green dots). This latter result demonstrates the ultra-sensitive frequency of oscillation (green dots) of the oscillator when used in a sensor scheme. The fast Fourier transform is calculated from 500 MHz to 1:5 GHz using 106 signal samples in the time window from 200 ns to 1 μs.

A. Sensitivity to Variations of the Load Resistance R Only

Figure 15B:
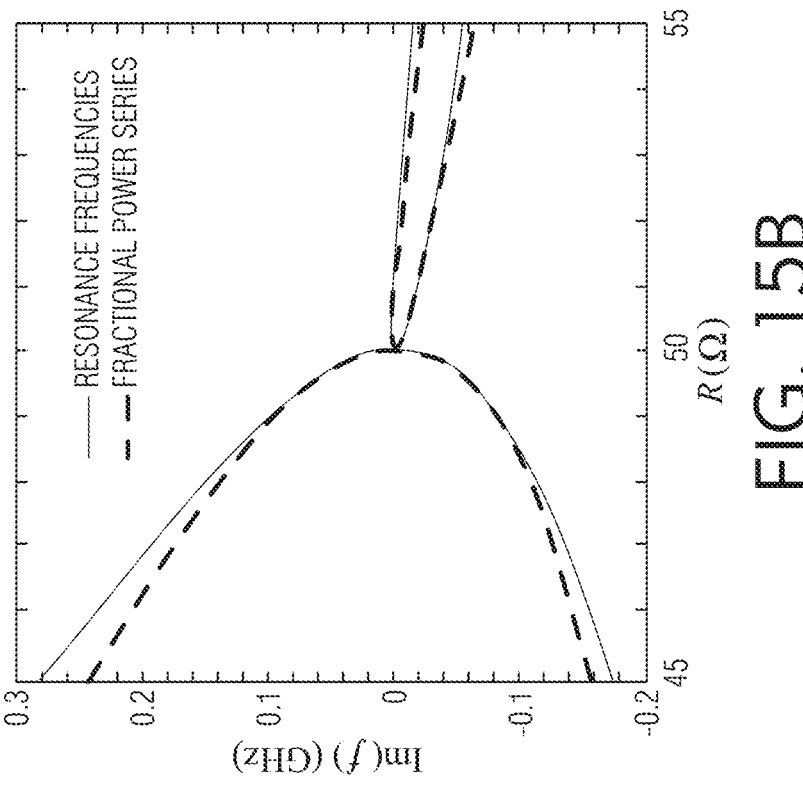
FIGS. 15A-15B are diagrams illustrating Real part and imaginary part of the eigenfrequencies, when varying only the load resistance and the gain is $-R_{EPD}$. The solid line represents the resonance frequencies obtained by solving (9). The dashed line represents the eigenfrequencies estimated using the fractional power expansion series up to the second order. The dots represent the frequencies obtained by applying the Fourier transform to the TD results using the nonlinear cubic model of the gain elements Eq. (45) where $g_m$=1.001/R.
Figure 15A:
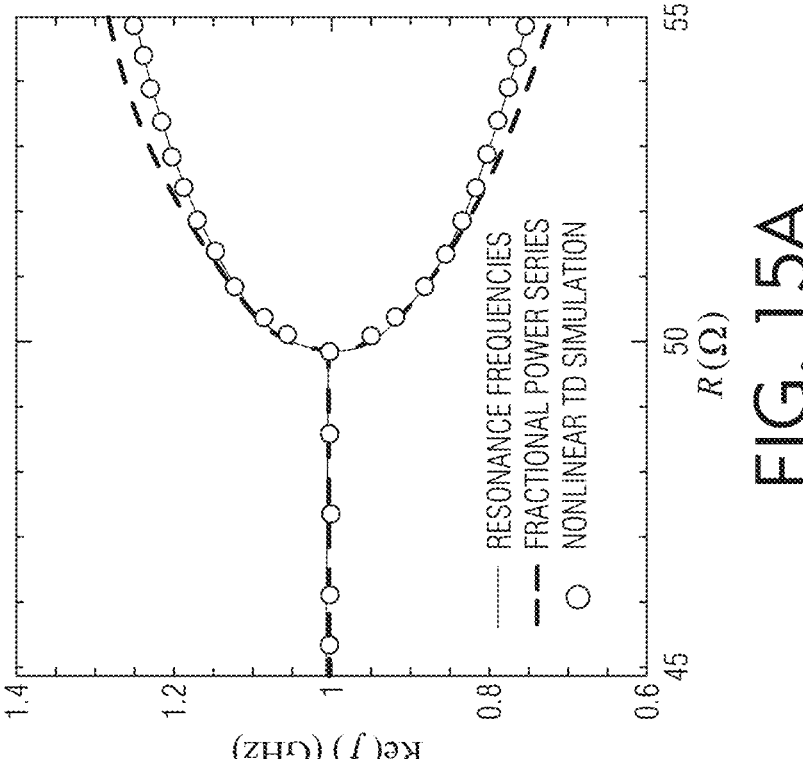

FIGS. 15A-15B are diagrams illustrating (a) Real part and (b) imaginary part of the eigenfrequencies, when varying only the load resistance and the gain is −$R_{EPD}$. The solid line represents the resonance frequencies obtained by solving (9). The dashed line represents the eigenfrequencies estimated using the fractional power expansion series up to the second order. The dots represent the frequencies obtained by applying the Fourier transform to the TD results using the nonlinear cubic model of the gain elements Eq. (45) where $g_m$=1.001/R.

This section discusses how sensitive the circuit is to the perturbation of only the passive resistance (e.g., the one on the lossy side). This perturbation could be the one happening in a sensor based on resistivity changes. By breaking PT-symmetry and perturbing just the lossy side resistance as R=$R_{EPD}$(1+ΔR) from its EPD value REPD, while the (linear) gain component is kept fixed to −$R_{EPD}$, the circuit illustrates a large shift of the resonance frequencies as illustrated in FIG. 15A. This perturbation brings the system away from the PT-symmetry condition and the system becomes unstable demonstrated by the fact that shifted frequencies have an imaginary part with a negative sign, for either sign of ÅR as illustrated in FIG. 15B. The solid-red line illustrates the resonance frequency evaluation by solving (9), the dashed line represents the two eigenfrequencies estimated by the fractional power expansion series truncated to its second order. The coefficients in Eq. (50) and (51) are calculated as $\alpha_1$=3.95×10⁹+j3.91×10⁸ rad/s and $\alpha_2$=−9.40× 10⁷−j2.61×10⁹ rad/s, they are complex, which means that for all values of small loss resistance changes, the two eigenfrequencies are complex valued and the system is unstable, for either ΔR<0, (e.g., R<REPD) or ΔR>0 (e.g., R>$R_{EPD}$). For ΔR>0, the bifurcation of Re(ω) is more significant than for ΔR<0, thus, the circuit is more sensitive to positive changes of ΔR, corresponding to a larger value of Re(ω) than Im(ω). To have approximately the same frequency shift for either positive or negative relative perturbations ΔR, one should design an EPD where the real and imaginary parts of $\alpha_1$ are approximately equal. Moreover, the dots illustrate the frequencies calculated when using the nonlinear gain in EQ. (45), where gm has been increased by 0.1% than the EPD value, hence gm=1.001/$R_{EPD}$. The result is obtained by applying the Fourier transform to the TD signal after reaching saturation evaluated using the circuit simulator implemented in Keysight ADS, using the same initial condition as in the last section. For different loss resistance perturbations, the circuit oscillates at two resonance frequencies, illustrated as dots. This latter result demonstrates the high sensitivity of the frequencies of oscillation (green dots) when used in a sensor scheme. This configuration where the loss resistance is changing is useful for sensors like a moister detector, strain gauge, thermistor, etc. The frequency domain spectrum is calculated from 500 MHz to 1.5 GHz using 106 signal samples in the time window from 200 ns to 1 µs.

B. Sensitivity to the Per-Unit-Length Capacitance $C_0$

Figure 16A:
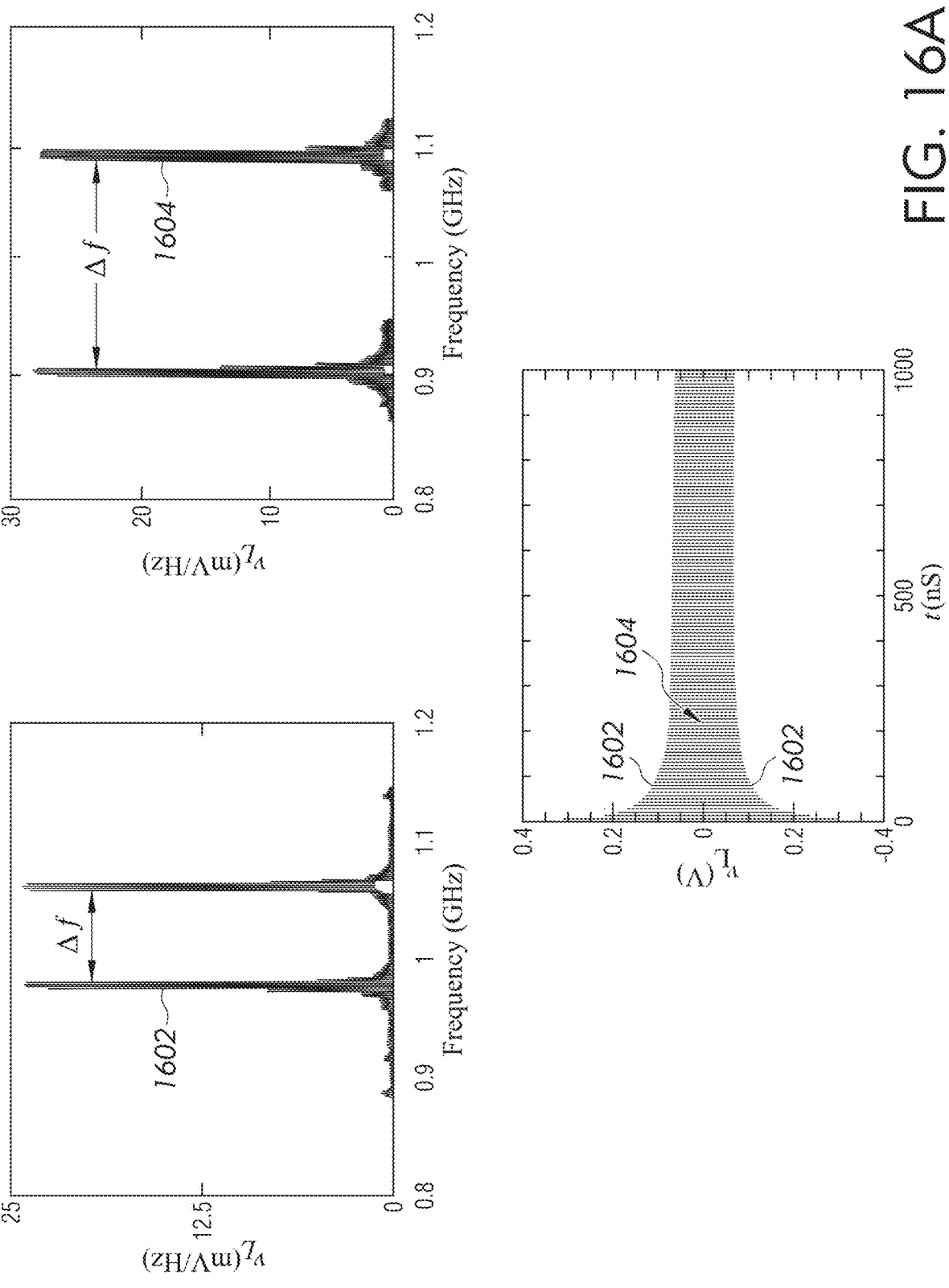
FIGS. 16A-16B are diagrams illustrating Time-domain simulation result using the nonlinear cubic model of the gain elements (14) where $g_m$=1.001=$R_{EPD}$ of the perturbed circuit with per-unit-length capacitance perturbation of $\Delta C_0$=−1% (line 1602) and $\Delta C_0$=−5% (line 1604), The inset illustrates the frequency spectrum of the load voltage. where the two frequencies of oscillations are apparent. Separation between the two resonance frequencies varying $\Delta C_0$ illustrates the high sensitivity to the perturbation.
Figure 16B:
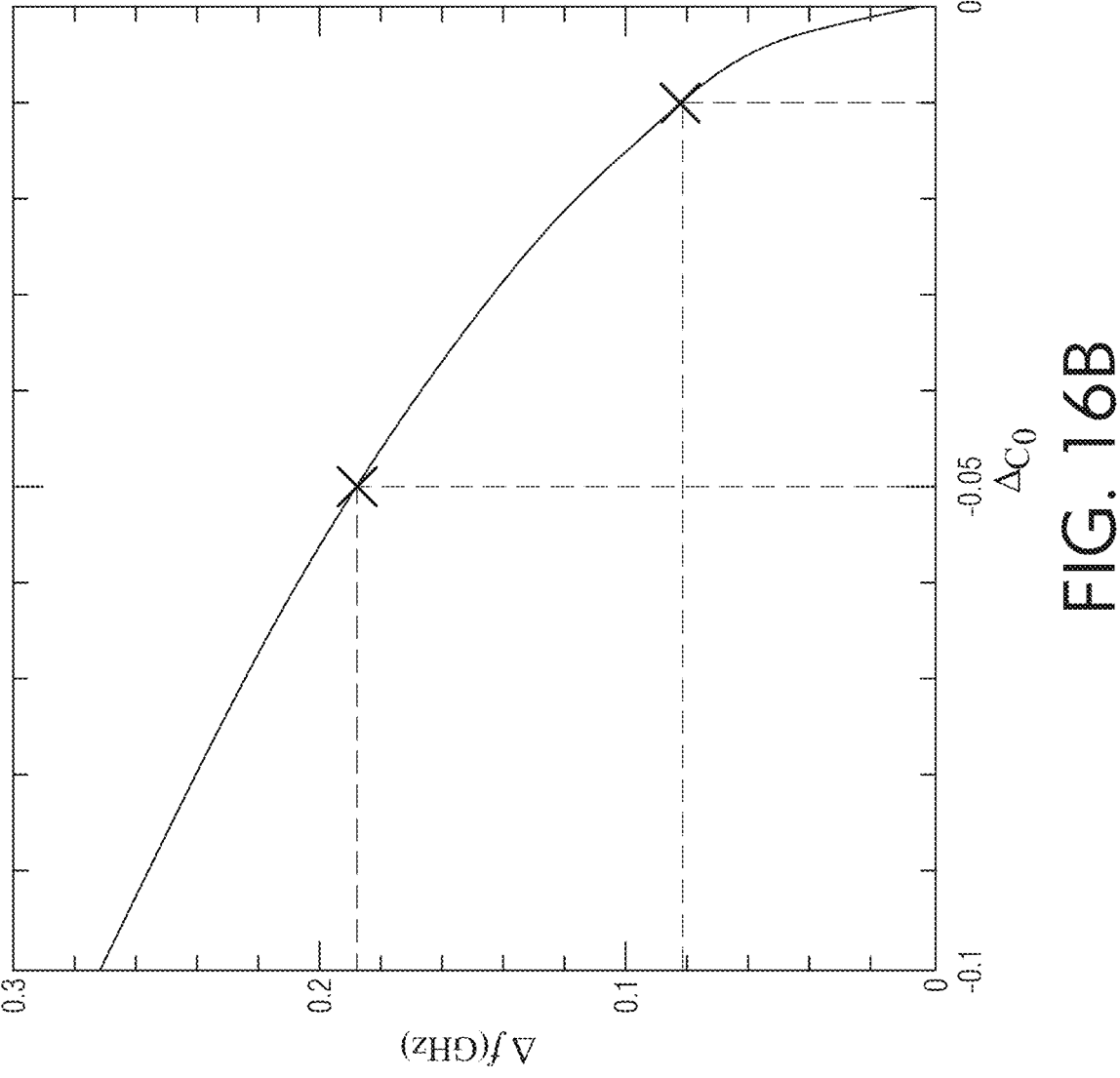

FIGS. 16A-16B are diagrams illustrating (a) Time-domain simulation result using the nonlinear cubic model of the gain elements (14) where $g_m$=1.001=$R_{EPD}$ of the perturbed circuit with per-unit-length capacitance perturbation of $\Delta C_0$=−1% (line 1602) and $\Delta C_0$=−5% (line 1604), The inset illustrates the frequency spectrum of the load voltage. where the two frequencies of oscillations are apparent. (b) Separation between the two resonance frequencies varying $\Delta C_0$ illustrates the high sensitivity to the perturbation.

The oscillator scheme described in this paper can be used as a distributed capacitance sensor, e.g., for sensing perturbations of the per-unit-length capacitance $C_0$ of both the CTLs as illustrated in FIGS. 16A-16B. In this setup, the system is very sensitive to a change in permittivity in the materials (above or below) surrounding the CTLs. Assuming that the perturbation $\Delta C_0$ is applied to the per unit length self-capacitance of the CTLs $C_0$ the perturbed C is expressed as C=(1+$\Delta C_0$)$C_0$. The active gain element is assumed to be the nonlinear cubic model in EQ. (45), where $g_m$=1.001=$R_{EPD}$ has been increased by 0.1% from its EPD gain-loss balanced value 1/$R_{EPD}$. Using a voltage pulse at the right port of the first transmission line as the initial condition the circuit starts to oscillate.

FIG. 16A illustrates the TD simulation result using Keysight ADS by using the cubic model for the gain in EQ. (45) of the perturbed circuit with $\Delta C_0$=−5% (1604) and $\Delta C_0$=−1% (1602). By perturbing $C_0$ the circuit oscillates at two resonance frequencies as seen in the frequency spectrum of the load voltage in the in-set, calculated from 500 MHz to 1.5 GHz using 106 signal samples in the time window of 200 ns to 1 µs. The two oscillation frequencies shift further away from each other when more perturbation is applied to $C_0$. The difference between the two frequencies $\Delta f$ is illustrated in FIG. 16B for negative values of $\Delta C_0$ from the TD simulation, and the square root-like behavior illustrates the high sensitivity to perturbations of $C_0$. For instance, when $C_0$ is perturbed by −1% from its EPD value, the CTL illustrates the two real resonance frequencies at 959 MHz and 1:04 GHz, associated to a _f=$f_{EPD}$=8.3%. Also, when $C_0$ is perturbed by −5% from its EPD value, the CTL illustrates the two real resonance frequencies at 906 MHz and 1.09 GHz, associated to a $\Delta f/f_{EPD}$=19%. In conclusion, when a small perturbation in the per-unit-length capacitance, the oscillation frequencies shift dramatically so the proposed circuit has a promising use as a scheme for high-sensitive sensors.

In an example embodiment, we have illustrated the existence of EPDs in a pair of finite-length CTLs resonators, terminated with balanced gain and loss satisfying different configurations of PT-symmetry. We have illustrated the high sensitivity of the eigenfrequencies to perturbations of the system under different gain and loss conditions. Furthermore, we outline the characteristics of the system as CTLs oscillator when the nonlinear gain is present, in terms of time-domain results and frequency spectrum. In addition, we analyzed three different scenarios to perturb the system. First, perturbing both gain and loss together (PT-symmetry is slightly broken by putting gain 0.1% higher than the Appendix A: Propagating Modes of CTLs Using the per-unit-length inductance $\underline{L}$ and capacitance $\underline{C}$ matrices, the telegrapher's equations for the coupled TLs are given by:

$$\frac{d}{dz}\psi = -j\underline{M}\psi, \tag{A1}$$

where $\psi(z)$=[$V_1$, $V_2$, $I_1$, $I_2$]$^T$ is the state vector of the system representing voltages and currents along the two CTLs, and the system matrix $\underline{M}$ is obtained as:

$$\underline{M} = \begin{bmatrix} \underline{0} & \omega\underline{L} \\ \omega\underline{C} & \underline{0} \end{bmatrix}. \tag{A2}$$

Let us assume a time and space convention of the state vector as $\psi(z) \propto e^{-jz}$, where $\omega$ is the angular frequency, and k is the wave number of a mode in the CTLs. Hence, four different propagating modes of the CTLs system are obtained by finding the roots (either in k or $\omega$) of the characteristic equation of the system described in (A1) as $$\det(\underline{M} - k\underline{I}) = k^4 - \omega^2(u_e^{-2} + u_o^{-2})k^2 + \omega^4 u_e^{-2} u_o^{-2} = 0. \tag{A3}$$

The k roots of the (A3) are the wavenumber of the even and odd modes propagating in the CTLs. Solution of (A1), with a certain boundary condition $\psi(z_0)$=$\psi_0$ at a certain coordinate $z_0$ inside a uniform CTL segment, is found by representing the state vector solution at a coordinate $z_1$ using:

$$\psi(z_1) = \underline{T}(z_1, z_0)\psi(z_0), \tag{A4}$$

where $\underline{T}(z_1, z_0)$ is the transfer matrix which translates the state vector (z) between two points z0 and $z_1$ along the z axis. For a uniform segment of two CTLs with length d, the transfer matrix is easily calculated as:

$$\underline{T} = \exp(-j\underline{M}d). \tag{A5}$$

Using the obtained transfer matrix and assuming the resistor R is connected to the lower right port, the input impedance seen from the upper left port in FIG. 13A is $$Z_{in} = -\frac{T_{13}T_{24} - T_{14}T_{23} - RT_{13}T_{44} + RT_{14}T_{43}}{T_{11}T_{24} - T_{14}T_{21} - RT_{11}T_{44} + RT_{14}T_{41}}. \tag{A6}$$

Appendix B: Coupled TLs Boundary Conditions

We express the general boundary conditions for the two CTLs illustrated in FIG. 11 using the KVL at the four ports of the CTLs as:

$$V_1(0) + R_{l1}I_1(0) = 0 \tag{B1}$$

$$V_2(0) + R_{l2}I_2(0) = 0$$

$$V_1(d) - R_{r1}I_1(d) = 0$$

$$V_2(d) - R_{r2}I_2(d) = 0$$

Therefore, applying the boundary conditions to (B1) which describe the three different cases illustrated in FIGS. 12A-12F (Case I-Case III) leads to the boundary conditions in Table I.

TABLE I

Boundary conditions for the three cases illustrated in FIGS. 12A-12F.

| Case I | Case II | Case III |
|--------|---------|----------|
| $V_1(0) - R\ I_1(0) = 0$ | $V_1(0) - R\ I1(0) = 0$ | $V_1(0) - R\ I_1(0) = 0$ |
| $V_2(0) = 0$ | $V_2(0) = 0$ | $V_2(0) + R\ I_1(0) = 0$ |
| $V_1(d) - R\ I_1(d) = 0$ | $V_1(d) = 0$ | $V_1(d) = 0$ |
| $V_2(d) = 0$ | $V_2(d) - R\ I_2(d) = 0$ | $V_2(d) = 0$ |

Based on these boundary conditions, we find the determinant of the matrix A(ω) in EQ. (41), (43), and (44), and consequently the resonance frequencies for the three cases.

Appendix C: Using Puiseux Series to Calculate the Sensitivity to System's Perturbations FIG. 17 is a diagram illustrating a convenient shift of the z axis to the middle of the transmission line to find the new matrix $\underline{A}$ to find the eigenfrequencies.

Figure 17:
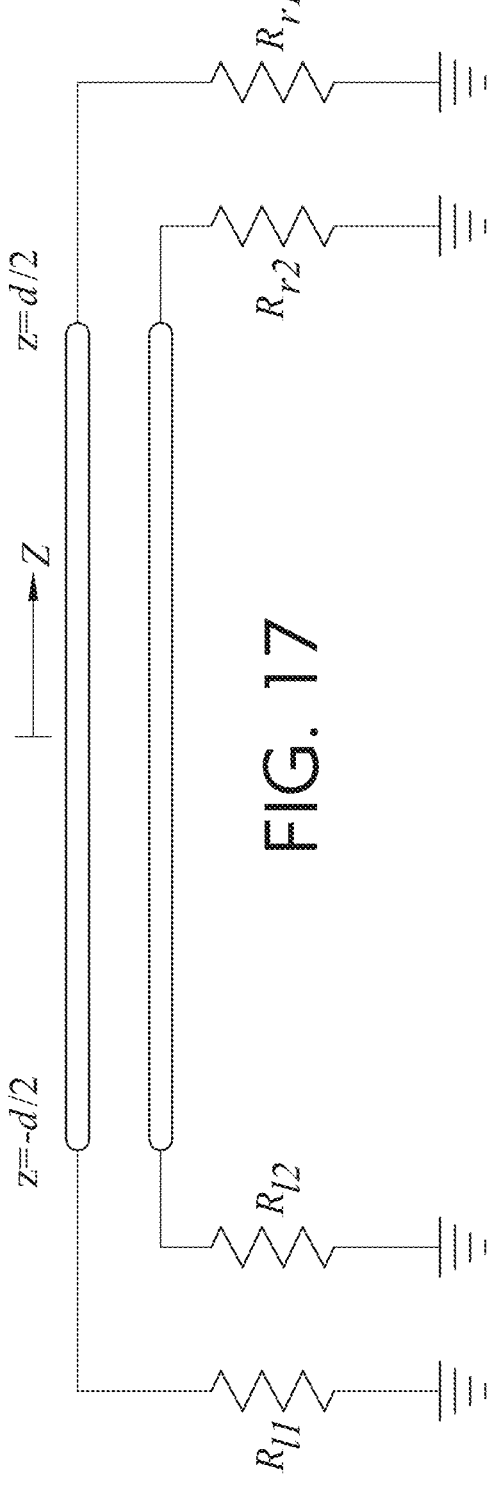
FIG. 17 is a diagram illustrating a convenient shift of the z axis to the middle of the transmission line to find the new matrix $\underline{A}$ to find the eigenfrequencies.

Assuming in this Appendix the z axis origin is at the center of the CTL for convenience, and by applying the boundary conditions at z=−d/2 and z=d/2 illustrated in FIG. 17, the $\underline{A}$ matrix reads $$\underline{A} = \tag{C1}$$

$$\begin{bmatrix}
(1+Y_eR_{l1})e^{+j\omega d/(2u_e)} & (1-Y_eR_{l1})e^{-j\omega d/(2u_e)} & (1+Y_oR_{l1})e^{j\omega d/(2u_o)} & (1-Y_oR_{l1})e^{-j\omega d/(2u_o)} \\
(1+Y_eR_{l2})e^{+j\omega d/(2u_e)} & (1-Y_eR_{l2})e^{-j\omega d/(2u_e)} & (-1-Y_oR_{l2})e^{j\omega d/(2u_o)} & (-1+Y_oR_{l2})e^{-j\omega d/(2u_o)} \\
(1-Y_eR_{r1})e^{-j\omega d/(2u_e)} & (1+Y_eR_{r1})e^{j\omega d/(2u_e)} & (1-Y_oR_{r1})e^{-j\omega d/(2u_o)} & (1+Y_oR_{r1})e^{j\omega d/(2u_o)} \\
(1-Y_eR_{r2})e^{-j\omega d/(2u_e)} & (1+Y_eR_{r2})e^{j\omega d/(2u_e)} & -(1-Y_oR_{r2})e^{-j\omega d/(2u_o)} & -(1+Y_oR_{r2})e^{j\omega d/(2u_o)}
\end{bmatrix}.$$

The goal is to provide an analytical expression for the perturbed eigenfrequencies of the system when a small perturbation ΔX is applied to one of its parameters or components. The eigenfrequencies are given by solving H (ΔX, ω), det [$\underline{A}$(ΔX, ω)]=0 for ω. Close to the EPD angular frequency ωEPD, the matrix $\underline{A}$(ΔX, ω) is expanded as $$\underline{A}(\Delta_X, \omega) = \underline{A}(\Delta_X, \omega_{EPD}) + \frac{d\underline{A}(\Delta_X, \omega)}{d\omega}\Big|_{\omega_{EPD}} (\omega - \omega_{EPD}) + \underline{Q}, \tag{C2}$$

where $\underline{O}$(ΔX, ω) defines higher order terms, e.g., terms that vanish at least as $(\omega-\omega_{EPD})^2$, where $\omega^{EPD}$ is the solution of det [$\underline{A}$(ΔX=0, ω)]=0. In order to apply the Puiseux series to find the perturbation of the eigenfrequencies for a small ΔX, we rewrite the system equation A(ΔX, ω)V=0 in an eigenvalue problem form, e.g., as ($\overline{B}$−ωI)V=0, assuming that ω−ω$_{EPD}$, where I is the 4×4 identity matrix. This can be achieved by left multiplying Eq. (C2) by $$\underline{D}(\Delta_X) \equiv -\left(\frac{d\underline{A}(\Delta_X, \omega)}{d\omega}\Big|_{\omega_{EPD}}\right)^{-1}.$$

It is convenient to define $$\underline{B}(\Delta_X) = \omega_{EPD}I + \underline{D}(\Delta_X)\,\underline{A}(\Delta_X, \omega_{EPD}), \tag{C3}$$

where $\underline{B}$ depends only on the perturbation ΔX, and not on ω. This procedure leads to:

$$\underline{B}(\Delta_X) - \omega I = \underline{D}(\Delta_X)\underline{A}(\Delta_X, \omega) + \underline{Q}_B, \tag{C4}$$

where $\underline{O}_B = -DO$ is a term that vanishes at least as $(\omega-\omega_{EPD})^2$. Since from EQ. (38) we know that at each eigenfrequency one has $\underline{A}$(ΔX, ω$_i$)V=0, at those eigenfrequencies we have:

$$(\underline{B} - \omega_i\underline{I})V = \underline{D}\underline{A}V + \underline{Q}_B V = \underline{Q}_B V \approx 0. \tag{C5}$$

Therefore, the terms of this equation tend to zero ω$_i$→ω$_{EPD}$, which means that the angular frequencies that satisfy (B−ωI) V=0 and $\underline{A}$V=0 are approximately the same, for any _X, when they are very close to ω$_{EPD}$. Furthermore, when ΔX=0, the eigenvalue of ($\underline{B}$−ωI)V=0, coincides with the ω-solution of AV=0. A more precise procedure should illustrate also the higher order terms when discussing the approximation. We now use the Puiseux series expansion to estimate the perturbed eigenvalues of ($\underline{B}$−ωI)V=0 when a perturbation _X is applied to the system. The first-order Puiseux series expansion yields:

$$\omega_i(\Delta_X) \approx \omega_{EPD} + (-1)^i \alpha_1 \sqrt{\Delta_X}, \tag{C6}$$

which describes the perturbation of the two eigenvalues (i=1, 2) when a small relative perturbation ΔX of a system's parameter near its EPD value ΔX=0 occurs. The series coefficients are calculated using the explicit recursive formulas pertaining to the eigenvalue problem ($\underline{B}$−ωI)V=0. Thus, to find $\alpha_1$ we have to find the derivatives of $H_B$ (ΔX, ω), det($\underline{B}$−ωI) with respect to ΔX and ω at $\alpha_1$ is rewritten as:

$$\alpha_1 = \sqrt{-\frac{\dfrac{dH_B(\Delta_X, \omega)}{d\Delta_X}}{\dfrac{1}{2!}\dfrac{d^2 H_B(\Delta_X, \omega)}{d\omega^2}}}\Big|_{\omega_{EPD}, X_{EPD}}. \tag{C7}$$

Using Eq. (C4), the relation between $H_B$ and $H(\Delta_X, \omega) \triangleq \det \underline{A}(\Delta_X, \omega)$ is found to be $$H_B(\Delta_X, \omega) \approx \det \underline{D}(\Delta_X) H(\Delta_X, \omega). \tag{C8}$$

Using this relation between Ha and H, the numerator in the square root of $\alpha_1$ is rewritten as $$\frac{dH_B}{d\Delta_X} \approx \det \underline{D}\frac{dH}{d\Delta_X} + H\frac{d\det\underline{D}}{d\Delta_X}. \tag{C9}$$

Note that $\alpha_1$ may be calculated at the EPD point and $$H(\Delta_X, \omega)\Big|_{\omega_{\overline{EPD}}, X_{EPD}} = \det \underline{A}(\Delta_X, \omega)\Big|_{\omega_{EPD}, \hat{X}_{EPD}} = 0,$$

so we simplify the above relation as $$\frac{dH_B}{d\Delta_X}\Big|_{\omega_{EPD}, X_{EPD}} \approx \det \underline{D}\big|_{X_{EPD}}\frac{dH}{d\Delta_X}\Big|_{\omega_{EPD}, X_{EPD}}. \tag{C10}$$

Analogously, the denominator in the square root of $\alpha_1$ at the EPD point is found to be:

$$\frac{d^2 H_B}{d\omega^2}\Big|_{\omega_{EPD}, X_{EPD}} \approx \det \underline{D}\big|_{X_{EPD}}\frac{d^2 H}{d\omega^2}\Big|_{\omega_{EPD}, X_{EPD}}. \tag{C11}$$

Therefore, we calculate the $d'H_B/d\omega^2$ and $dH_B = d\Delta_X$ at the EPD point $(\omega_{EPD}, X_{EPD})$, leading to the approximation for $\alpha 1$ as:

$$\alpha_1 = \sqrt{-\frac{\dfrac{dH_B}{d\Delta_X}\big|_{\omega_{EPD}, X_{EPD}}}{\dfrac{1}{2!}\dfrac{d^2 H}{d\omega^2}\big|_{\omega_{EPD}, X_{EPD}}}} \approx \sqrt{-\frac{\dfrac{dH}{d\Delta_X}\big|_{\omega_{EPD}, X_{EPD}}}{\dfrac{1}{2!}\dfrac{d^2 H}{d\omega^2}\big|_{\omega_{EPD}, X_{EPD}}}}. \tag{C12}$$

We conclude that $\alpha_1$ found for the Puiseux series expansion of the $\omega$-eigenvalues of $\underline{B}(\Delta X)$ is approximately the same as the coefficient used in the fractional power series expansion of the $\omega$ solutions of $\det\underline{A}(\Delta X, \omega) = 0$, demonstrating Eq. (19).

In an example embodiment, we propose and demonstrate a new scheme for a highly-sensitive oscillator based on exceptional points of degeneracy (EPD). The oscillator with degeneracy is realized using two coupled resonators based on an almost balanced small-signal gain and loss, that saturates due to nonlinear effects of the active component, and whose oscillation frequency is very sensitive to a perturbation of the circuit. We study two cases where two parallel LC resonators with balanced small-signal gain and loss are either coupled wirelessly by a mutual inductance or coupled wired by a capacitor. This paper demonstrates theoretically and experimentally the conditions for a second order EPD oscillator to occur, and the ultrasensitivity of the oscillation frequency to perturbed components, including the case of asymmetric perturbation that breaks PT-symmetry. We discuss the effects of the nonlinearity on the performance of the oscillator and how it improves the sensing of any perturbation. In contrast to previous methods, our proposed degenerate oscillator can sense positive or negative changes of a circuit element. The degenerate oscillator circuit may find applications in areas such as ultrasensitive sensors, tunable oscillators and modulators.

Index Terms—EPD, Degeneracy, Oscillator, Sensor, Nonlinearity

In an example embodiment, oscillators may be fundamental components of radio frequency (RF) electronics. Traditionally, an oscillator is viewed as a positive feedback mechanism utilizing a gain device with a selective reactive circuit. An oscillator generates a continuous, periodic single-frequency output when Barkhausen's criteria are satisfied. The oscillator circuit should have a self-sustaining mechanism such that noise gets filtered, quickly grows and become a periodic signal. Most RF oscillators are implemented by only one active device for noise and cost considerations, such as Van der Pol and voltage controlled oscillators. Oscillators based on the LC tank are designed with positive feedback by negative resistance.

In an example embodiment, Pierce, Colpitts, and tunnel diode oscillators play a negative resistance role in a circuit, as well as a cross-coupled transistor pair. While oscillators based on an LC tank are the most common, other designs may feature distributed, coupled, or multi-mode oscillators, which come with their own set of challenges and advantages. Here an oscillator is designed based on utilizing an exceptional point of degeneracy (EPD) in two coupled resonators.

In an example embodiment, a system reaches the EPD when at least two eigenmodes coalesce into a single degenerate one, in their eigenfrequencies (eigenvalues) and polarization states (eigenvectors). The concept of EPD has been implemented traditionally in systems that evolve in time, like in coupled resonators periodic and uniform multimode waveguides, and also in waveguides using Parity-Time (PT) symmetry. EPDs have been recently demonstrated also in temporally-periodic single resonators without a gain element, inspired by the finding that EPD exist in spatially periodic lossless waveguides, using the non-diagonalizability of the transfer matrix associated to the periodic system.

In an example embodiment, a feature of a system with EPD is the ultra-sensitiveness of its eigenvectors and eigenvalues to a perturbation of a system's parameter. This property paves the way to conceive a scheme to measure a small change in either physical, chemical or biological parameters that cause a perturbation in the system. Typically, a sensor's sensitivity is related to the amount of spectral shift of its resonance in response to a environment variation, for example a glucose concentration or other physical variations like changing the environment's pressure, etc. Systems with EPD can have their sensing part connected wirelessly or with wires to the measuring part of the sensor. In this paper, we illustrate the extreme sensitivity of an oscillator operating at an EPD to external perturbations.

Previous parity-time (PT)-symmetry circuits have been conceived as two coupled resonators where changes happen at the one resonator, and the data is detected on the other side. However, because PT symmetry must be maintained in order to observe two real-valued frequencies when the circuit is perturbed away from its EPD. When one side's capacitance is perturbed the authors tuned the other side's capacitance using a varactor to keep the PT symmetry in the circuit, so they can still observe two real-valued shifted frequencies perturbed away from the degenerate EPD frequency.

Implementing the demonstration of sensitive measurement of a perturbation, the exact value of such perturbation should be exactly known to tune the other side of the system in order to keep the circuit PT-symmetric. This contradicts the idea that the circuits is used as a sensor of an unknown measurable quantity. The scheme could be saved if combined with an iterative method performing an automatic scan to reconstruct the PT-symmetry.

FIGS. 18A-18D are diagrams illustrating (a) Coupled resonators terminated with $-G_1$ on the gain side (n=1) and $G_2$ on the loss side (n=2), with $G_1=G_2=G$, and inductances L=0.1 µH, mutual coupling k=M=L=0.2, capacitances of $C_n=C_0=1$ nF (n=1, 2). The natural frequency of each (uncoupled) LC tank is $\omega_0=1/\sqrt{LC0}=10^8$ s$^{-1}$. Normalized eigenfrequencies of the coupled circuit are calculated by using Eqs. (4) and (5). (b) Real, and (c) imaginary parts of the resonance angular frequencies normalized by $\omega0$ varying G on both sides of the EPD value. (d) At the EPD point (G=Ge=20.52 mS, $\omega_e=1.01\times10^8$ s$^{-1}$), two state eigenvectors coalesce demonstrated by the vanishing of $\sin(\theta)$.

Anyway, this rebalancing procedure (to keep the system PT symmetric) would complicates the use of such a scheme when designing a sensor. PT symmetry schemes have also a limitation for sensing since they work only when changes in a system's component, e.g., a capacitor's values, have the same sign (if an external perturbation generates the opposite component variation sign, it could not be measured). This is because a PT-symmetric system provides two real-valued frequencies only when the system is perturbed away from its EPD in one direction (for example for G values smaller than the G value that brings the EPD, when looking at the eigenfrequencies in FIGS. 18A-18D). If the perturbation makes the system move in the other direction, the shift of the frequencies is in the imaginary parts, leading to two complex-valued frequencies and hence to an instability. One must also consider that in the tuning process after building the circuit, any mismatch on the microsensor (typically the part with losses) and reader (typically the part with gain) side leads to an asymmetric system, thus a PT symmetric system in practice always illustrates two complex-valued eigenfrequencys and risks to start self-sustained oscillations (unless an EPD is designed having a large enough damping factor that is larger than the uncertainty due to the circuit tolerances). Noise and nonlinearity play a critical role in the robustness of these kinds of applications and manipulate the potential for instability. Some error-correction techniques are studied to face some of these drawbacks using a nonlinear PT-symmetry scheme to enhance the robustness of sensing.

In an example embodiment, we provide an alternative scheme that starts from a quasi PT-symmetric condition, working near an EPD, and making the system unstable to start with. In other words, we turn the above-mentioned practical problems that occur in PT symmetric systems to our advantage. In the simulation, we set the gain value slightly higher than the loss counterpart to make the system slightly unstable. Because of the instability and the nonlinear gain, the signal grows until the active gain component saturates, and the working operation is till close to the EPD. We first illustrate the behavior of wirelessly coupled LC resonators through the dispersion relation of the resonance frequency versus perturbation and we discuss the occurrence of EPDs in such a system.

In an example embodiment, we use the nonlinear model for the gain to achieve the oscillator's characteristics. The circuit starts to oscillate and by taking the Fourier transform of the oscillatory signal we illustrate that the oscillation frequency is very close to the EPD one. We have observed that the EPD-based oscillator has an oscillation frequency very sensitive to perturbations, exhibiting the typical square root behavior of EPD systems where the change in oscillation frequency is proportional to the square root of the system's perturbation.

In an example embodiment, we demonstrate the highly sensitive behavior of the circuit by breaking PT-symmetry, e.g., by perturbing the capacitance on the lossy side (the sensing capacitance), and the circuit oscillates at a shifted frequency compared to the EPD one. Notably, both positive and negative perturbations in the capacitance are illustrated to lead to opposite shifted frequencies, e.g., the proposed scheme detects positive and negative changes of the capacitance, in contrast to conventional PT-symmetry systems that generate frequency shifts associated to one sign only of the perturbation. The EPD is demonstrated also by analyzing the bifurcation of the dispersion diagram at the EPD frequency by using the Puiseux fractional power series expansion. In section V, we illustrate the condition to have an EPD in two resonators coupled by a capacitor and demonstrate the occurrence of the EPD by using the Puiseux series, and experimentally using a nonlinear active element. Also, we discuss how noise contributes to the system by illustrating the power spectrum of the system and the phase noise. The theoretical results are in remarkable agreement with the experimental results. Accordingly, small perturbations in the system may be detected by measurable resonance frequency shifts, even in the presence of thermal noise and electronic noise. An advantage of using the proposed circuit as an ultra-sensitive sensor and how the experimental results illustrate that the oscillator in some embodiments is sensitive to both positive and negative capacitance changes are discussed. Very sensitive sensors based on the oscillator scheme discussed here can be a crucial part of various medical, industrial, automotive and aerospace applications that require sensing physical or chemical changes as well as biological quantities.

Oscillator Based on Coupled Resonators with EPD

Figure 18A:
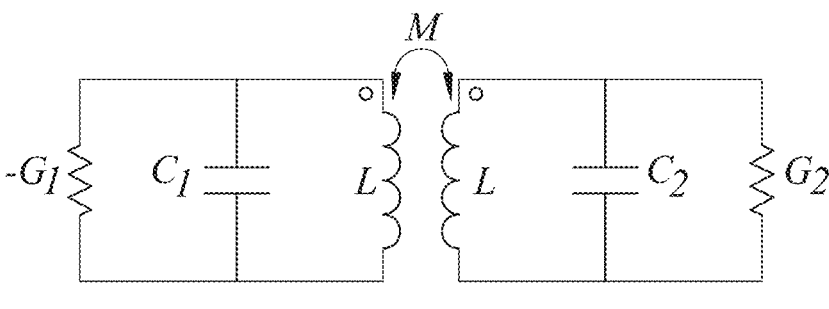
FIGS. 18A-18D are diagrams illustrating Coupled resonators terminated with $-G_1$ on the gain side (n=1) and $G_2$ on the loss side (n=2), with $G_1$=$G_2$=G, and inductances L=0.1 μH, mutual coupling k=M=L=0.2, capacitances of $C_n$=$C_0$=1 nF (n=1, 2). The natural frequency of each (uncoupled) LC tank is $\omega_0$=1/$\sqrt{LC0}$=$10^8$ $s^{-1}$. Normalized eigenfrequencies of the coupled circuit are calculated by using Eqs. (4) and (5). Real, and imaginary parts of the resonance angular frequencies normalized by ω0 varying G on both sides of the EPD value. At the EPD point (G=Ge=20.52 mS, $\omega_e$=1.01× $10^8$ $s^{-1}$), two state eigenvectors coalesce demonstrated by the vanishing of sin(θ).
Figure 18B:
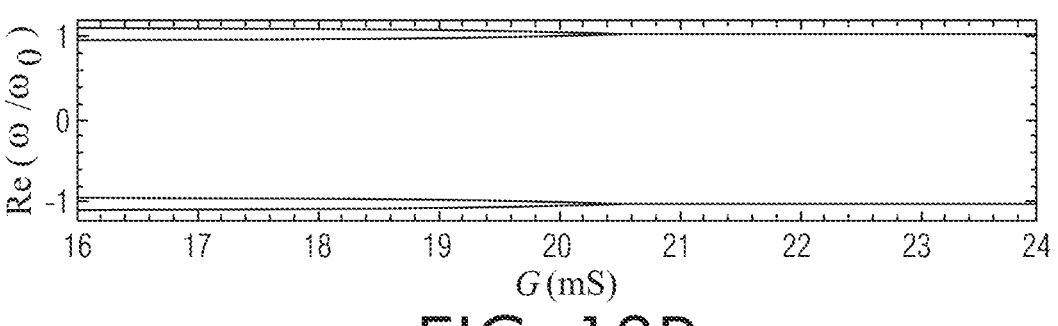
Figure 18C:
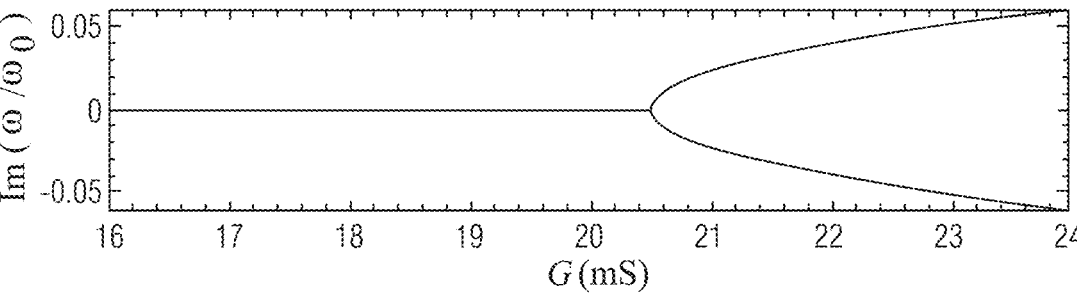

In this section, we investigate coupled resonators illustrated in FIG. 18A, where one parallel LC tank is connected to gain (left side, or n=1) and the other is connected to loss (right side, or n=1). In this circuit, negative conductance indicates the gain in the system. Moreover, by writing Kirchhoff's laws, we obtain the equations $$\begin{cases} \dfrac{d^2Q_1}{dt^2} = -\dfrac{1}{LC_1(1-k^2)}Q_1 + \dfrac{k}{LC_2(1-k^2)}Q_2 + \dfrac{G_1}{C_1}\dfrac{dQ_1}{dt} \\ \dfrac{d^2Q_2}{dt^2} = +\dfrac{k}{LC_1(1-k^2)}Q_1 + \dfrac{1}{LC_2(1-k^2)}Q_2 + \dfrac{G_2}{C_2}\dfrac{dQ_2}{dt} \end{cases} \quad (52)$$

where $Q_n$ is the capacitors charge on the gain side (n=1) and the lossy side (n=2), and $Q_n=dQ_n/dt$ may be the current flowing into the capacitor. The state vector may be defined as $\psi(t)=[Q_1, Q_2, \dot{Q}_1, \dot{Q}_2]^T$, consisting of a combination of stored charges and currents on both sides, and the superscript T denotes the transpose operation. Thus, we describe the system in a Liouvillian formalism as $$\frac{d\Psi}{dt} = \underline{M}\Psi, \tag{52}$$

$$\underline{M} = \begin{pmatrix} 0 & 0 & 1 & 0 \\ 0 & 0 & 0 & 1 \\ -\dfrac{1}{LC_1(1-k^2)} & \dfrac{k}{LC_2(1-k^2)} & \dfrac{G_1}{C_1} & 0 \\ \dfrac{k}{LC_1(1-k^2)} & -\dfrac{1}{LC_2(1-k^2)} & 0 & -\dfrac{G_2}{C_2} \end{pmatrix}.$$

We are interested in finding the eigenfrequencies and eigenvectors of the system matrix $\underline{M}$ describing the circuit. Assuming signals of the form $$Q_n^- \propto e^{j\omega t},$$

we write the eigenvalues problem associated with the circuit equations, $(\underline{M} - j\omega\underline{I})\Psi = 0$, where $\underline{I}$ is a 4 by 4 identity matrix. Then, by solving $P(\omega) \triangleq \det(\underline{M} - j\omega\underline{I}) = 0$; the four eigenfrequencies are found. By assuming $C_1 = C_2 = C_0$ and $G_1 = G_2 = G$, a symmetry condition that has been described as PT symmetric, the characteristic equation takes the simplified form $$P(\omega) = (1-k^2)\left(\frac{\omega}{\omega_0}\right)^4 + (G^2Z^2(1-k^2)-2)\left(\frac{\omega}{\omega_0}\right)^2 + 1 = 0, \tag{53}$$

where $Z = \sqrt{L/C0}$ is a convenient normalizing impedance, and $\omega_0^2 = 1 = (LC_0)$. The characteristic equation is quadratic in $\omega_2$, therefore, $\omega$ and $-\omega$ are both solutions. Moreover, the $\omega$'s coefficients in the characteristic equation are real hence $\omega$ and $\omega^*$ are both solutions, where $*$ represents the complex conjugate operation. The 4 by 4 matrix $\underline{M}$ results in 4 angular eigenfrequencies which are found analytically as, $$\omega_{1,3} = \pm\omega_0 \sqrt{\frac{1}{1-k^2} - \frac{G^2Z^2}{2} - \sqrt{b}}, \tag{54}$$

$$\omega_{2,4} = \pm\omega_0 \sqrt{\frac{1}{1-k^2} - \frac{G^2Z^2}{2} + \sqrt{b}}, \tag{55}$$

$$b = -\frac{1}{1-k^2} + \left(\frac{G^2Z^2}{2} - \frac{1}{1-k^2}\right)^2. \tag{56}$$

The EPD frequency is found when the component values as obey the condition:

$$b = 0 \tag{57}$$

This may be a necessary condition, but in a simple system like this, the eigenvectors can be represented a function of the eigenvalues so this condition is also sufficient to illustrate the convergence of the eigenvectors, hence for an EPD to occur. Under this condition, we calculate the EPD angular frequency based on Eqs. 54 and 57 as $\omega_1 = \omega_2 = \omega_c$ where $$\omega_e = \frac{\omega_0}{\sqrt[4]{1-k^2}}. \tag{58}$$

The real and imaginary parts of the eigenfrequencies are illustrated in FIG. 1) (b) and (c) varying G. It is seen from this plot that the system's eigenfrequencies are coalescing at a specific balanced gain/loss value $G = G_e$, where $b = 0$. Note that in this scenario, the EPD-enabling value $G_e$ is derived from Eq. (57) as $$G_e = \frac{1}{Z}\left(\frac{1}{\sqrt{1-k}} - \frac{1}{\sqrt{1+k}}\right). \tag{59}$$

For clarification, when $G = 0$ (lossless and gainless circuit) we have two pairs of resonance frequencies $\omega_{1,3} = \pm\omega_0/\sqrt{(1+k)}$ and $\omega_{2,4} = \pm\omega_0/\sqrt{(1-k)}$, $\omega_1 \neq \omega_2$, always, except for the trivial case with $k = 0$, when these eigenfrequencies are equal to those of the isolated circuits but since the two circuits are isolated this is not an important degeneracy. With the given values of L and C in the caption of FIGS. 18A-18D, a second order EPD occurs when $G = G_e = 20.52$ mS.

In this case, the circuit's currents and charges grow linearly with increasing time ($Q_n \propto te^{j\omega_e t}$), and they oscillate at the degenerate frequency $\omega_e$. Also, near the EPD point, the eigenfrequencies, when perturbing G, have a square root behavior as $$|\omega - \omega_e| \propto \pm\sqrt{(GZ)^2 - (G_eZ)^2}$$

A second coalescence (e.g., degeneracy) happens for larger values of G, e.g., at $$G'_e = \frac{1}{Z}\left(\frac{1}{\sqrt{1-k}} + \frac{1}{\sqrt{1+k}}\right) \tag{}$$

When $G > G_e'$ all frequencies are imaginary, so we only study cases of $G < G_e'$. In the strong coupling regime, $0 < G < G_e$, the eigenfrequencies are purely real, and the oscillation wave has two fundamental frequencies. In the weak coupling regime, $Ge < G < G$ 0e, the frequencies are complex conjugate and the imaginary part of the angular eigenfrequencies is non-zero, and it causes two system solution ($Q_1$ and $Q_2$) with damping and exponentially growing signals in the system. Since the solution of the circuit is $Q_n \propto \check{e}^{j\omega t}$, the eigenfrequency with negative imaginary part is associated to an exponentially growing signal and the oscillation frequency is associated to the real part of eigenfrequency.

At each positive (real part) angular eigenfrequency $\omega_1$ and $\omega_2$, calculated by Eqs. (54) and (55), we find the two associated $\Psi_1$ and $\Psi_2$ eigenvectors by using Eq. (52). A sufficient condition for an EPD to occur is that at least two eigenvectors coalesce, and that is what we check in what follows. Various choices could be made to measure the state vectors'

$$\Psi_1 \text{ and } \Psi_2$$

coalescence at an EPD, and here, the Hermitian angle between the state amplitude vectors is defined as $$\theta = \arccos\left(\frac{|<\Psi_1, \Psi_2>|}{\|\Psi_1\|\|\Psi_2\|}\right). \tag{60}$$

Figure 18D:
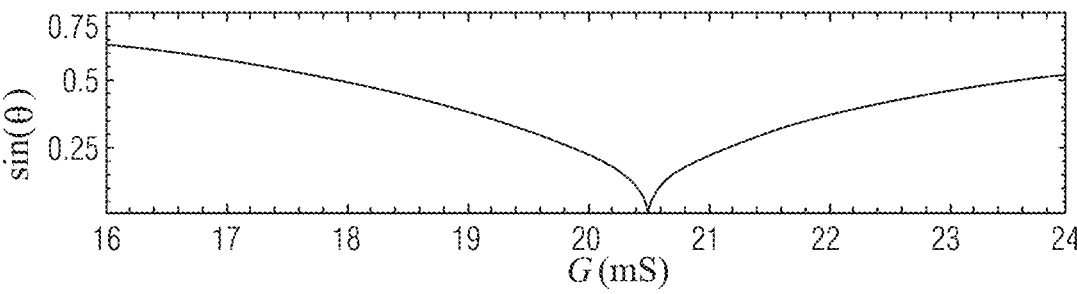

Here the inner product is defined as $$\langle \Psi_1, \Psi_2 \rangle = \Psi_1^T \Psi_2,$$

where the dagger symbol † denotes the complex conjugate transpose operation, || represents the absolute value, and || || represents the norm of a vector. According to this definition, the state vectors are corresponding to resonance frequencies $\omega_1$ and $\omega_2$, respectively. When some system's parameter is varied, $\Psi_1$ and $\Psi_2$ eigenfrequencies and associated eigenvectors are calculated using Eq. (52). In the case when G varies, FIG. 18D illustrates that the sine of the angle θ between the two eigenvectors vanishes when the eigenfrequencies coalesce, which indicates the coalescence of the two eigenmodes in their eigenvalues and eigenvectors and hence the occurrence of a second order EPD.

Oscillator Characteristics

This section describes the important features of an oscillator made of two coupled resonators with discrete (lumped) elements with balanced gain and loss, coupled wirelessly by a mutual inductance as in FIGS. 18A-18D. The transient time-domain behavior, frequency spectrum, and double pole (or zero, depending on what we look at) behavior are discussed. Moreover, a cubic model (nonlinear) of the active component providing gain is considered. The parameters used here are the same as those used in the previous section, where Ge=20.52 mS leads to an EPD of order two at a frequency of 16.1 MHZ.

A. Transient and Frequency Behavior

FIGS. 19A-19D are diagrams illustrating (a) Nonlinear cubic gain i–v curve with parameters $G_1=G_e=20.52$ mS and α=6.84 mS=$V_2$ (it corresponds to $V_b$=1 V). Time-domain response and frequency spectrum of the oscillatory signal with a cubic model where the gain is always 0.1% more than the loss (e.g., $G_1=1.001G_2$) with: (b) $G_1=1.001$ $G_2$ and $G_2<G_e$, (c) $G_1=1.001G_e$ and $G_2=G_e$, and (d) $G_1=1.001$ $G_2$ and $G_2>G_e$, where $G_e=20.52$ mS.

Figure 19A:
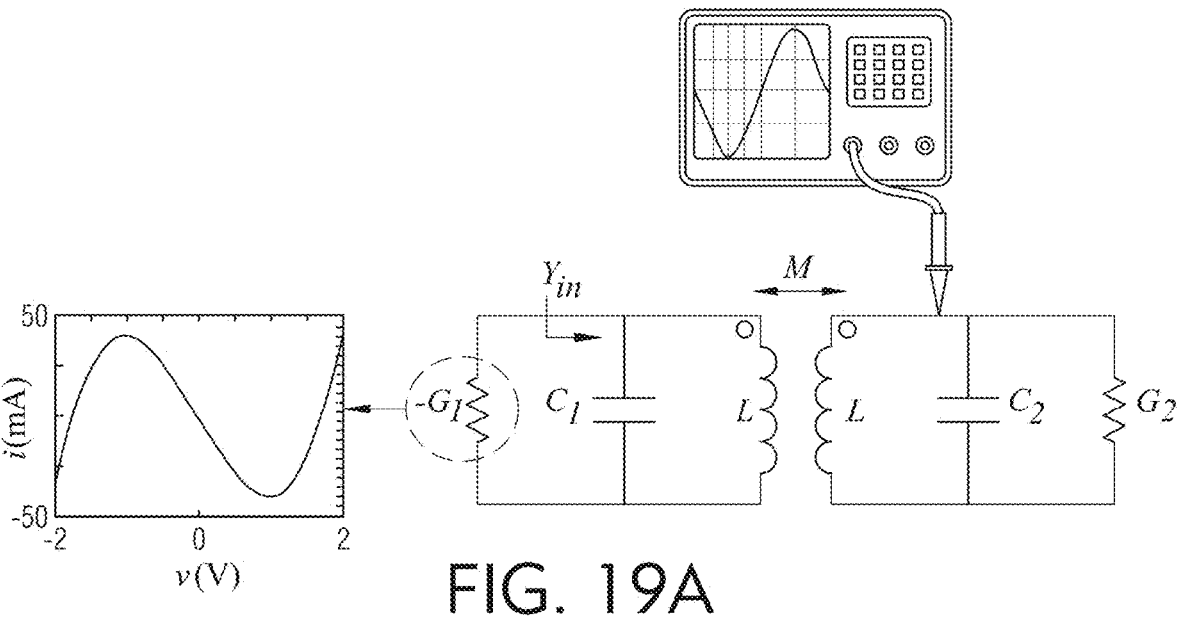
FIGS. 19A-19D are diagrams illustrating Nonlinear cubic gain i–v curve with parameters $G_1$=$G_e$=20.52 mS and α=6.84 mS=$V_2$ (it corresponds to $V_b$=1 V). Time-domain response and frequency spectrum of the oscillatory signal with a cubic model where the gain is always 0.1% more than the loss (e.g., $G_1$=1.001$G_2$) with: $G_1$=1.001 $G_2$ and $G_2$<$G_e$, $G_1$=1.001$G_e$ and $G_2$=$G_e$, and $G_1$=1.001 $G_2$ and $G_2$>$G_e$, where $G_e$=20.52 mS.
Figure 19B:
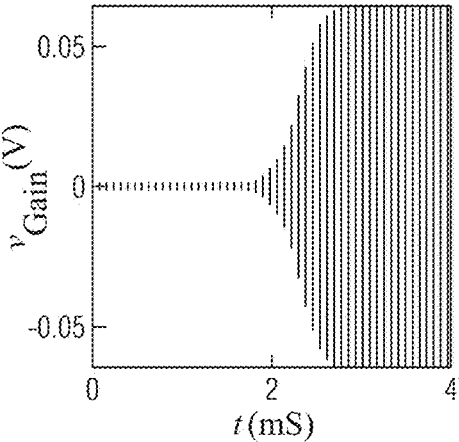
Figure 19B:
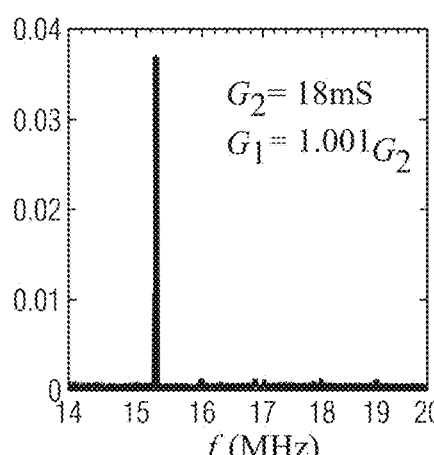
Figure 19C:
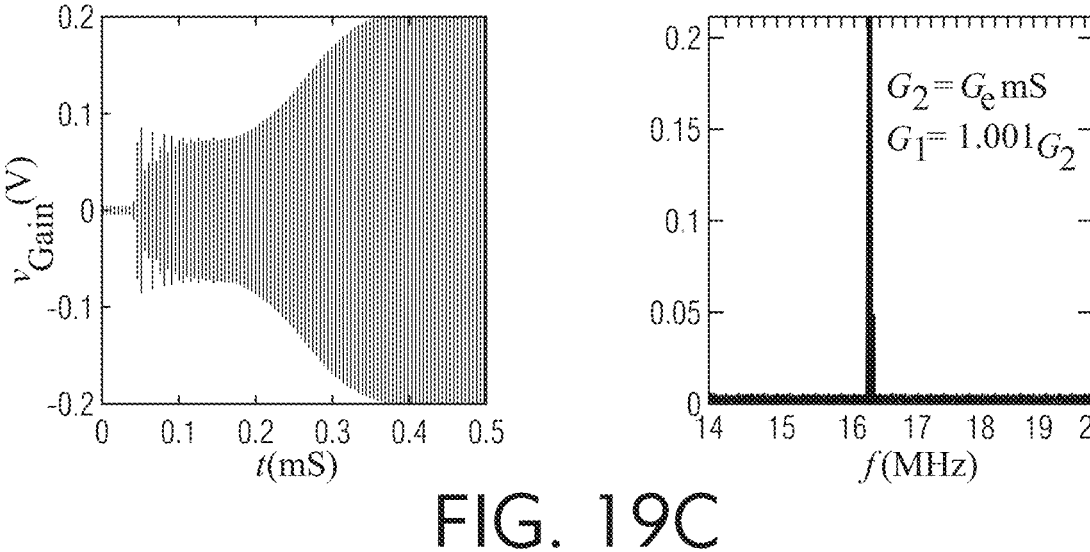
Figure 19D:
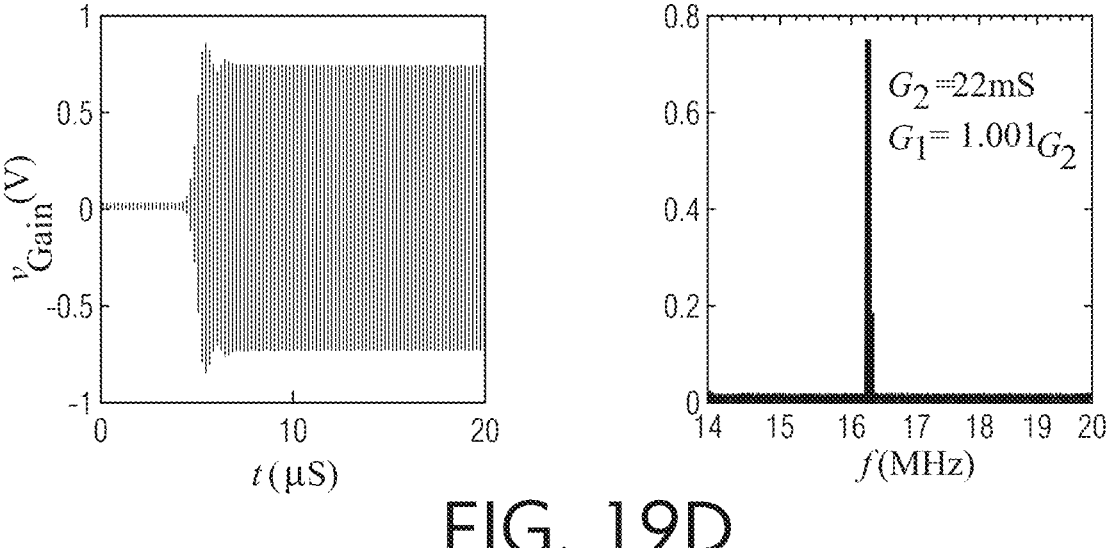

Time-domain and frequency responses of the coupled resonator circuit obtained using the Keysight Advanced Design System (ADS) circuit time-domain simulator are illustrated in FIGS. 19B-19D, where we used a cubic model for gain illustrated in FIG. 19A, and the spectrum is obtained by applying the Fourier transform. The cubic model is a simplified description of gain obtained from a cross-coupled transistor or an operational amplifier (Operational Amplifier) based circuit, the relation between its current and voltage is represented as $$i = -G_1 v + \alpha v^3: \qquad (61)$$

Here, $-G_1$ is the small-signal gain provided by the negative slope of the i–v curve, e.g., is the negative conductance in the small signal region and _ is a third order nonlinearity that describes saturation, and defined as α=$G_1$/(3$V_b^2$) where $V_b$ is a turning point voltage determined by the biasing direct current (DC) voltage. We assume $V_b$=IV, and to start self-sustained oscillation we assume that gain $-G_1$ is not a perfect balance of the loss $G_2$. Indeed, we assume that $G_1$ is 0.1% larger than $G_2$. Therefore, the system is slightly perturbed away from the PT-symmetry condition to start with. We also assume white noise (at the temperature of 298 K) is present in the loss resistor and it is indeed the initial condition for starting oscillations.

Using $G_1$ to be 0.1% larger than $G_2$, the circuit is unstable and it starts to oscillate, and after a transient, the circuit saturates yielding a stable oscillation, as illustrated in FIGS. 19A-19D. As it was illustrated in FIGS. 18B-18C assuming linear gain, for values of $G_1=G_2<G_e$, the system has two distinct eigenfrequencies $\omega_1$ and $\omega_2$ with zero imaginary part. However, when using the cubic nonlinear model with $G_1=1.001G_2$, with $G_2$, $G_1<G_e$, the imaginary part is not zero anymore because of the nonlinearity and slightly broken PT-symmetry. Thus, when using the cubic model, after an initial transient, the oscillation signal associated to the eigenfrequency with a negative imaginary part dominates and makes the system saturates. Considering again the initial result in FIGS. 18B-18C assuming linear gain, it is noted that when $G_1=G_2>G_e$, we have two complex conjugate eigenfrequencies, and the one associated to the negative imaginary part makes the circuit oscillate. However, when using the cubic gain model with $G_1=1.001G_2$, with $G_1$ and $G_2>G_e$, eigenfrequencies approximately follow the linear gain eigenfrequency trend. It means that for the values $G_1$ and $G_2>G_e$, we have a larger negative imaginary part of the eigenfrequency than when $$\breve{G}_2 \lesssim \breve{G}_1 \leq G'_e.$$

The rising time is related to the magnitude of the negative imaginary part of the eigenfrequency, indeed, as illustrated in FIGS. 19B-19D, the rising time is different in the three cases. By going further from the EPD point, the signal saturates in a shorter time. In all cases, the frequency spectrum of the time-domain signal is found by taking the Fourier transform of the voltage on the gain side after reaching saturation, for a time window of 103 periods.

Figure 20:
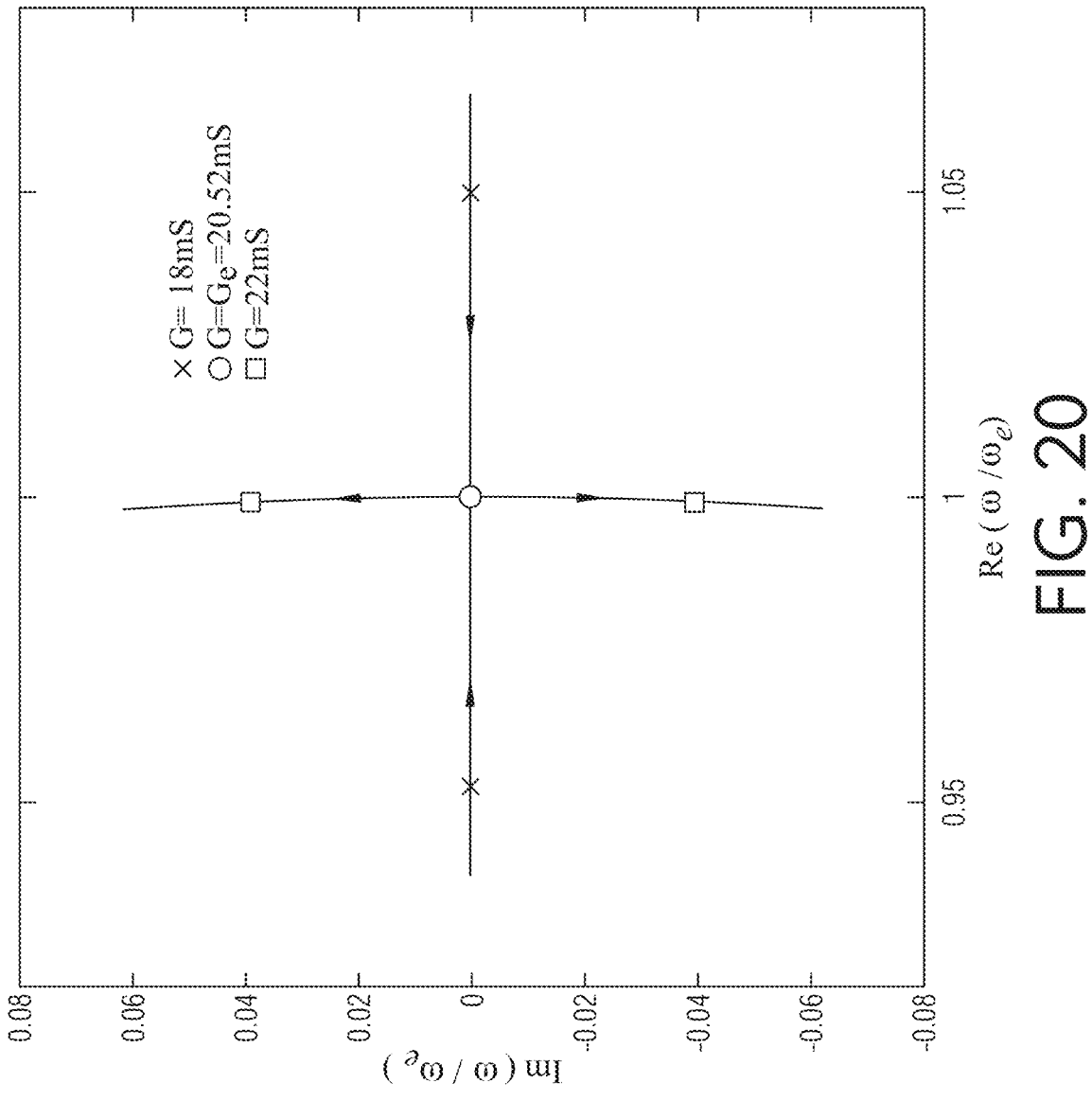
FIG. 20 is a diagram illustrating the trajectory of the zeros of $Y_{in}(\omega)$−G=0, illustrating the resonance frequencies by varying G from 15 mS to 25 mS (we assume linear gain with $G_1$=$G_2$=G). When G=$G_e$, the two branches meet at we. At the EPD, the frequency de is a double zero of $Y_{in}(\omega)$−G=0.

FIG. 20 is a diagram illustrating the trajectory of the zeros of $Y_{in}(\omega)$–G=0, illustrating the resonance frequencies by varying G from 15 mS to 25 mS (we assume linear gain with $G_1=G_2=G$). When $G=G_e$, the two branches meet at de. At the EPD, the frequency ωe is a double zero of $Y_{in}(\omega)$–G=0.

B. Root Locus of Zeros of the Total Admittance

The resonance frequencies of the coupled resonator circuit are obtained also using a standard frequency domain analysis based on phasors. We consider the admittance resonance method and we demonstrate the occurrence of double zeros at the EPD. The resonance condition based on the vanishing of the total admittance implies that $$Y_{in}(\omega) - G_1 = \frac{P(\omega)}{j\frac{L}{\omega_0^2}(1-k^2)\omega^3 + L^2 G_1(1-k^2)\omega^2 - jL\omega} = 0, \qquad (62)$$

where the Yin is the input admittance of the circuit, including the capacitor $C_1$, looking right as illustrated in FIG. 19A. Here, we assume linear gain with $G_1=G_2=G$, e.g., satisfying PT symmetry.

The polynomial P(ω) is given in Eq. (53). We calculate the eigenfrequencies by finding the zeros of $Y_{in}(\omega)$–G, and this leads to the same ω-zeros of P(ω)=det($\underline{M}$–jω$\underline{I}$)=0. Note that both ω(G) and −ω(G) are both solutions of Eq. (12), as well as both ω(G) and !_(G). The trajectories of the zeros of this equation are illustrated in FIG. 3 by varying G (we recall that in this case G=$G_1$=$G_2$), in the complex frequency plane. We illustrate only the roots with Re(ω)>0 for simplicity. The resonance frequencies ω(G) are plotted by changing G from 18 mS to G=22 mS. When G=G$_e$=20.52 mS, we have that Y$_{in}$($\omega$)−G$\propto$($\omega$−$\omega_e$)$^2$, e.g., the admittance exhibits a double zero at the at EPD angular frequency !e. When G<G$_e$, the two resonance frequencies are purely real, and for G>G$_e$, the two resonance frequencies are a complex conjugate pair.

Sensor Point of View

A. High Sensitivity and the Puiseux Fractional Power Expansion

When the system is operating at an EPD, the eigenfrequencies are extremely sensitive to system perturbations, and this property is intrinsically related to the Puiseux series that provides a fractional power series expansion of the eigenvalues in the vicinity of the EPD point. We consider a small perturbation $\Delta$X of a system parameter X as $$\Delta_X = \frac{X - X_e}{X_e},\qquad(63)$$

where X is the perturbated value of a component, and X$_e$ is the unperturbed value that provides the EPD of second order. A perturbation $\Delta$X leads to a perturbed matrix $\underline{M}$($\Delta$X) and, as a consequence, it leads to two distinct perturbed eigenfrequencies $\omega_p$($\Delta$X), with p=1, 2, near the EPD eigenfrequency De as predicted by the Puiseux series containing power terms of $\Delta$x$^{1/2}$. A good approximation of the two $\omega_p$($\Delta$X), with p=1, 2, is given by the first order expansion $$\omega_p(\Delta_X) \simeq \omega_e + (-1)^p \alpha_1 \sqrt{\Delta_X}.\qquad(64)$$

We calculate $\alpha_1$ as $$\alpha_1 = \sqrt{-\frac{\dfrac{\partial H(\Delta_X, \omega)}{\partial \Delta_X}}{\dfrac{1}{2!}\dfrac{\partial^2 H(\Delta_X, \omega)}{\partial \omega^2}}},\qquad(65)$$

where H($\Delta$, $\omega$)=det[$\underline{M}$($\Delta$)−j$\omega\underline{I}$], and its derivatives are evaluated at the EPD, e.g., at $\Delta$X=0 and $\omega$=$\omega_e$.

Consider a coupled LC resonator, as describes in FIG. 19A, assume the capacitor C$_2$ on the loss side is perturbed from the initial value as (1+$\Delta$C$_2$)C$_e$, where C$_e$ is unperturbed value for both C$_1$ and C$_2$: the coefficient $\alpha_1$ may be found analytically as $$\alpha_1 = \sqrt{\frac{L^2\omega_e^2 G_e^2\left(1 + \dfrac{C_e\omega_e}{G_e}\right)(1 - k^2) + (1 - C_eL\omega_e^2)}{L^2(6C_e^2\omega_e^2 + G_e^2)(1 - k^2) - 2C_eL}}.\qquad(66)$$

The Puiseux fractional power series expansion Eq. (14) indicates that for a small perturbation such that $$|\Delta x| << 1$$

the eigenfrequencies change dramatically from their original degenerate value due to the square root function. The Puiseux series first order coefficient is evaluated by Eq. (56) as $\alpha_1$=10$^7$(1.693+j1.530) rad/s. The coefficient $\alpha_1$ is a complex number implying that the system always has two complex eigenfrequencies, for any C$_2$ value. In FIG. 19, the estimate of $\omega_p$, with p=1, 2, using the Puiseux series is illustrated by a dashed black line. The calculated eigenfrequencies by directly solving the characteristic equation Eq. (3) are illustrated by solid lines. In this example, we can consider C$_2$ as a sensing capacitance to detect possible variations in chemical or physical parameters, transformed into electrical parameters, like the frequency of oscillation in the circuit. For a small value of $\Delta$C$_2$, around the EPD value $\Delta$C$_2$=0, the imaginary and real parts of the eigenfrequencies experience a sharp change, resulting in a very large shift in the oscillation frequency. Note that this rapid change in the oscillation frequency is valid for both positive and negative changes of $\Delta$C$_2$, which can be useful for various sensing applications. Note also that a perturbation of PT symmetry leads to instability.

Figures 21A, 21B:
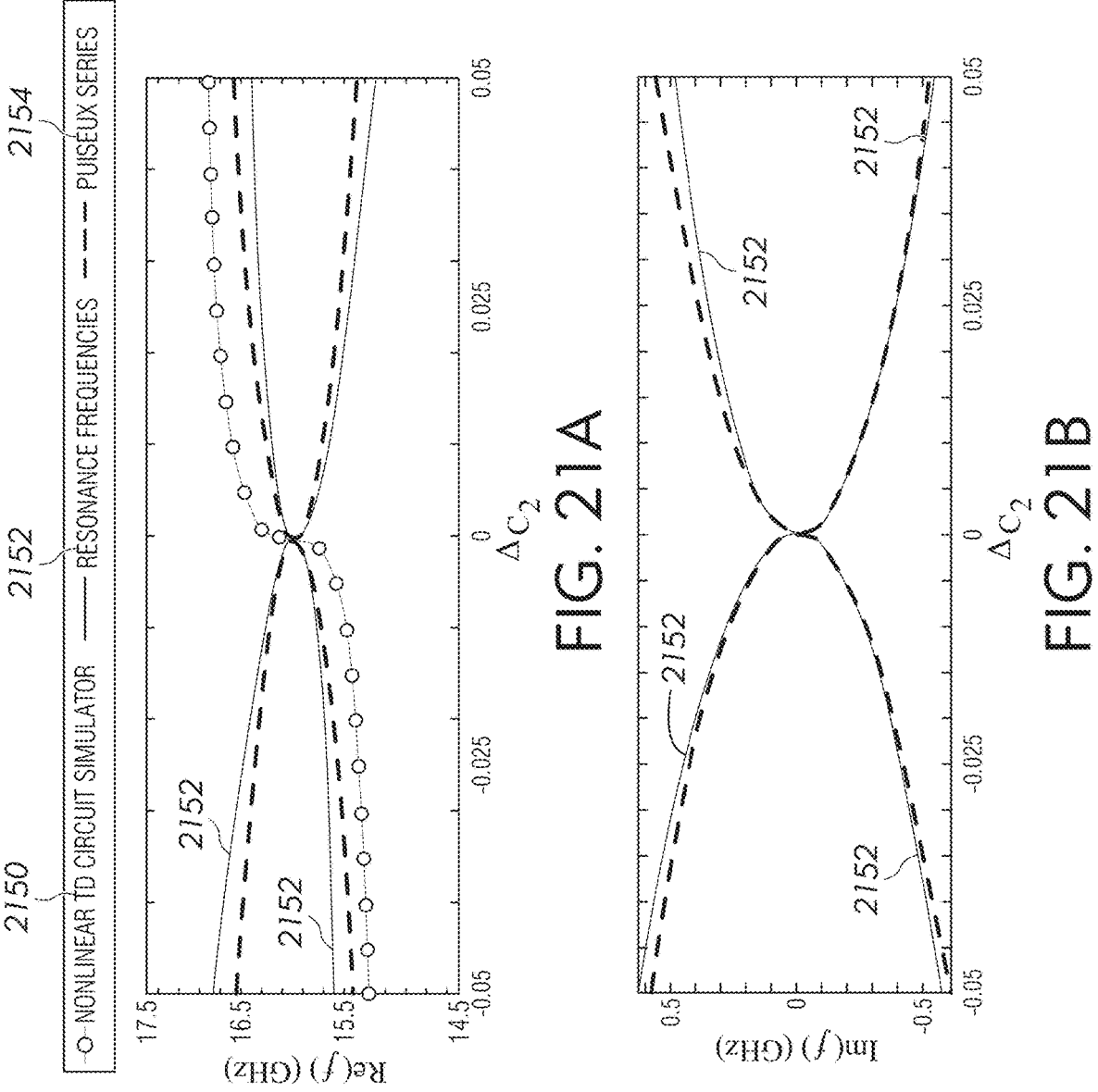
FIGS. 21A-21B are diagrams illustrating high sensitivity of the circuit to a variation of capacitance $C_2$. We illustrate the real and imaginary parts of the resonance frequencies (using linear gain) when varying $C_2$, compared to the frequency of oscillation after saturation when using nonlinear gain. Solid lines 2152 illustrate the resonance frequencies obtained by solving the characteristic equation Eq. (3), dashed lines 2154 illustrate the estimate obtained by using the Puiseux fractional power series expansion truncated to its first order. In both cases, gain is a linear negative conductance with $G_1=G_2=G_e$. Lines with dots 2150 in illustrate the oscillation frequencies using nonlinear gain, results are obtained by using the time-domain circuit simulator Keysight ADS using the small-signal negative conductance $-G_1$ with $G_1=1.001G_e$, e.g., it has been increased by 0.1% from its loss balanced value $G_e$ (we recall that $G_2=G_e$). The frequencies of oscillation are obtained by applying a Fourier transform of the capacitor $C_1$ voltage after the system reaches saturation, for each considered value of $C_2$.

FIGS. 21A-21B are diagrams illustrating high sensitivity of the circuit to a variation of capacitance C$_2$. We illustrate the (a) real and (b) imaginary parts of the resonance frequencies (using linear gain) when varying C$_2$, compared to the frequency of oscillation after saturation when using nonlinear gain. Solid lines 2152 illustrate the resonance frequencies obtained by solving the characteristic equation Eq. (3), dashed lines 2154 illustrate the estimate obtained by using the Puiseux fractional power series expansion truncated to its first order. In both cases, gain is a linear negative conductance with G$_1$=G$_2$=G$_e$. Lines with dots 2150 in (a) illustrate the oscillation frequencies using nonlinear gain, results are obtained by using the time-domain circuit simulator Keysight ADS using the small-signal negative conductance −G$_1$ with G$_1$=1.001G$_e$, e.g., it has been increased by 0.1% from its loss balanced value G$_e$ (we recall that G$_2$=G$_e$). The frequencies of oscillation are obtained by applying a Fourier transform of the capacitor C$_1$ voltage after the system reaches saturation, for each considered value of C$_2$.

To illustrate how a telemetric sensor with nonlinearity works, we now consider that the gain element is nonlinear, following the cubic model in Eq. (11) where the small-signal negative conductance is −G$_1$ with value G$_1$=1.001G$_e$, e.g., increased by 0.1% from its loss balanced value G$_e$ as discussed earlier to make the circuit slightly unstable and start self-oscillations. The capacitor C$_2$ on the lossy side is perturbed by ±0.5% steps and we perform time-domain simulations using the circuit simulator implemented in Keysight ADS circuit simulator. Noise is assumed in the lossy element G$_2$ to start oscillations. The time-domain voltage signal at the capacitor C$_1$ on the gain side is read, and then, we take the Fourier transform of such signal, after reaching saturation, for a time window of 10$^3$ periods. The oscillation frequency evolution by changing $\Delta$C$_2$ is illustrated in FIGS. 21A-21B by dots. There is no imaginary part associated to such signal since it is saturated and steady, and it has the shape of an almost pure sinusoid after reaching saturation (phase noise is discussed later on in this paper).

Figure 22:
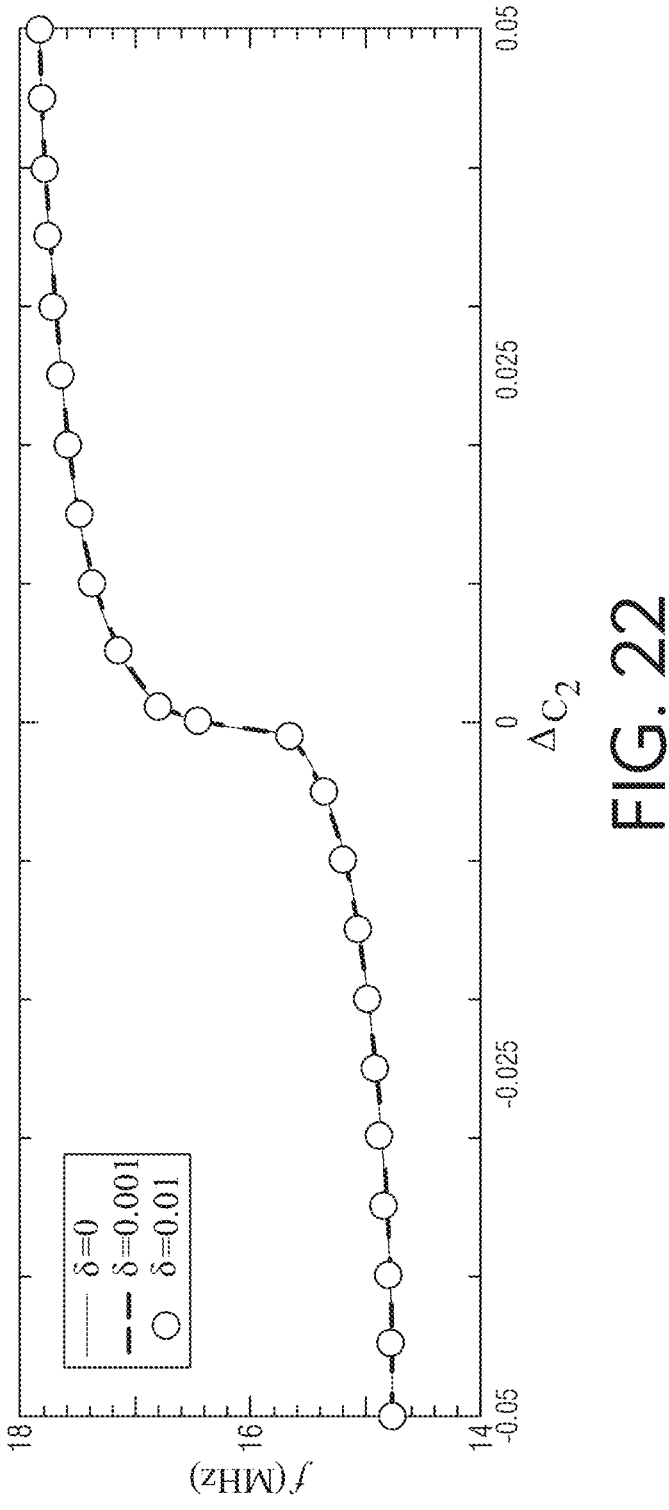
FIG. 22 is a diagram illustrating robustness of the high sensitivity of the circuit to a variation of capacitance $C_2$. The oscillator's fundamental frequencies of the circuit after each 0.5% perturbation on $C_2$ by using nonlinear gain are illustrated here, considering three values of gain $G_1=G_e(1+\delta)$, where $G_2=G_e$, for three different values of $\delta=0$, 0.001, and 0.01. These three plots are on top of each other, meaning that even with a 1% mismatch between gain and loss, the oscillator's fundamental frequencies are the same as those for smaller unbalanced situations. It is important to note that both positive and negative perturbations of $C_2$ are detected.

FIG. 22 is a diagram illustrating robustness of the high sensitivity of the circuit to a variation of capacitance C$_2$. The oscillator's fundamental frequencies of the circuit after each 0.5% perturbation on C$_2$ by using nonlinear gain are illustrated here, considering three values of gain G$_1$=G$_e$ (1+$\delta$), where G$_2$=G$_e$, for three different values of $\delta$=0, 0.001, and 0.01. These three plots are on top of each other, meaning that even with a 1% mismatch between gain and loss, the oscillator's fundamental frequencies are the same as those for smaller unbalanced situations. It is important to note that both positive and negative perturbations of C$_2$ are detected.

The oscillation frequency curve dispersion (dots) still has a square-root like shape of the perturbation. FIGS. 13A-13B illustrates another important aspect, the flexibility in choosing the gain value in the nonlinear circuit, e.g., different levels of mismatch between gain and loss, using different values for the small-signal negative conductance $G_1=G_e$ (1+δ) where δ=0, 0.001 and 0.01, represents the mismatch between the loss and gain side (we recall that $G_2=G_e$). As illustrated in FIG. 22, even with 1% mismatch between gain and loss, the nonlinear circuit illustrates the same behavior in the perturbation of the oscillation frequency, that is even matched to the case with δ=0. Thus, working in the unstable oscillation configuration using nonlinearity in the coupled circuit gives us freedom to tune the gain component's value and it works well even with some mismatch between gain and loss. Note that the oscillation frequency is highly sensitive to the capacitance perturbation on either side of the circuit, either on the loss or gain side. Though not illustrated explicitly, we have observed this feature theoretically, by calculating the eigenfrequencies from det($\underline{M}$–jωI)=0 when varying $C_1$, and also verified the shifted resonance frequencies using the prediction provided by the Puiseux series. Also, we have observed in time-domain analyses with Keysight ADS circuit simulators using nonlinear gain, that the shift of the oscillation frequency is more sensitive to perturbation of $C_1$ than $C_2$. In this paper, however, we only illustrate the result from perturbing $C_2$ because we want to investigate how a telemetric sensor works (e.g., the sensing capacitance is on the passive part of the coupled resonator circuit).

Experimental Demonstration of High Sensitivity: Case with Coupling Capacitance

FIGS. 23A-23D are diagrams illustrating (a) Coupled resonators terminated with gain $-G_1$ and loss $G_2$, with $G_1=G_2=G_e$=9 mS, and L=10 μH, coupling capacitance $C_e$=1.5 nF, capacitances $C_1=C_2=C_e$=1.5 nF. These parameters lead to an EPD. The isolated (e.g., without coupling) resonance frequency of each LC tank is $\omega_0$=1/$\sqrt{LCe}$=25.8×10$^6$ s$^{-1}$. The eigenfrequencies of the coupled circuit are calculated by solving det($\underline{M}$–jωI)=0. (b) Real and (c) imaginary parts of the angular eigenfrequencies normalized by $\omega_0$, varying C2 around the EPD value Ce. (d) At the EPD, the coalescence parameter sin(θ) vanishes, indicating that the two state vectors coalesce.

Figure 23A:
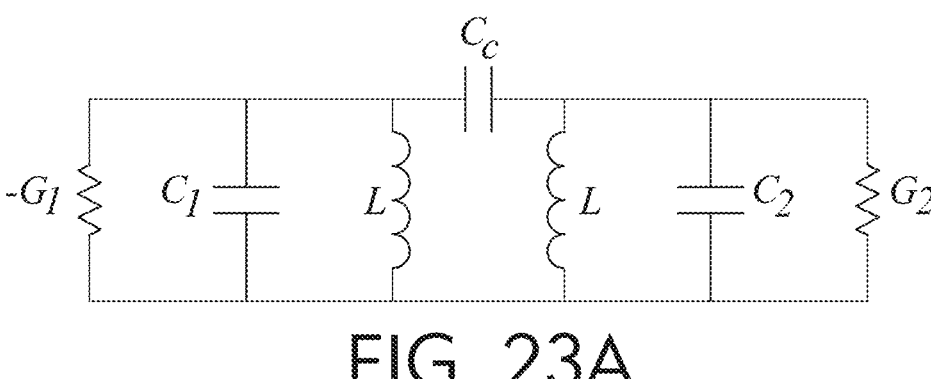
FIGS. 23A-23D are diagrams illustrating Coupled resonators terminated with gain $-G_1$ and loss $G_2$, with $G_1=G_2=G_e=9$ mS, and $L=10$ µH, coupling capacitance $C_e=1.5$ nF, capacitances $C_1=C_2=C_e=1.5$ nF. These parameters lead to an EPD. The isolated (e.g., without coupling) resonance frequency of each LC tank is $\omega_0=1/\sqrt{LCe}=25.8\times10^6$ $s^{-1}$. The eigenfrequencies of the coupled circuit are calculated by solving $\det(\underline{M}-j\omega\underline{I})=0$. Real and imaginary parts of the angular eigenfrequencies normalized by $\omega_0$, varying C2 around the EPD value Ce. At the EPD, the coalescence parameter $\sin(\theta)$ vanishes, indicating that the two state vectors coalesce.

An analogous system with the properties highlighted in the previous sections is made by the two resonators with balanced gain and loss (PT-symmetry) coupled with a capacitor $C_e$ as illustrated in FIG. 23A. We discuss the condition to have an EPD and illustrate the high sensitivity theoretically and experimentally. First, we find the EPD condition by writing down Kirchhoff's laws and using the Liouvillian formalism using the system vector $$\frac{d\Psi}{dt} = \underline{M}\Psi \tag{67}$$

$$\underline{M} = \frac{1}{A}\begin{pmatrix} 0 & 0 & A & 0 \\ 0 & 0 & 0 & A \\ -\frac{B_2}{LC_1} & -\frac{C_e}{LC_2^2} & \frac{GB_2}{C_1} & -\frac{GC_e}{C_2^2} \\ -\frac{C_e}{LC_1^2} & -\frac{B_1}{LC_2} & \frac{GC_e}{C_1^2} & -\frac{GB_1}{C_2} \end{pmatrix}$$

$$A = 1 + \frac{C_e}{C_1} + \frac{C_e}{C_2},$$

-continued $$B_1 = 1 + \frac{C_e}{C_1},$$

$$B_2 = 1 + \frac{C_e}{C_2}.$$

Figure 24:
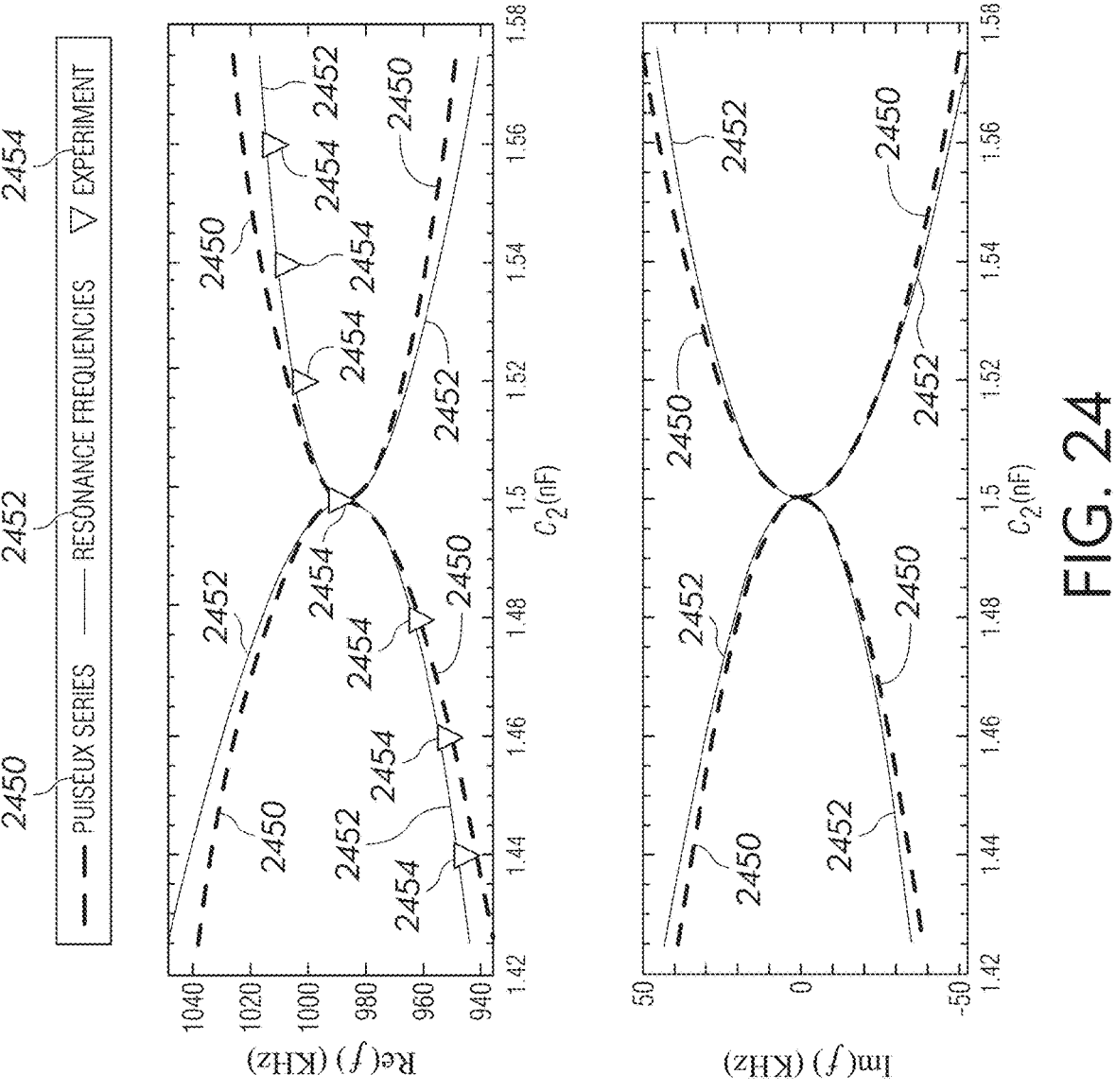
FIG. 24 is a diagram illustrating Experimental proof of exceptional sensitivity. Experimental and theoretical changes in the real part of the resonance frequencies f due to a positive and negative relative perturbation $\Delta C_2$ applied to the capacitance $C_2$ as $(1+\Delta C_2)C_e$. Solid lines 2452: eigenfrequencies calculated by finding the zeros of the dispersion equation $\det(\underline{M}-j\omega\underline{I})=0$ using linear gain $G_1=G_2=G_e=9$ mS, dashed-black 2450: estimate using the Puiseux fractional power expansion truncated to its first order, using linear gain. Triangles 2454: oscillation frequency measured experimentally (using nonlinear gain) after reaching saturation for different values of $C_2$. The measured oscillation frequencies significantly departs from the EPD frequency $f_e=988.6$ KHz even for a very small variation of the capacitance, approximately following the fractional power expansion $(\Delta C_2)-f_e\propto\mathrm{Sgn}(\Delta C_2)\sqrt{|\Delta C2|}$. Note that both positive and negative capacitance perturbations are measured. This result illustrates the high sensitivity of the circuit to perturbations.

FIG. 24 is a diagram illustrating Experimental proof of exceptional sensitivity. (a) Experimental and theoretical changes in the real part of the resonance frequencies f due to a positive and negative relative perturbation $\Delta C_2$ applied to the capacitance $C_2$ as (1+$\Delta C_2$)$C_e$. Solid lines 2452: eigenfrequencies calculated by finding the zeros of the dispersion equation det($\underline{M}$–jωI)=0 using linear gain $G_1=G_2=G_e$=9 mS, dashed-black 2450: estimate using the Puiseux fractional power expansion truncated to its first order, using linear gain. Triangles 2454: oscillation frequency measured experimentally (using nonlinear gain) after reaching saturation for different values of $C_2$. The measured oscillation frequencies significantly departs from the EPD frequency $f_e$=988.6 kHz even for a very small variation of the capacitance, approximately following the fractional power expansion $f(\Delta C_2)-f_e \propto Sgn(\Delta C_2)\sqrt{|\Delta C2|}$. Note that both positive and negative capacitance perturbations are measured. This result illustrates the high sensitivity of the circuit to perturbations.

Figure 23B:
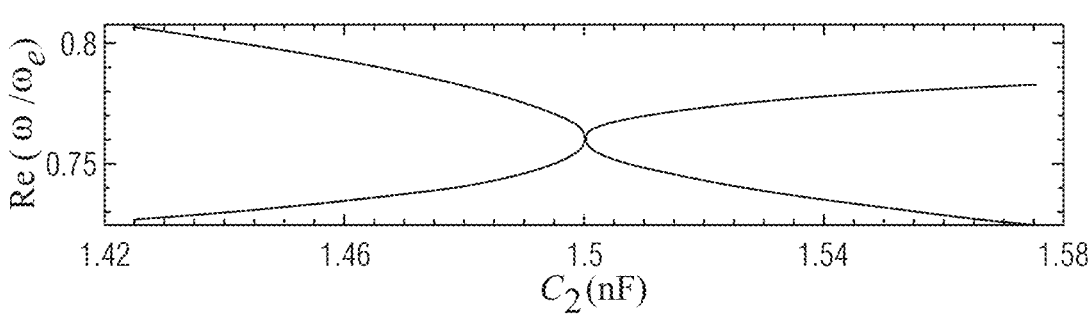
Figure 23C:
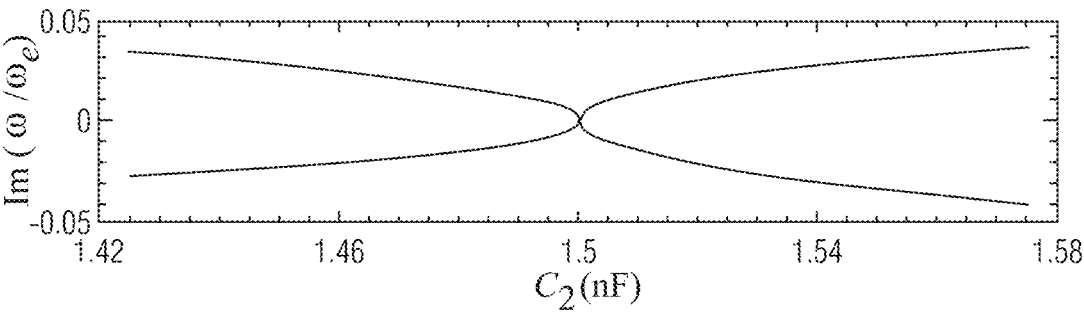
Figure 23D:
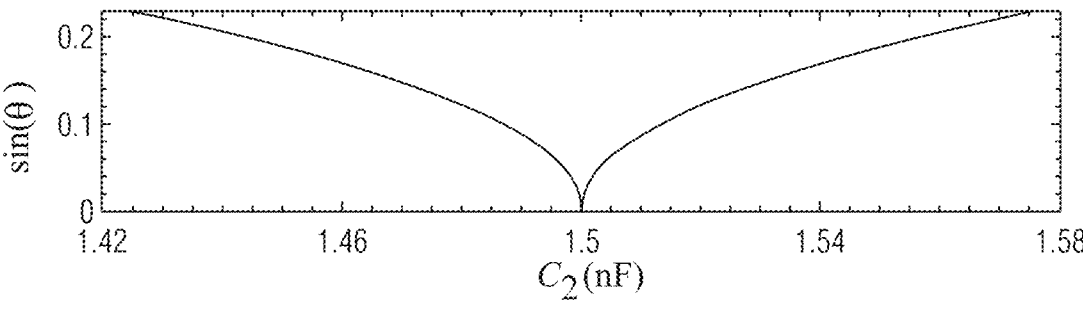

In this configuration, EPD occurs at $C_1=C_2=Cc=C_e$=1.5 nF, linear gain and loss $G_1=G_2=G_e$=9 mS, L=10_H. FIGS. 23B-23C illustrate the real and imaginary parts of the eigenfrequencies when perturbing $C_2$, and FIG. 23D demonstrates the converge of eigenvectors when $C_2=C_e$, calculated by solving the dispersion equation det($\underline{M}$–jωI)=0 for ω. The coalescence of two eigenvectors is observed by defining the angle between them as in (10), and this indicates the coalescence of the two eigenmodes in their eigenvalues and eigenvectors, and hence the occurrence of a second order EPD. It is seen from this plot that the system eigenfrequencies are coalescing at a specific capacitance $C_2=C_e$. The system is unstable for any $C_2 \neq C_e$ because of broken PT symmetry, since there is always an eigenfrequency with Im(!)<0. Moreover, the bifurcation of the dispersion diagram at the EPD is in agreement with the one provided by the Puiseux fractional power series expansion truncated to its first order, represented by a dashed black line in FIG. 24. The Puiseux series coefficient is calculated as $\alpha_1$=1.084×10$^6$+j1.43×10$^6$ rad/s by using Eq. (55), assuming negative linear gain. The coefficient _1 is a complex number that implies that the system always has two complex eigenfrequencies, for any $C_2$ value, that results in an unstable circuit, since one eigenfrequency has Im(ω)<0, for any $C_2$ value.

In order to confirm the high sensitivity to a perturbation in the proposed oscillator scheme based on nonlinear negative conductance (nonlinear gain), gain is now realized using an Operational Amplifier (Brand, model ADA4817) whose gain is tuned with a resistance trimmer (Brand, model 3252 W-1-501LF) to reach the proper small-signal gain value of $-G_1$=–9 mS.

Moreover, we use all the other parameters as in the previous example: a linear conductance of $G_2$=9 mS, capacitors of $C_1=C_2=C_e$=1.5 nF, and inductors of L=10_H (Brand, model MSS7348-103MEC). This nonlinear circuit oscillates at the EPD frequency. The actual experimental circuit differs from the ideal one using nonlinear gain in a couple of points: First, extra losses are present in the reactive components associated with their quality factor. The inductor has the lowest quality factor in this circuit with an internal DC resistance of 45 m, from its datasheet, which is however small. Second, electronic components have tolerances. To overcome some of the imperfections in the experiment process, we use a capacitance trimmer (Brand, model GMC40300) and a resistance trimer in our printed circuit board (PCB) to tune the circuit to operate at the EPD. Also, to have more tunability, a series of pin headers is connected parallel to the loss side, where extra capacitors and resistors could be connected in parallel, as mentioned in Appendix. E. The circuit is designed to work at the EPD frequency of fe=988.6 kHz, and indeed after tuning the circuit, we experimentally obtain an experimental EPD frequency at f=989.6 kHz as illustrated in FIG. 24 with a triangle at $C_2 = C_e$, very close to the designed one. The oscillation frequency is obtained by taking the FFT of the experimentally obtained time-domain voltage signal of the capacitor $C_1$ using an oscilloscope (Agilent Technologies DSO-X 2024A) after the signal reaches saturation for a time window of $10^2$ periods with $10^6$ points. The oscillation frequency is in agreement with the result read by the spectrum analyzer (Brand, model Rigol DSA832E).

Figure 25A:
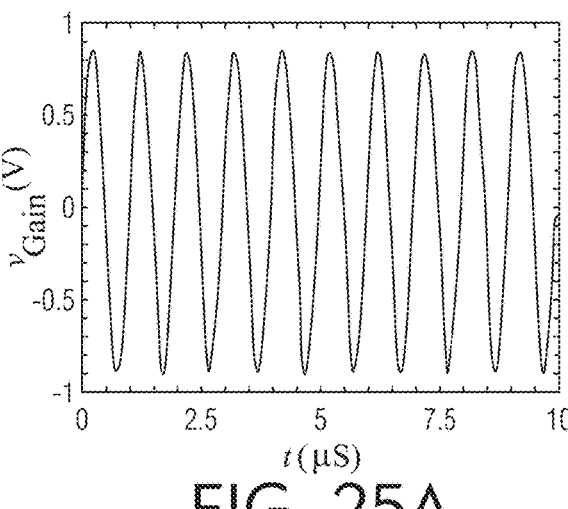
FIGS. 25A-25C are diagrams illustrating Measured time-domain voltage signal at the capacitor $C_1$ using an oscilloscope, when the system is perturbed from the EPD status by $C_2-C_e=20$ pF, corresponding to a $\Delta C_2=0.013$. Measured wideband spectrum by Spectrum Analyzer (Rigol DSA832E) signal analyzer as an inset with a fundamental frequency of oscillation of 1.002 MHz (theoretical expectation based on $\det(\underline{M}-j\omega\underline{I})=0$ is at 1.004 MHz). Phase noise of power spectrum is measured by the Spectrum Analyzer at frequency offsets from few Hz to 10 kHz. The resolution bandwidth is set to 300 Hz, while video bandwidth is set to 30 Hz to fully capture the spectrum. Power spectrum corresponding to a perturbation $\Delta C_2=0.013$ applied to $C_2$, using two different gain values: one curve is based on gain of the EPD, and one curve is based on a gain that is around 1% larger than the EPD value.
Figure 25B:
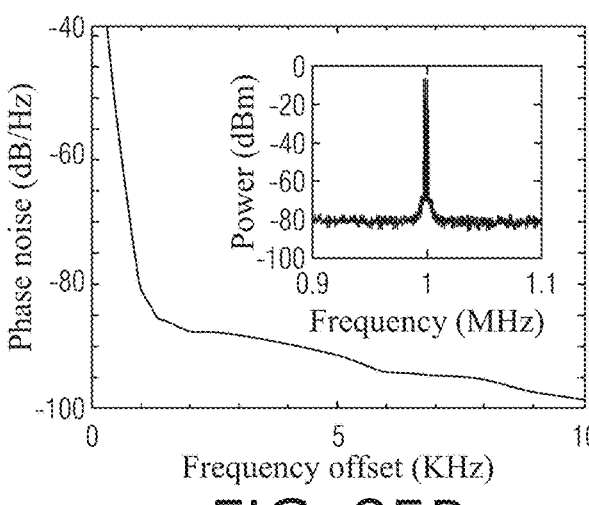
Figure 25C:
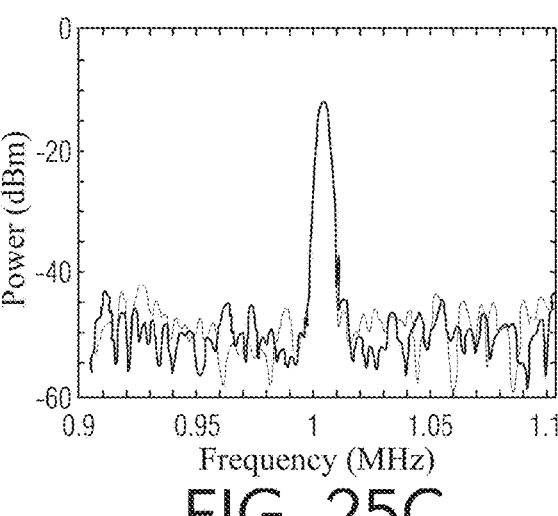

FIGS. 25A-25C are diagrams illustrating (a) Measured time-domain voltage signal at the capacitor $C_1$ using an oscilloscope, when the system is perturbed from the EPD status by $C_2 - C_e = 20$ pF, corresponding to a $\Delta C_2 = 0.013$. (b) Measured wideband spectrum by Spectrum Analyzer (Rigol DSA832E) signal analyzer as an inset with a fundamental frequency of oscillation of 1.002 MHz (theoretical expectation based on $\det(\underline{M} - j\omega I) = 0$ is at 1.004 MHz). Phase noise of power spectrum is measured by the Spectrum Analyzer at frequency offsets from few Hz to 10 KHz. The resolution bandwidth is set to 300 Hz, while video bandwidth is set to 30 Hz to fully capture the spectrum. (c) Power spectrum corresponding to a perturbation $\Delta C_2 = 0.013$ applied to $C_2$, using two different gain values: one curve is based on gain of the EPD, and one curve is based on a gain that is around 1% larger than the EPD value.

We then perturb $C_2$ as $(1 + \Delta C_2) C_e$ where $C_e$ satisfies the EPD condition. As illustrated in FIG. 24, the measured oscillation frequency dramatically shifts away from the EPD frequency, following the square root of $\Delta C_2$ as theoretically predicted by Eq. (54) for the linear case. The experimental results (green triangles) in FIG. 24 demonstrate that even for a small positive and negative perturbation $C_2 - C_e = \pm 20$ pF, corresponding to a $\Delta C_2 = 0.013$, the oscillation frequency significantly changes, which can be easily detected even in practical noisy electronic systems. FIG. 25A illustrates the experimental time domain voltage signal of the capacitor $C_1$ with respect to the ground, when a relative perturbation $\Delta C_2 = 0.013$ is applied to $C_2$, measured by an oscilloscope. The spectrum's frequency is now measured with a spectrum analyzer, and illustrated in 8 (b) as an inset. The frequency of the spectrum matches the perturbed ($\Delta C_2 = 0.013$) oscillation frequency, triangle in FIG. 24, obtained from the Fourier transform of the time domain experimental data. These results confirm that the structure is oscillating at the predicted perturbed resonance condition after saturation. FIG. 25B is a diagram illustrating a measured wideband spectrum by Spectrum Analyzer (Rigol DSA832E) signal analyzer as an inset with a fundamental frequency of oscillation of 1.002 MHz (theoretical expectation based on $\det(\underline{M} - j\omega I) = 0$ is at 1.004 MHz). Phase noise of power spectrum is measured by the Spectrum Analyzer at frequency offsets from few Hz to 10 kHz. The resolution bandwidth is set to 300 Hz, while video bandwidth is set to 30 Hz to fully capture the spectrum.

An essential feature of any oscillator is its ability to produce a near-perfect periodic time-domain signal (pure sinusoidal wave), and this feature is quantified in terms of phase noise, determined here based on the measured power spectrum up to 10 KHz frequency offset. The phase noise and power spectrum in FIG. 25D demonstrate that electronic noise (which is significant in Operational Amplifier) and thermal noise in the proposed oscillator sensor scheme does not discredit the potential of this circuit to exhibit measurable high sensitivity to perturbations. Indeed, the low phase noise of −80.8 dB=Hz at 1 KHz offset from the oscillation frequency illustrate that the frequency shifts observed in FIG. 24 are well measurable. Note that this result is intrinsic in the nonlinear saturation regime proper of an oscillator.

The resonance oscillation peaks have very narrow bandwidth (linewidth), which makes the oscillation frequency shifts very distinguishable and easily readable. In this oscillator-sensor system, we also have some freedom in choosing the small signal gain value because the dynamics is also determined by the saturation arising from the nonlinear gain behavior.

For example, in the experiment, we have verified that the circuit of FIG. 23A has the same oscillation frequency when using unbalanced small-signal gain 1% larger than the balanced loss value. FIG. 25C illustrates two measured frequency spectra corresponding to a relative perturbation $\Delta C_2 = 0.013$ applied to $C_2$, using two different gain values. The spectrum has been measured using resolution bandwidth 300 Hz, while video bandwidth is set to 30 Hz to fully capture the spectrum. Curve 2550 is for case with gain around 1% bigger than the balanced loss whereas curve 2552 is for the case where gain and loss are balanced. These two frequency responses illustrate the same oscillation frequency, but the power spectrum peak has a very small difference, 0.2 dBm higher for the case with 1% larger gain illustrated in FIG. 25C. This is an important feature that helps us design the circuit without a very accurate balance between gain and loss, e.g., oscillator-sensors can be realized without satisfying exactly PT symmetry also when the sensing perturbation is not applied. As mentioned earlier, the nonlinear oscillator with broken PT symmetry exhibits the very important feature that the oscillation frequency shifts are both positive and negative, depending on the sign of the perturbations $\Delta C_2$, hence allowing sensing positive and negative values of $\Delta C_2$.

In an example embodiment, we demonstrated that two coupled LC tanks terminated with nonlinear gain, with almost balanced loss and small signal gain, working near an EPD, make an oscillator whose oscillation frequency is very sensitive to perturbations. The nonlinear behavior of the active component is essential for the three important features observed by simulations and experimentally: (i) the oscillation frequency is very sensitive to perturbations, and both positive and negative perturbations of a capacitor are measured leading to very high sensitivity based on shifted oscillation frequency that approximately follows the square-root law, proper of EPD systems, (ii) the measured spectrum has very low phase noise allowing clean measurements of the shifted oscillation frequencies. (iii) It is not necessary to have a perfect gain/loss balance, e.g., we have illustrated that slightly broken gain/loss balance leads to the same results as for the case of perfectly balanced gain and loss.

Note that none of the features above are available in current PT symmetry circuits in the literature. Indeed, only one sign of the perturbation is measurable with the PT symmetry circuits published so far since the other sign leads to the circuit instability. Furthermore, to make a single sign perturbation measurement, in the literature. The capacitor $C_1$ on the gain side has been tuned using a varactor to reach the value of the perturbed capacitor ($C_2$) on the reading side in order to rebuild the PT symmetry (but in a sensor operation it is not possible to know a priori the value that has to be measured), furthermore, to work at or very close to an EPD, using linear gain, the gain has to be set equal to the loss (balanced gain/loss condition).

The oscillation frequency shift follows the square root behavior predicted by the Puiseux series expansion, as expected for EPD-based systems. We illustrate the performance of the oscillator-sensor scheme based on two configurations: wireless coupling with a mutual inductor, and wired coupling by a capacitor. The latter oscillator scheme has been fabricated and tested. We have analyzed how the nonlinearity in the gain element makes the circuit unstable and oscillate after reaching saturation. The oscillator's characteristics have been determined in terms of transient behavior and sensitivity to perturbations due to either capacitance or resistance change in the system. The experimental verification provided results in very good agreement with theoretical expectations. The measured high sensitivity of the oscillator sensor to perturbations can be used as a practical solution for enhancing sensitivity, also because the measured shifted frequencies are well visible with respect to underlying noise. The proposed EPD-based oscillator-sensor can be used in many automotive, medical, and industrial applications where detections of small variations of physical, chemical, or biological variations need to be detected.

Appendix D

Negative Resistor

Figure 26:
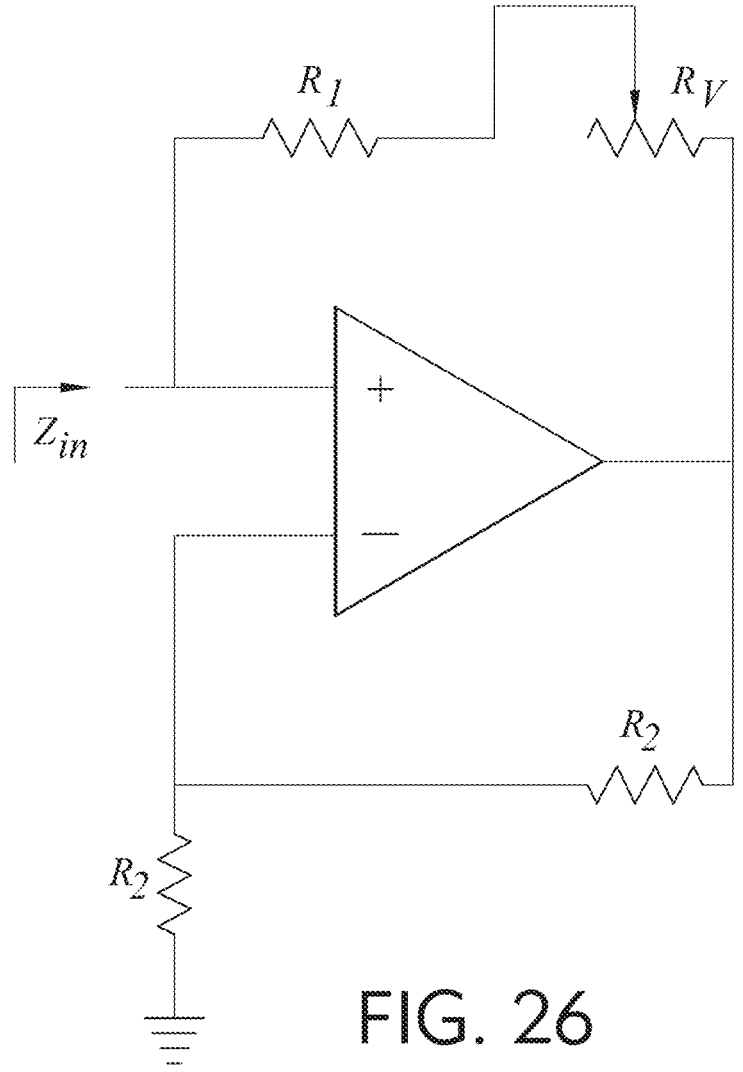
FIG. 26 is a diagram illustrating Negative resistance implementation using a converter circuit based on an Operational Amplifier.

FIG. 26 is a diagram illustrating Negative resistance implementation using a converter circuit based on an Operational Amplifier.

Several different approaches provide negative nonlinear conductance needed for proposed circuits. In this subsection, we illustrate the circuit in FIG. 26 that utilizes Operational Amplifier to achieve negative impedance. The converter circuit converts the impedance as $Z_{in}=-R_1$ while we design the circuit to work at the EPD point by choosing $R_1=1/G_e$. In the experiment, we used $R_1=100$, $R_2=2$ kohms and to achieve the EPD value. We tuned the negative resistance with resistor trimmer $R_v$ to reach the EPD value $G_e=9$ ms.

Appendix E

Implementation of the Nonlinear Coupled Oscillator

Figure 27A:
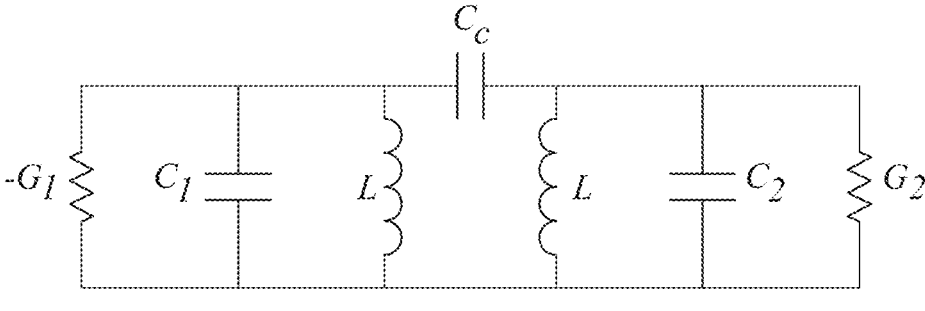
FIGS. 27A-27C are diagrams illustrating Schematic of the two LC resonators coupled by Cc=1.5 nF with inductor $L_1=L_2=10$ µH, the Operational Amplifier $U_1$ (model ADA4817), the variable resistance $RV_1$ (model 3252 W-1-501LF) and variable capacitance $V_{C2}$ (model GMC40300), biasing capacitors $C_4=C_6=0.1$ µF $C_6=C_6=10$ µF as datasheet suggested. PCB layout of the assembled circuit where the top layer traces are illustrated, the ground plane and bottom traces are also indicated as illustrated in the figure, and the connecting vias are orange. In this design, Via J1 is a probe point for the capacitor voltage, whereas Vias J6 and J4 are test points connected to the ground plane and are used to connect the ground of the measurement equipment to the ground of the circuit. All the ground nodes are connected to the bottom layer.
Figure 27B:
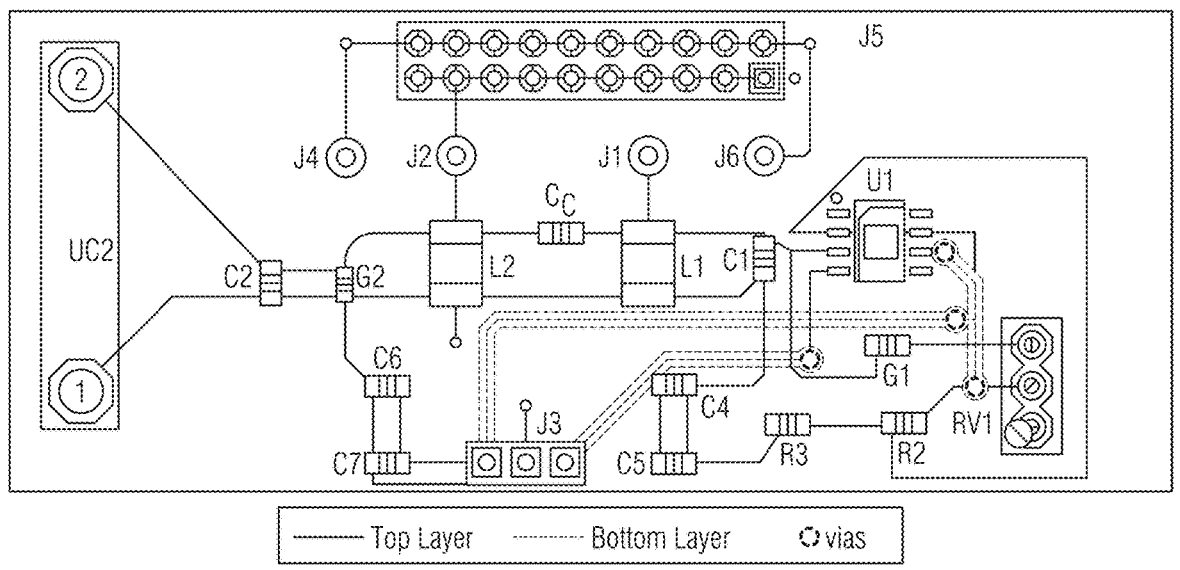
Figure 27C:
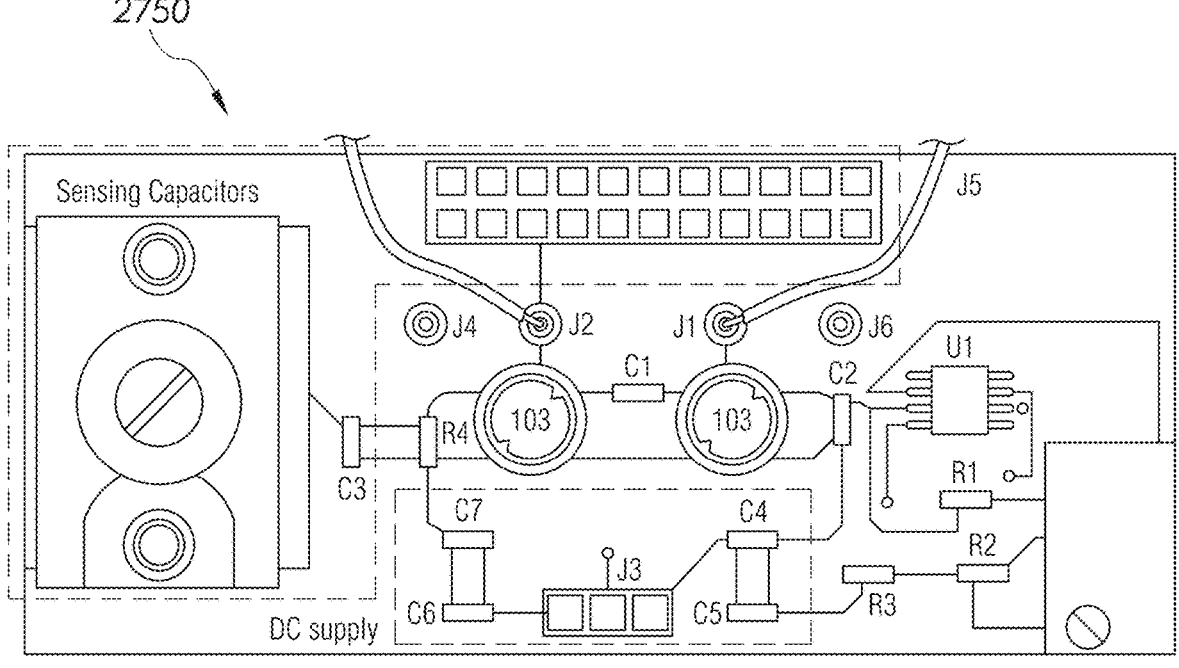

FIGS. 27A-27C are diagrams illustrating (a) Schematic of the two LC resonators coupled by Cc=1.5 nF with inductor $L_1=L_2=10$ μH, the Operational Amplifier $U_1$ (model ADA4817), the variable resistance $RV_1$ (model 3252 W-1-501LF) and variable capacitance $V_{C2}$ (model GMC40300), biasing capacitors $C_4=C_6=0.1$ μF $C_5=C_6=10$ μF as datasheet suggested. (b) PCB layout of the assembled circuit where the top layer traces are illustrated, the ground plane and bottom traces are also indicated as illustrated in the figure, and the connecting vias are orange. In this design, Via J1 is a probe point for the capacitor voltage, whereas Vias J6 and J4 are test points connected to the ground plane and are used to connect the ground of the measurement equipment to the ground of the circuit. All the ground nodes are connected to the bottom layer.

FIG. 27A is a diagram illustrating a schematic of the two LC resonators coupled by Cc=1.5 nF with inductor $L_1=L_2=10$ μH, the Operational Amplifier $U_1$ (model ADA4817), the variable resistance $RV_1$ (model 3252 W-1-501LF) and variable capacitance $V_{C2}$ (model GMC40300), biasing capacitors $C_4=C_6=0.1$ μF $C_5=C_6=10$ μF as datasheet suggested. We investigate resonances and their degeneracy in coupled LC resonators with a capacitor where the PCB layout of the circuit is illustrated in FIGS. 27B-27B illustrates the assembled circuit. In this fabricated circuit, the sensing capacitance is illustrated in dashed box 2750, non-linear gain is in the orange dashed box and the DC supply is in the yellow dashed box. Components here are sets at $L_1=L_2=10$ μH, loss value is set to $G_2=9$ mS with a linear resistor and coupling capacitor is $C_e=1.5$ nF. The gain part is designed with the Operational Amplifier (ADA4817), where the desired value for gain can be achieved with variable resistor RV1. To find the exact value of the capacitance at EPD ($C_2=C_e$), a variable capacitor (GMC40300) and a series of pin headers where extra capacitors could be connected to the $C_2$ in parallel are provided. Then, by adding the known capacitors values to the load side we tuned the capacitance $C_2$ to get close to the EPD and then we got the oscillation frequency at EPD f=$f_e$. To validate our found EPD and illustrating the square root behavior we perturbed the capacitor $C_2$ with extra 10 pF capacitors to make the 20 pF steps which they connected in parallel to $C_2$, using series of pin headers. Afterwards, the oscillation frequency is measured with oscilloscope and spectrum analyzer for each perturbation as we discussed in Section B. Note that on the PCB, the ground plane is designed to connect all the ground of the measurement equipment and DC supply to the ground of the circuit.

The words used in this specification to describe the instant embodiments are to be understood not only in the sense of their commonly defined meanings, but to include by special definition in this specification: structure, material or acts beyond the scope of the commonly defined meanings. Thus, if an element can be understood in the context of this specification as including more than one meaning, then its use must be understood as being generic to all possible meanings supported by the specification and by the word or words describing the element.

The definitions of the words or drawing elements described above are meant to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

In the foregoing description and in the figures, like elements are identified with like reference numerals. The use of "e.g.," "etc.," and "or" indicates non-exclusive alternatives without limitation, unless otherwise noted. The use of "including" or "includes" means "including, but not limited to," or "includes, but not limited to," unless otherwise noted.

As used above, the term "and/or" placed between a first entity and a second entity means one of (1) the first entity, (2) the second entity, and (3) the first entity and the second entity. Multiple entities listed with "and/or" should be construed in the same manner, e.g., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" can refer, in one embodiment, to A only (optionally including entities other than B), in another embodiment, to B only (optionally including entities other than A), in yet another embodiment, to both A and B (optionally including other entities). These entities may refer to elements, actions, structures, processes, operations, values, and the like.

One or more of the components, steps, features, and/or functions illustrated in the figures may be rearranged and/or combined into a single component, block, feature or function or embodied in several components, steps, or functions. Additional elements, components, steps, and/or functions may also be added without departing from the disclosure. The apparatus, devices, and/or components illustrated in the Figures may be configured to perform one or more of the methods, features, or steps described in the Figures. The algorithms described herein may also be efficiently implemented in software and/or embedded in hardware.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description are presented in terms of algorithms and symbolic representations of operations on data bits within a computer memory. These algorithmic descriptions and representations are the methods used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared or otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following disclosure, it is appreciated that throughout the disclosure terms such as "processing," "computing," "calculating," "determining," "displaying" or the like, refer to the action and processes of a computer system, or similar electronic computing device, that manipulates and transforms data represented as physical (electronic) quantities within the computer system's registers and memories into other data similarly represented as physical quantities within the computer system's memories or registers or other such information storage, transmission or display.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. It will be appreciated that a variety of programming languages may be used to implement the teachings of the invention as described herein.

The figures and the description describe certain embodiments by way of illustration only. One skilled in the art will readily recognize from the following description that alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures to indicate similar or like functionality.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description, but rather by the claims of this application. As will be understood by those familiar with the art, the present invention may be embodied in other specific forms without departing from the spirit or essential characteristics thereof. Likewise, the particular naming and division of the modules, routines, features, attributes, methodologies and other aspects are not mandatory or significant, and the mechanisms that implement the present invention or its features may have different names, divisions and/or formats.

Furthermore, as will be apparent to one of ordinary skill in the relevant art, the modules, routines, features, attributes, methodologies and other aspects of the present invention can be implemented as software, hardware, firmware or any combination of the three. Also, wherever a component, an example of which is a module, of the present invention is implemented as software, the component can be implemented as a standalone program, as part of a larger program, as a plurality of separate programs, as a statically or dynamically linked library, as a kernel loadable module, as a device driver, and/or in every and any other way known now or in the future to those of ordinary skill in the art of computer programming.

Additionally, the present invention is in no way limited to implementation in any specific programming language, or for any specific operating system or environment. Accordingly, the disclosure of the present invention is intended to be illustrative, but not limiting, of the scope of the present invention, which is set forth in the following claims.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects illustrated herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An electronic system comprising:
an electronic circuit configured to operate at or near an exceptional point of degeneracy (EPD), the electronic circuit having an active component that, via an instability, brings the system to self-oscillations, wherein a second component of the circuit is perturbed, leading to high sensitivity to such perturbation.

2. The circuit of claim 1, the active component having a nonlinear gain and wherein the active component experiences saturation and the whole circuit reaches an oscillatory regime due to the nonlinearity.

3. The circuit of claim 1, wherein the EPD is a particular degeneracy condition where at least two or more eigenmodes coalesce in eigenvalues, and eigenvectors of at least two or more eigenmodes when saturation of the active component occurs.

4. The circuit of claim 1, wherein the circuit is unstable, and the circuit starts to oscillate at a frequency coinciding or closely coinciding to an EPD frequency.

5. The circuit of claim 1, wherein the circuit satisfies a parity-time (PT) symmetry wherein there is a particular symmetry that includes balanced gain and loss.

6. The circuit of claim 1 wherein the nonlinear gain is slightly larger (0.01%-1%) than the balanced loss, wherein the circuit is slightly perturbed from a parity-time (PT) symmetry condition of the circuit's due to small extra gain, that makes the circuit oscillate.

7. The circuit of claim 1, wherein a resonance frequency of the system is sensitive to perturbations of one circuit's element.

8. The circuit of claim 5, wherein an oscillation frequency changes by perturbing the loss resistance.

9. The circuit of claim 1, further comprising two coupled transmission lines terminated with a loss on one side and gain on the other side operating at an exceptional point of degeneracy (EPD), as an example of a particular realization.

10. The circuit of claim 9, wherein a resonance frequency of the system's is sensitive to parity-time (PT) symmetric perturbations of transmission lines per unit length capacitance or inductance.

11. The circuit of claim 9, wherein a resonance frequency of the system is sensitive to perturbations of transmission lines terminations, in terms of resistance, capacitance, or inductance.

12. The circuit of claim 1, wherein the EPD, oscillatory regime and sensitive behavior are found with an analogous scheme but with two coupled resonators of lumped elements terminated with balanced loss and gain.

13. The circuit of claim 1, wherein the EPD, oscillatory regime and highly sensitive behavior could be found with an analogous scheme but with two coupled resonators of lumped elements terminated with balanced loss and gain.

14. The circuit of claim 1, wherein the EPD and a sensitive behavior is found with two LC tanks coupled through a gyrator and reaching a saturated regime.

15. The circuit of claim 1, wherein the EPD and a sensitive behavior is found with a single or multiple resonators with at least a time varying component and reaching a saturated regime.

* * * * *